(12) United States Patent
Manning

(10) Patent No.: US 6,202,119 B1
(45) Date of Patent: Mar. 13, 2001

(54) METHOD AND SYSTEM FOR PROCESSING PIPELINED MEMORY COMMANDS

(75) Inventor: Troy A. Manning, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 08/994,461

(22) Filed: Dec. 19, 1997

(51) Int. Cl.$^7$ .................................................. G06F 12/00
(52) U.S. Cl. .................................. 711/5; 711/2; 711/104; 711/167; 711/169
(58) Field of Search ...................... 711/5, 2, 150, 711/120, 168, 112; 345/501; 712/201; 370/463; 341/67

(56) References Cited

U.S. PATENT DOCUMENTS

| | | | |
|---|---|---|---|
| 4,695,952 | 9/1987 | Howland | 364/200 |
| 4,849,702 | 7/1989 | West et al. | 328/63 |
| 4,943,946 | 7/1990 | Brent | 365/189.12 |
| 5,099,481 | 3/1992 | Miller | 371/22.1 |
| 5,175,732 | * 12/1992 | Hendel et al. | 370/463 |
| 5,312,068 | 5/1994 | Goss et al. | 371/37 |
| 5,321,700 | 6/1994 | Brown et al. | 371/27 |
| 5,325,493 | * 6/1994 | Herrell et al. | 712/201 |
| 5,337,410 | * 8/1994 | Appel | 345/501 |
| 5,390,224 | 2/1995 | Komatsuda | 377/56 |
| 5,402,390 | 3/1995 | Ho et al. | 365/225.7 |
| 5,471,430 | 11/1995 | Sawada et al. | 365/222 |
| 5,553,010 | 9/1996 | Tanihira et al. | 364/715.08 |
| 5,566,325 | 10/1996 | Bruce, II et al. | 395/494 |
| 5,581,512 | 12/1996 | Kitamura | 365/233 |
| 5,640,354 | 6/1997 | Jang et al. | 365/201 |

(List continued on next page.)

FOREIGN PATENT DOCUMENTS

| | | |
|---|---|---|
| 59116829 | 7/1984 | (EP) . |
| 0 468 480 A2 | 5/1992 | (EP) . |
| 2 128 383 | 4/1984 | (GB) . |
| 09161475 | 6/1997 | (JP) . |

OTHER PUBLICATIONS

"Increasing Data Read Rate From Memories," IBM Technical Disclosure Bulletin, vol. 30, No. 12, May 1988, pp. 339–341.

Primary Examiner—John W. Cabeca
Assistant Examiner—Fred F. Tzeng
(74) Attorney, Agent, or Firm—Dorsey & Whitney LLP

(57) ABSTRACT

A method and apparatus for processing pipelined command packets in a packetized memory device. The command packets are initially stored in one of several command units, and the commands are subsequently coupled to a common command processor for execution. The command units each include a latch for storing a command packet, a counter, and a start command generator. The counter is preloaded with a count corresponding to the timing that the command is received at a location within the memory device. The counter begins counting responsive to a flag bit received with the command packet. The start command generator receives the count of the counter, and decodes different counts depending on the type of command (e.g., a "read" or a "write") and the speed of a clock signal that is used to control the operation of the memory device. When the start command generator decodes a count, it latches command bits of the applied command packet and generates a start command signal. Thus, the start command signal is generated after the flag signal by a delay that corresponds to the type of memory command and the clock speed. The latched command bits and the start command signal are applied to a command processor that executes the commands in a pipeline using a sequencer to generate a sequence of timing signals, and a state machine to generate command signals from the latched command bits.

37 Claims, 39 Drawing Sheets

U.S. PATENT DOCUMENTS

| | | | |
|---|---|---|---|
| 5,652,733 | 7/1997 | Chen et al. | 365/233 |
| 5,732,041 | 3/1998 | Joffe | 365/230.08 |
| 5,737,563 | 4/1998 | Shigeeda | 365/230.03 |
| 5,764,584 | 6/1998 | Fukiage et al. | 365/230.03 |
| 5,778,419 * | 7/1998 | Hansen et al. | 711/112 |
| 5,812,074 * | 9/1998 | Chung | 341/67 |
| 5,825,711 | 10/1998 | Manning | 365/230.03 |
| 5,848,431 * | 12/1998 | Pawlowski | 711/5 |
| 5,860,080 * | 1/1999 | James et al. | 711/4 |

* cited by examiner

| CA9 | CA8 | CA7 | CA6 | CA5 | CA4 | CA3 | CA2 | CA1 | CA0 |
|---|---|---|---|---|---|---|---|---|---|
| ID6 | ID5 | ID4 | ID3 | ID2 | ID1 | ID0 | CMD5 | CMD4 | CMD3 |
| CMD2 | CMD1 | CMD0 | BNK2 | BNK1 | BNK0 | ROW9 | ROW8 | ROW7 | ROW6 |
| ROW5 | ROW4 | ROW3 | ROW2 | ROW1 | ROW0 | 0 | 0 | 0 | 0 |
| 0 | 0 | 0 | COL6 | COL5 | COL4 | COL3 | COL2 | COL1 | COL0 |

ID6–ID0 = DEVICE ID VALUE
CMD5–CMD0 = COMMAND CODE
BNK2–BNK0 = BANK ADDRESS

ROW9–ROW0 = ROW ADDRESS
COL6–COL0 = COLUMN ADDRESS
0 = UNUSED

Fig. 2

| Fig. 19A | Fig. 19B | Fig. 19C |

Fig. 19

METHOD AND SYSTEM FOR PROCESSING PIPELINED MEMORY COMMANDS

TECHNICAL FIELD

This invention relates to memory devices used in computer systems, and, more particularly, to a method and apparatus for the pipelined processing of memory commands.

BACKGROUND OF THE INVENTION

Conventional computer systems include a processor (not shown) coupled to a variety of memory devices, including read-only memories ("ROMs") which traditionally store instructions for the processor, and a system memory to which the processor may write data and from which the processor may read data. The processor may also communicate with an external cache memory, which is generally a static random access memory ("SRAM"). The processor also communicates with input devices, output devices, and data storage devices.

Processors generally operate at a relatively high speed. Processors such as the Pentium® and Pentium Pro® microprocessors are currently available that operate at clock speeds of at least 200 MHz. However, the remaining components of existing computer systems, with the exception of SRAM cache, are not capable of operating at the speed of the processor. For this reason, the system memory devices, as well as the input devices, output devices, and data storage devices, are not coupled directly to the processor bus. Instead, the system memory devices are generally coupled to the processor bus through a memory controller, bus bridge or similar device, and the input devices, output devices, and data storage devices are coupled to the processor bus through a bus bridge. The memory controller allows the system memory devices to operate at a lower clock frequency that is substantially lower than the clock frequency of the processor. Similarly, the bus bridge allows the input devices, output devices, and data storage devices to operate at a substantially lower frequency. Currently, for example, a processor having a 200 MHz clock frequency may be mounted on a mother board having a 66 MHz clock frequency for controlling the system memory devices and other components.

Access to system memory is a frequent operation for the processor. The time required for the processor, operating, for example, at 200 MHz, to read data from or write data to a system memory device operating at, for example, 66 MHz, greatly slows the rate at which the processor is able to accomplish its operations. Thus, much effort has been devoted to increasing the operating speed of system memory devices.

System memory devices are generally dynamic random access memories ("DRAMs"). Initially, DRAMs were asynchronous and thus did not operate at even the clock speed of the motherboard. In fact, access to asynchronous DRAMs often required that wait states be generated to halt the processor until the DRAM had completed a memory transfer. However, the operating speed of asynchronous DRAMs was successfully increased through such innovations as burst and page mode DRAMs which did not require that an address be provided to the DRAM for each memory access. More recently, synchronous dynamic random access memories ("SDRAMs") have been developed to allow the pipelined transfer of data at the clock speed of the motherboard. However, even SDRAMs are incapable of operating at the clock speed of currently available processors. Thus, SDRAMs cannot be connected directly to the processor bus, but instead must interface with the processor bus through a memory controller, bus bridge, or similar device. The disparity between the operating speed of the processor and the operating speed of SDRAMs continues to limit the speed at which processors may complete operations requiring access to system memory.

A solution to this operating speed disparity has been proposed in the form of a computer architecture known as "SyncLink." In the SyncLink architecture, the system memory may be coupled to the processor either directly through the processor bus or through a memory controller. Rather than requiring that separate address and control signals be provided to the system memory, SyncLink memory devices receive command packets that include both control and address information. The SyncLink memory device then outputs or receives data on a data bus that is coupled directly to the data bus portion of the processor bus.

An example of a computer system 10 using the SyncLink architecture is shown in FIG. 1. The computer system 10 includes a processor 12 having a processor bus 14 coupled to three packetized dynamic random access memory or SyncLink DRAMs ("SLDRAM") devices 16a–c. The computer system 10 also includes one or more input devices 20, such as a keypad or a mouse, coupled to the processor 12 through a bus bridge 22 and an expansion bus 24, such as an industry standard architecture ("ISA") bus or a Peripheral component interconnect ("PCI") bus. The input devices 20 allow an operator or an electronic device to input data to the computer system 10. One or more output devices 30 are coupled to the processor 12 to display or otherwise output data generated by the processor 12. The output devices 30 are coupled to the processor 12 through the expansion bus 24, bus bridge 22 and processor bus 14. Examples of output devices 24 include printers and a video display units. One or more data storage devices 38 are coupled to the processor 12 through the processor bus 14, bus bridge 22, and expansion bus 24 to store data in or retrieve data from storage media (not shown). Examples of storage devices 38 and storage media include fixed disk drives floppy disk drives, tape cassettes and compact-disk read-only memory drives.

In operation, the processor 12 communicates with the memory devices 16a–c via the processor bus 14 by sending the memory devices 16a–c command packets that contain both control and address information. Data is coupled between the processor 12 and the memory devices 16a–c, through a data bus portion of the processor bus 14. Although all the memory devices 16a–c are coupled to the same conductors of the processor bus 14, only one memory device 16a–c at a time reads or writes data, thus avoiding bus contention on the processor bus 14. Bus contention is avoided by each of the memory devices 16a–c on the bus bridge 22 having a unique identifier, and the command packet contains an identifying code that selects only one of these components.

A typical command packet for a SyncLink packetized DRAM is shown in FIG. 2. The command packet is formed by 4 packet words each of which contains 10 bits of data. The first packet word $W_1$ contains 7 bits of data identifying the packetized DRAM 16a–c that is the intended recipient of the command packet. As explained below, each of the packetized DRAMs is provided with a unique ID code that is compared to the 7 ID bits in the first packet word $W_1$. Thus, although all of the packetized DRAMs 16a–c will receive the command packet, only the packetized DRAM 16a–c having an ID code that matches the 7 ID bits of the first packet word $W_1$ will respond to the command packet.

The remaining 3 bits of the first packet word $W_1$ as well as 3 bits of the second packet word $W_2$ comprise a 6 bit command. Typical commands are read and write in a variety of modes, such as accesses to pages or banks of memory cells. The remaining 7 bits of the second packet word $W_2$ and portions of the third and fourth packet words $W_3$ and $W_4$ comprise a 20 bit address specifying a bank, row and column address for a memory transfer or the start of a multiple bit memory transfer. In one embodiment, the 20-bit address is divided into 3 bits of bank address, 10 bits of row address, and 7 bits of column address.

Although the command packet shown in FIG. 2 is composed of 4 packet words each containing up to 10 bits, it will be understood that a command packet may contain a lesser or greater number of packet words, and each packet word may contain a lesser or greater number of bits.

The computer system 10 also includes a number of other components and signal lines that have been omitted from FIG. 1 in the interests of brevity. For example, as explained below, the memory devices 16a–c also receive a master clock signal to provide internal timing signals, a data clock signal clocking data into and out of the memory device 16, and a FLAG signal signifying the start of a command packet.

The memory devices 16 are shown in block diagram form in FIG. 3. Each of the memory devices 16 includes a clock divider and delay circuit 40 that receives a master clock signal 42 and generates a large number of other clock and timing signals to control the timing of various operations in the memory device 16. The memory device 16 also includes a command buffer 46 and an address capture circuit 48 which receive an internal clock CLK signal, a command packet CA0–CA9 on a command bus 50, and a FLAG signal on line 52. As explained above, the command packet contains control and address information for each memory transfer, and the FLAG signal identifies the start of a command packet. The command buffer 46 receives the command packet from the bus 50, and compares at least a portion of the command packet to identifying data from an ID register 56 to determine if the command packet is directed to the memory device 16a or some other memory device 16b, c. If the command buffer 46 determines that the command is directed to the memory device 16a, it then provides the command to a command decoder and sequencer 60. The command decoder and sequencer 60 generates a large number of internal control signals to control the operation of the memory device 16a during a memory transfer corresponding to the command.

The address capture circuit 48 also receives the command packet from the command bus 50 and outputs a 20-bit address corresponding to the address information in the command. The address is provided to an address sequencer 64 which generates a corresponding 3-bit bank address on bus 66, an 11-bit row address on bus 68, and a 6-bit column address on bus 70.

One of the problems of conventional DRAMs is their relatively low speed resulting from the time required to precharge and equilibrate circuitry in the DRAM array. The packetized DRAM 16a shown in FIG. 3 largely avoids this problem by using a plurality of memory banks 80, in this case eight memory banks 80a–h. After a memory read from one bank 80a, the bank 80a can be precharged while the remaining banks 80b–h are being accessed. Each of the memory banks 80a–h receives a row address from a respective row latch/decoder/driver 82a–h. All of the row latch/decoder/drivers 82a–h receive the same row address from a predecoder 84 which, in turn, receives a row address from either a row address register 86 or a refresh counter 88 as determined by a multiplexer 90. However, only one of the row latch/decoder/drivers 82a–h is active at any one time as determined by bank control logic 94 as a function of bank data from a bank address register 96.

The column address on bus 70 is applied to a column latch/decoder 100 which, in turn, supplies I/O gating signals to an I/O gating circuit 102. The I/O gating circuit 102 interfaces with columns of the memory banks 80a–h through sense amplifiers 104. Data is coupled to or from the memory banks 80a–h through the sense amps 104 and I/O gating circuit 102 to a data path subsystem 108 which includes a read data path 110 and a write data path 112. The read data path 110 includes a read latch 120 receiving and storing data from the I/O gating circuit 102. In the memory device 16a shown in FIG. 2, 64 bits of data are applied to and stored in the read latch 120. The read latch then provides four 16-bit data words to a multiplexer 122. The multiplexer 122 sequentially applies each of the 16-bit data words to a read FIFO buffer 124. Successive 16-bit data words are clocked through the FIFO buffer 124 by a clock signal generated from an internal clock by a programmable delay circuit 126. The FIFO buffer 124 sequentially applies the 16-bit words and two clock signals (a clock signal and a quadrature clock signal) to a driver circuit 128 which, in turn, applies the 16-bit data words to a data bus 130 forming part of the processor bus 14. The driver circuit 128 also applies the clock signals to a clock bus 132 so that a device such as the processor 12 reading the data on the data bus 130 can be synchronized with the data.

The write data path 112 includes a receiver buffer 140 coupled to the data bus 130. The receiver buffer 140 sequentially applies 16-bit words from the data bus 130 to four input registers 142, each of which is selectively enabled by a signal from a clock generator circuit 144. Thus, the input registers 142 sequentially store four 16-bit data words and combine them into one 64-bit data word applied to a write FIFO buffer 148. The write FIFO buffer 148 is clocked by a signal from the clock generator 144 and an internal write clock WCLK to sequentially apply 64-bit write data to a write latch and driver 150. The write latch and driver 150 applies the 64-bit write data to one of the memory banks 80a–h through the I/O gating circuit 102 and the sense amplifier 104.

As mentioned above, an important goal of the SyncLink architecture is to allow data transfer between a processor and a memory device to occur at a significantly faster rate. However, the operating rate of a packetized DRAM, including the packetized DRAM shown in FIG. 3, is limited by the time required to receive and process command packets applied to the memory device 16a. More specifically, not only must the command packets be received and stored, but they must also be decoded and used to generate a wide variety of signals. However, in order for the memory device 16a to operate at a very high speed, the command packets must be applied to the memory device 16a at a correspondingly high speed. As the operating speed of the memory device 16a increases, the command packets are provided to the memory device 16a at a rate that can exceed the rate at which the command buffer 46 can process the command packets.

Although the foregoing discussion is directed to the need for faster command buffers in packetized DRAMs, similar problems exist in other memory devices, such as asynchronous DRAMs and synchronous DRAMs, which must process control and other signals at a high rate of speed.

SUMMARY OF THE INVENTION

According to one aspect of the invention, a memory device command generator receives command packets indicative of a memory command, a row address and a command address. The command generator includes a plurality of command units. Each of the command units, when enabled, stores a plurality of command bits of a command packet received by the command units and subsequently outputs the stored command bits. A command unit selector coupled to each of the command units determines which of the command units are busy storing command bits, and then enables one of the command units that is not busy. A command processor coupled to each of the command units receives the command bits output from an enabled command unit and processes the command bits to generate at least one command signal responsive thereto. The command processor preferably includes a sequencer that generates a sequence of timing signals responsive to a start command signal received from an enabled one of the command units. The command processor also preferably includes a command signal generator coupled to receive the command bits from the command units and the sequence of timing signals from the sequencer. The command signal generator generates a command signal corresponding to the command bits responsive to one of a plurality of the timing signals. The timing signal that is used to generate the command signal is a function of the frequency of a clock signal controlling the operation of a memory device containing the command generator. Each of the command units preferably include a counter and a start command generator that generates the start command signal. The counter counts from an initial count to a terminal count responsive to the clock signal, and the counting is initiated responsive to a timing signal associated with the command packet received by the command unit. The start command generator produces the start command signal at one of a plurality of respective counts of the counter that is a function of the nature of the command indicated by the stored command bits and/or the frequency of the clock signal. The start command signal causes the command processor coupled to each of the command units to process the command bits to generate the command signal.

BRIEF DESCRIPTION OF THE DRAWINGS

FIG. 2 is a diagram showing a typical command packet for a SyncLink packetized DRAM.

DETAILED DESCRIPTION OF THE INVENTION

Figure 1:
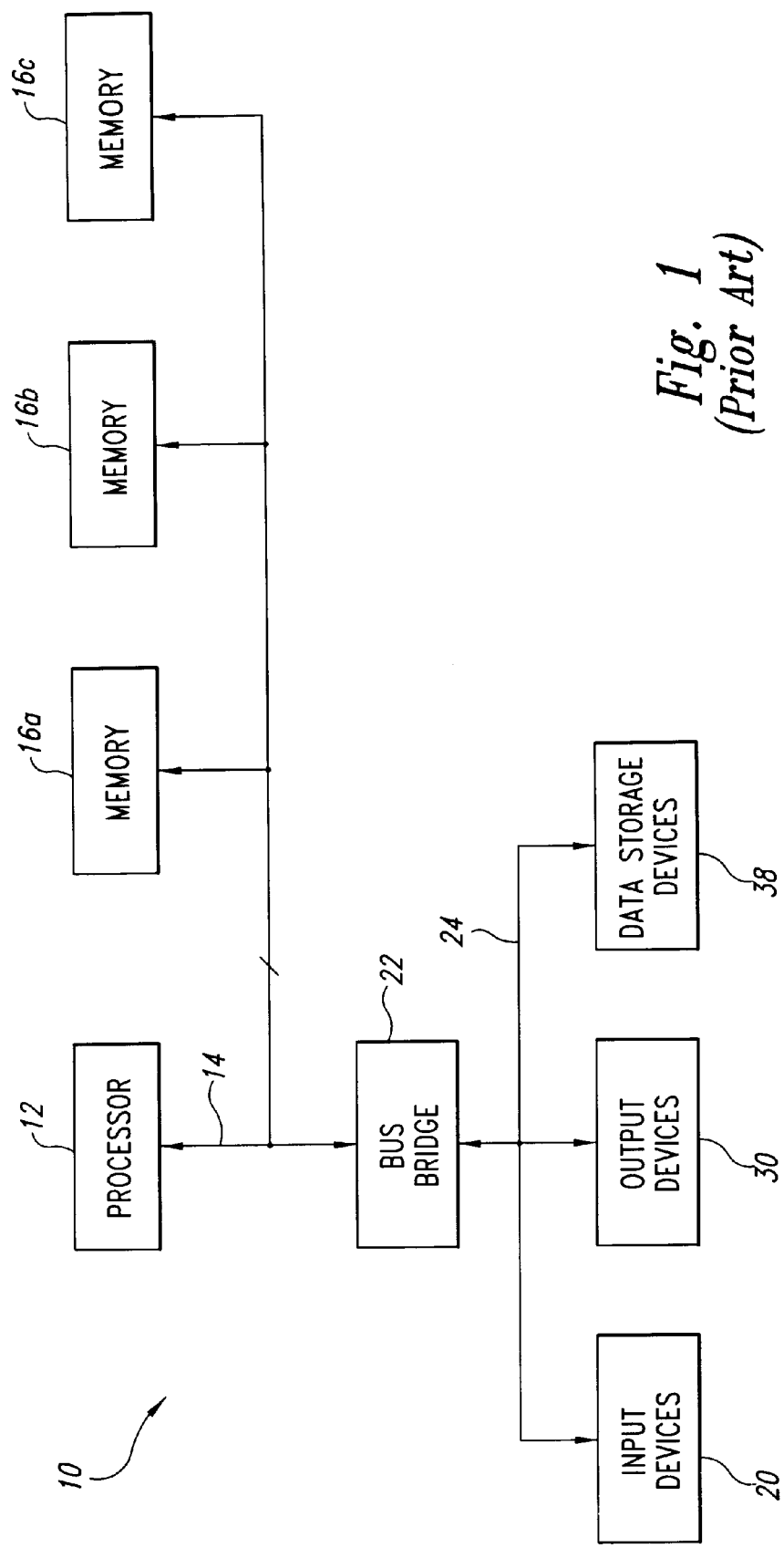
FIG. 1 is a block diagram of a computer system using SyncLink architecture.
Figure 3:
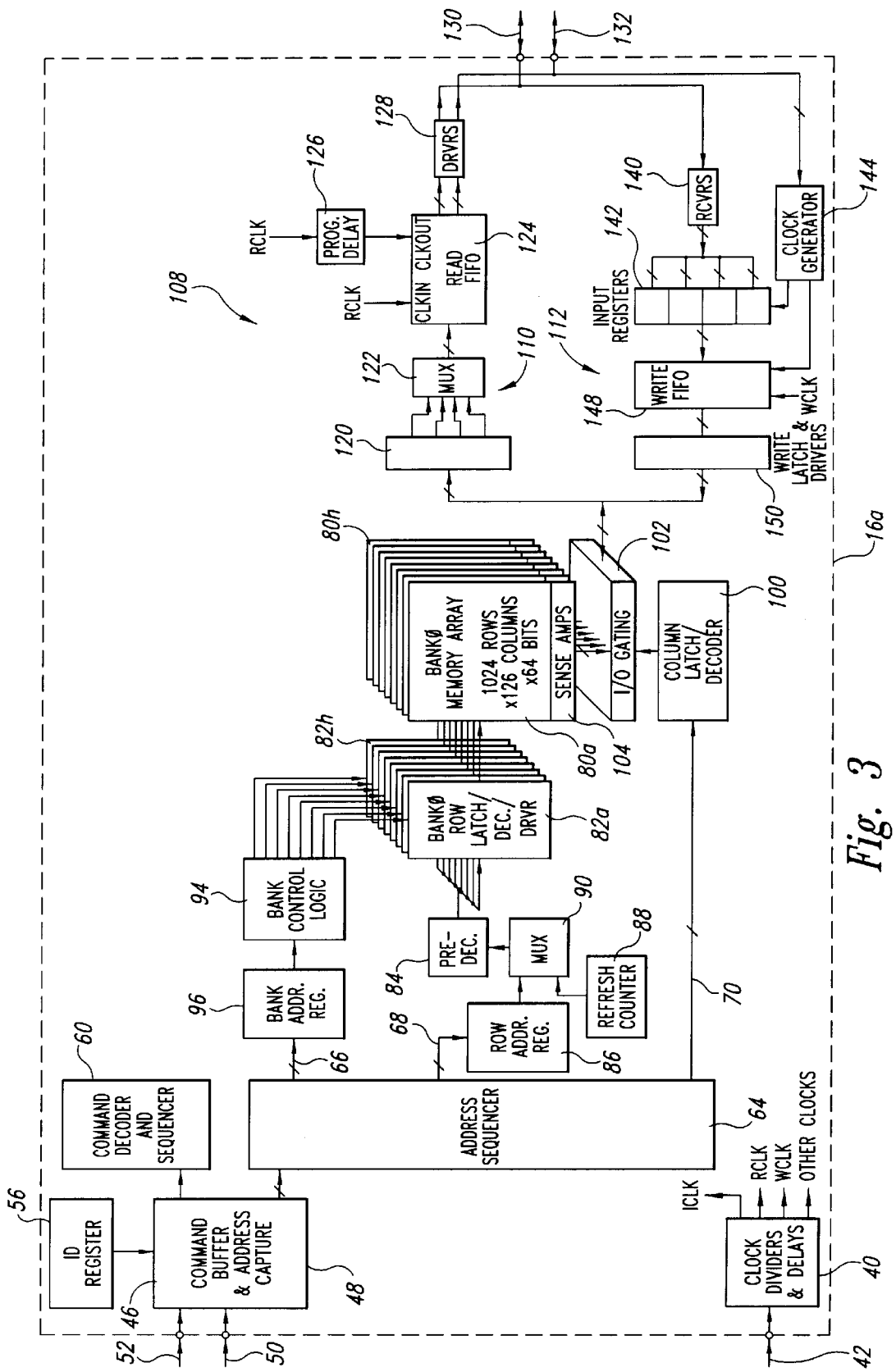
FIG. 3 is a block diagram of a packetized DRAM that may be used in the computer system of FIG. 1.
Figure 4:
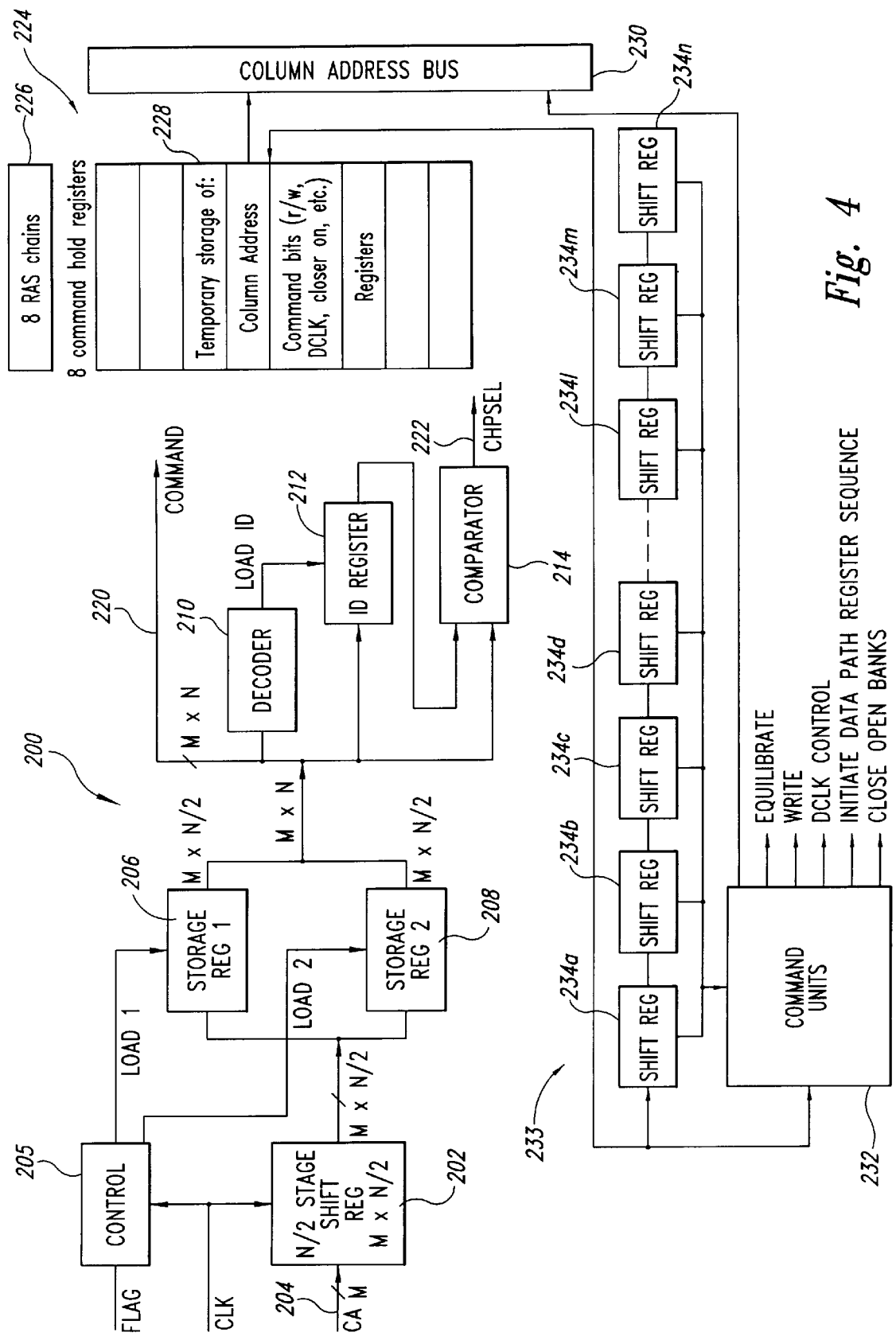
FIG. 4 is a block diagram of an embodiment of a command generator in accordance with the invention that is usable in the packetized DRAM of FIG. 3.

One embodiment of a command buffer 200 in accordance with the invention is illustrated in FIG. 4. The command buffer 200 can be used in place of the command buffer 46 in FIG. 3, and the resulting memory device may be used in the computer system shown in FIG. 1. With reference to FIG. 4, a command packet CA consisting of a plurality of packet words are applied to a shift register 202 via a command data bus 204. The width M of the bus 204 corresponds to the size of the shift register 202, and the number N of packet words in the command packet corresponds to an integer submultiple of the number of stages of the shift register 202. In the embodiment shown in FIG. 4, the shift register 202 has one-half the number of stages that are in the command packet, i.e., two shift stages since there are four packet words. Thus, the shift register 202 sequentially receives two groups of two 10-bit packet words responsive to a clock signal CLK. Coincident with the start of a four word command packet, a FLAG signal is applied to a control circuit 205 that is clocked by the CLK signal along with the shift register 202.

After two packet words have been shifted into the shift register 202, the control circuit 205 generates a LOAD1 signal that is applied to a first storage register 206. The first storage register 206 then loads the first two packet words from the shift register 202. After two more packet words have been shifted into the shift register 202, the control circuit 205 generates a LOAD2 signal that is applied to a second storage register 208. The second storage register 208 then loads the remaining two packet words from the shift register 202. The first and second storage registers 206, 208 then collectively output a 40-bit command word COMMAND on a command bus 220.

The command buffer 200 also includes a comparator 214 that selectively generates a CHPSEL signal on line 222. As explained below, the CHPSEL signal, when active high, causes the memory device containing the command buffer 200 to perform one of several functions corresponding to one or more of the COMMAND signals on the command bus 220.

In the embodiment shown in FIG. 4 in which two sets of two 10-bit command words are shifted into the shift register 202, the first and second storage registers 206, 208 receive and store 40 bits of command words. However, in the more general case, the shift register 202 has N/Y stages, each of which has a width of M bits, and Y storage registers 206, 208 each load N/Y M-bit command words. In an example where M is 8, and Y and N are both 4, the shift register 202 has a single stage having a width of 8 bits, and 4 storage registers each load 1 8-bit command word. Also, in the embodiment shown in FIG. 4, each of the command words is shifted through two stages of the shift register 202 each CLK cycle.

After the first storage register 206 has been loaded, it continuously outputs the first two packet words to an initialization decoder 210, an ID register 212, and a comparator 214. The function of the decoder 210, ID register 212, and comparator 214 is to examine the ID portion of the first packet word and determine whether the command packet is intended for the memory device containing the command buffer 200. More specifically, the command buffer 200 is programmed with a unique identifying code included in an initialization packet during an initialization routine. A portion of an initialization packet output from the storage register 206 is applied to the decoder 210, and another portion is applied to the ID register 212. The portion of the initialization packet is recognized by the decoder 210, which then generates a latch signal that causes the ID register 212 to store the other portion of the initialization packet. The portion of the initialization packet stored in the ID register 212 then uniquely identifies the memory device containing the command buffer 200. Thus, the portion of the initialization packet decoded by the decoder 210 is the same for all memory devices, while the portion of the initialization packet applied to the ID register 212 is different for each memory device. (During the initialization, means are provided to prevent all of the memory devices from simultaneously responding to the initialization packet, as explained below.) After initialization, the ID register 212 contains identifying data that is unique to the memory device that contains the command buffer 200.

After the identifying data have been stored in the ID register 212 during initialization, the memory device containing the command buffer 200 receives command packets to transfer data into and out of the memory device. An ID portion of the packet word applied to the memory device and stored in the storage register 206 is applied to the comparator 214. The comparator 214 then compares the ID portion of the packet word to the identifying data stored in the ID register 212. In the event of a match, the comparator 214 generates an active CHPSEL signal that causes the memory device to carry out the operation corresponding to the COMMAND on the command bus 220. Significantly, the comparator 214 is able to compare the ID portion of the command packet to the identifying data stored in the ID register 212 after only two of the packet words have been shifted into the shift register 202 since the ID portion is in the first packet word of the command packet, as shown in FIG. 2. Furthermore, the command buffer 200 is able to start decoding the first three command bits after the first two packet words have been shifted into the shift register 202. By processing a portion of the command packet before the entire command packet has been received by the command buffer 200, the command buffer is able to more rapidly complete processing of the command packet.

The COMMAND on the command bus 220 is also applied to a command unit 224 including a row command unit ("RCU") 226 and a column command unit ("CCU") 228. The RCU 226 is responsible for handling row addresses and row commands while the CCU 228 is responsible for handling column and bank addresses as well as commands relating to the columns of the memory arrays 80 (FIG. 3).

The CCU 228 outputs column and bank addresses to a column address bus 230, high level commands to a command execution unit 232, and timing signals to a sequencer 233 formed by a series of shift registers 234a–n. The shift registers 234 control the timing of column commands, such as EQUILIBRATE, WRITE, DCLK (data clock) CONTROL, etc., issued by the command execution unit 232 responsive to command signals from the CCU 228.

The RCU 226 may be of a somewhat conventional design, and will not be described in detail since it is somewhat peripheral to the claimed invention. The CCU 228, command execution unit 232, and sequencer 233 will be described in detail with reference to FIGS. 15–24.

Figure 5:
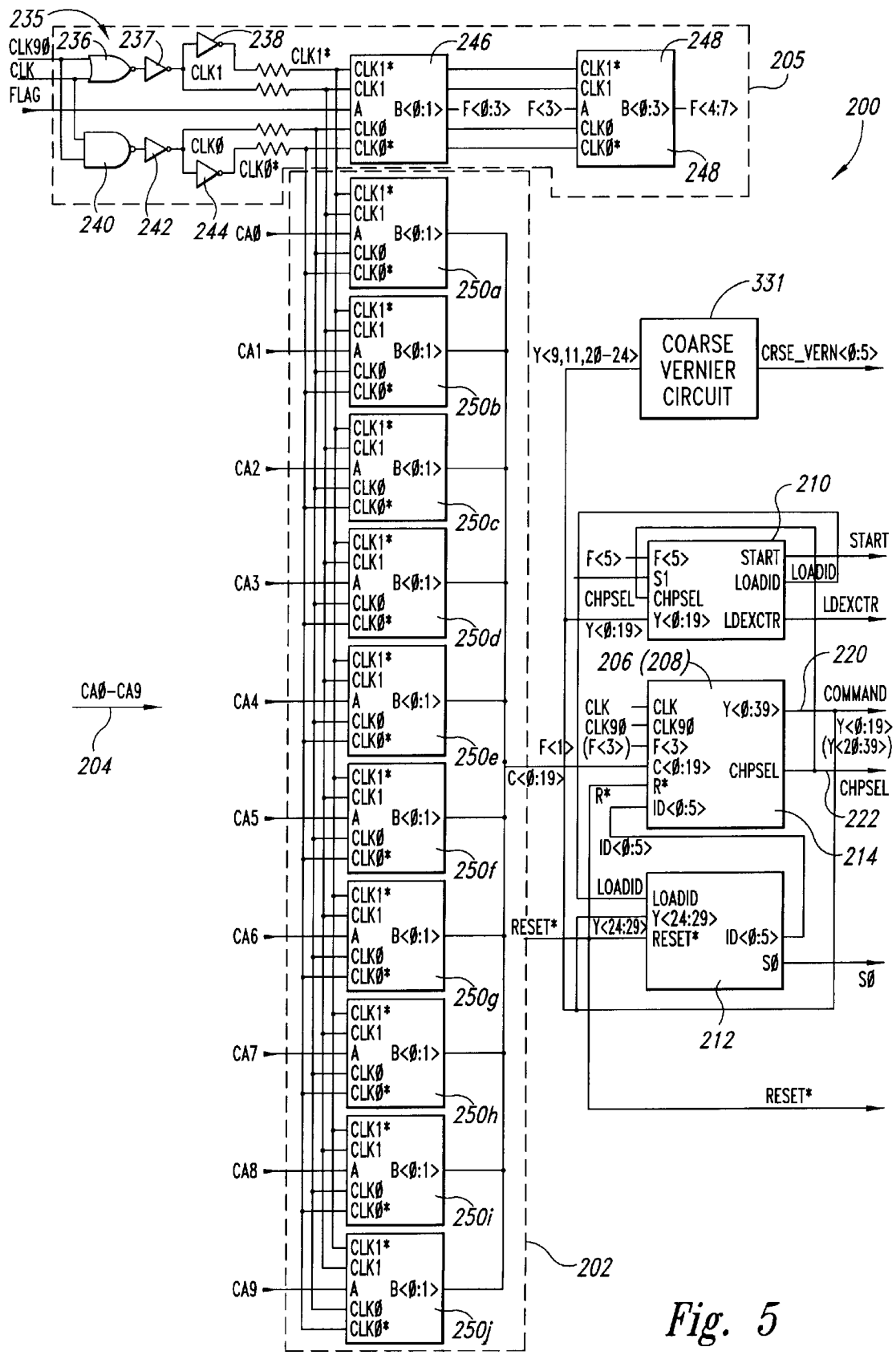
FIG. 5 is a more detailed block diagram of a command generator in accordance with the invention that is usable in the packetized DRAM of FIG. 3.

The shift register 202, control circuit 205, storage register 206, 208, initialization decoder 210, ID register 212 and comparator 214 are shown in greater detail in FIGS. 5–14. With reference, first, to FIG. 5, the control circuit 205 includes a clock circuit 235 that receives the clock signal CLK and its quadrature CLK90 from elsewhere in the memory device that contains the command buffer 200. The CLK and CLK90 signals are applied to a NOR gate 236 which outputs a high whenever CLK and CLK90 are both low, as illustrated in the timing diagram of FIG. 6. The output of the NOR gate 236 is applied through a first inverter 237 to generate a CLK1 signal and then through a second inverter 238 to generate a CLK1* signal (the "*" symbol after a signal name is used throughout to designate the compliment of the signal).

Figure 6:
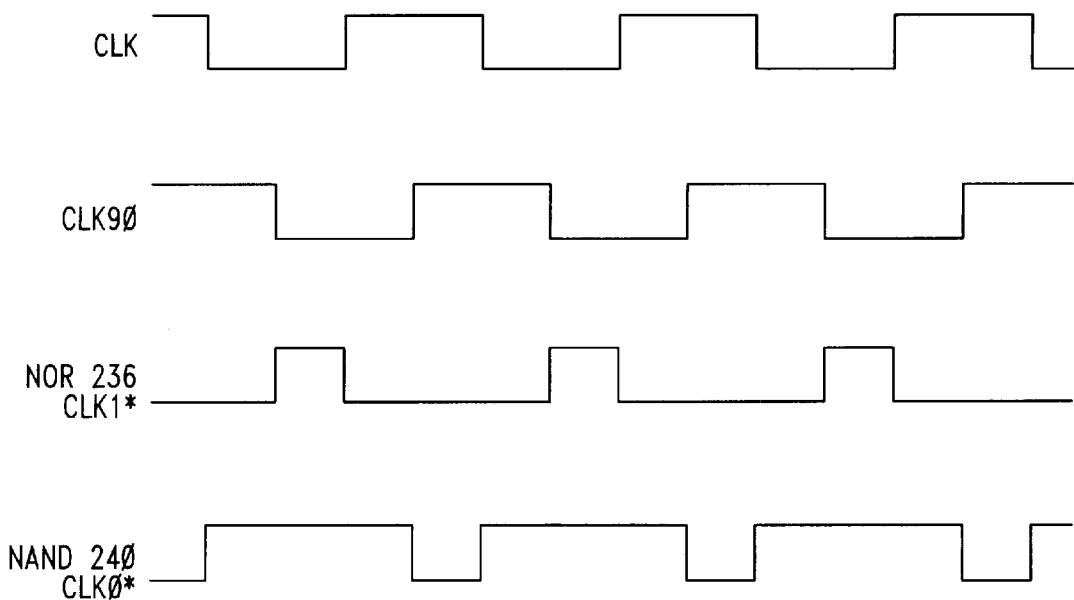
FIG. 6 is a timing diagram showing the clock signals used in a portion of the control circuit of the command generator shown in FIGS. 4 and 5.

The CLK90 and CLK signals are also applied to a NAND gate 240 that outputs a low whenever both CLK and CLK90 are high, as also illustrated in FIG. 6. The output of the NAND gate 240 is coupled through an inverter 242 to generate a CLK0 signal and then through a second inverter 244 to generate a CLK0* signal. These signals are used throughout the command buffer 200, as explained in detail below.

The control circuit 205 also includes a pair of shift registers 246, 248 that are connected in series with each other to form an 8-stage shift register. The shift register 246 receives the FLAG signal and sequentially shifts it through the four stages of the shift register circuit 246 and then through the four stages of the shift register circuit 248 responsive to the CLK0, CLK0*, CLK1, and CLK1* signals. The FLAG signal is shifted through two stages of the shift register circuits 246, 248 each cycle of the CLK signals. Thus, when FLAG goes high, two successive F<7:0> outputs of the shift register circuits 246, 248 sequentially go high each clock cycle.

The shift register 202 shown in FIG. 4 includes ten separate shift register circuits 250a–j, each of which receive a respective bit CA0–CA9 of the incoming 10-bit packet word. As explained further below, each of the shift register circuits 250a–j includes two shift register stages. Thus, after each clock cycle, two command bits CA have been shifted into each shift register circuit 250, and these bits are available as a 2-bit word B<1:0>. Thus, the ten shift register circuits 250a–j collectively output 20 bits of the command packet.

The remaining components of the command buffer 200 are the decoder 210, the ID Register 212, and the storage registers 206, 208 and comparator 214, which are shown as one block in FIG. 5. These components operate as explained above with reference to FIG. 4. However, the block diagram of FIG. 5 shows some additional signal inputs and outputs, namely, the SI and RESET* inputs and the SO output. All of these signal inputs and outputs are used during the initialization sequence. Specifically, at initialization, the RESET* is driven active low by conventional circuitry elsewhere in the memory device (not shown) to load predetermined identification data, i.e., the number "63," into the ID register 212. As explained below, the RESET* signal also clears all 20 bits of each storage register 206, 208 so that a spurious COMMAND signal does not appear on the command bus 220. By setting the identification data in the ID register 212 to a known value, i.e., 63, the processor is able to subsequently load the ID register 212 with identifying data that is unique to the memory device containing the command buffer 200. As mentioned above, the comparator 214 must generate a CHPSEL signal to allow the memory device to perform various functions. Included in these various functions is decoding the portion of the command word that allows the decoder 210 to generate the LOADID signal. Thus, if the processor was not able to apply to the command buffer 200 a command packet containing the identifying data in the ID register 212, the comparator 214 would not generate the CHPSEL output. Without the CHPSEL output, the decoder 210 would not generate the LOADID output to load the identifying data into the ID register 212. However, the command packet initially contains the binary equivalent of 63 which is favorably compared by the comparator 214 to the "63" initial identifying data in the ID register 212. Thus, on this initialization command, the comparator 214 generates the CHPSEL signal which allows the decoder 210 to generate a LOADID signal that latches other portions of the command words into the ID register 212 as the unique identifying data for the memory circuit containing the command buffer 200.

The decoder 210 also generates a START pulse and a LDEXCTR pulse responsive to respective predetermined combinations of the command word bits Y<19:5> and the F<5> signal. As explained below, the START pulse is used to initiate the execution of a command in a command packet, and the LDEXCTR pulse is used to load a counter that is used in generating various command signals from the command.

During the initialization routine, all of the memory devices in the computer system 10 (FIG. 1) receive the same command packet and thus would latch the same identifying data into their respective ID registers 212 if there were not some means to prevent all of the memory devices from simultaneously responding to the initialization command packet. The SI input and the SO output are provided for this purpose. Assuming that the computer system 10 contains three memory devices 16 containing the command buffer 200, the SI input of the first memory device is permanently held high through a jumper or similar means (not shown). A high SI input allows the command decoder 210 to generate a LOADID output to load a portion of the command packet into the ID register 212 as the unique identifying data. The SO output of the first memory device is coupled to the SI input of the second memory device, and the SO output of the second memory device is coupled to the SI input of the third memory device. The SO output of each of the memory devices is initially low. However, when unique identifying data is loaded into the ID register 212, the ID register 212 generates a high SO output. The high SO output coupled to the SI input of the subsequent memory device allows the subsequent memory device to be programmed with the identifying data. Thus, after the identifying data has been loaded into the ID register 212 for the first memory device, its SO output goes high thereby driving the SI input of the second memory device high. As a result, the identifying data in the initialization command packet is loaded into the ID register 212 of the second memory device which then generates a high SO output. The high SO output drives the SI input of the third memory device high which allows the ID register 212 of the third memory device to receive and store identifying data in the third initialization command packet. Once the unique identifying data has been stored in the ID register 212, the memory device no longer responds to the initialization command packet because the identifying data is no longer "63," which is the identifying data in the initialization command packet.

The command buffer 200 also includes a coarse vernier circuit 331. As explained in greater detail below, the coarse vernier circuit 331 generates a 6-bit coarse vernier word CRSE_VERN<5:0> from a portion of the command word Y<20:24, 11, 9>. As further explained below, the coarse vernier word CRSE_VERN<5:0> is used to preload counters (not shown in FIG. 5) in the column command unit 228.

Figure 7:
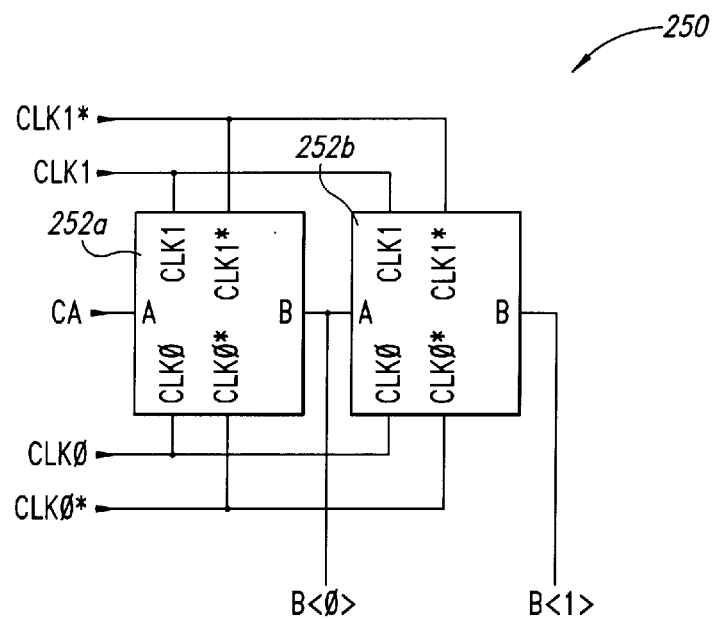
FIG. 7 is a logic diagram of one of the shift register circuits used in the command generator shown in FIGS. 4 and 5.

As explained above with reference to FIG. 5, the shift register 202 includes ten separate shift register circuits 250a–j, each of which receive a respective bit CA0–CA9 of the incoming 10-bit packet word. As illustrated in FIG. 7, each of the shift registers 250a–j includes two shift register stages 252a,b. The first stage 252a receives the packet word bit CA, and its output is connected to the input of the second stage 252b and to an external output B<0>. The output of the second stage 252b is connected to an external output B<1>. Transfer from the input to the output of each stage 252a,b is in response to four clock signals CLK0, CLK0*, CLK1, CLK1* as explained in greater detail below. After two clock cycles, two command word bits CA have been shifted into the shift register stages 252a,b and both of these bits are available as a 2-bit word B<1:0>. Thus, the ten shift register circuits 250a–j collectively output two 10-bit command words.

Figure 8:
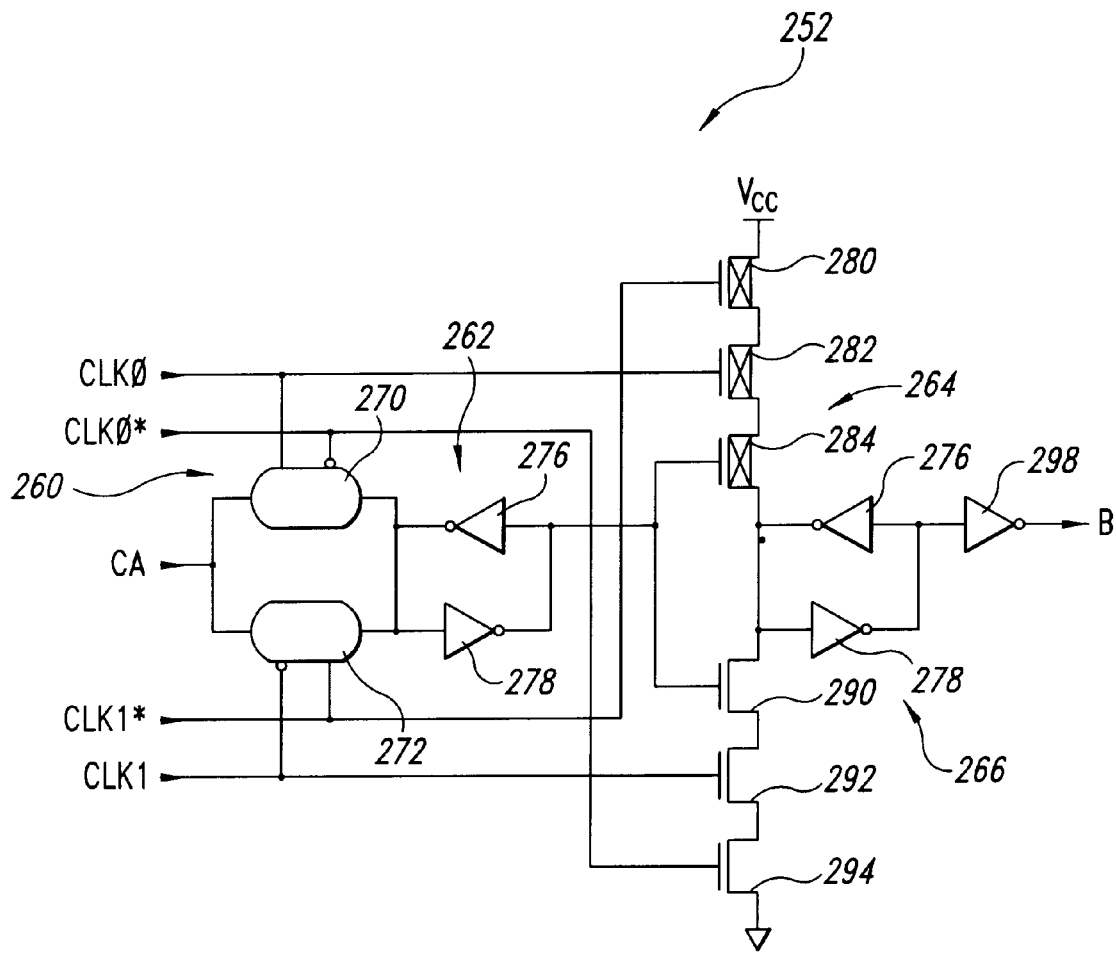
FIG. 8 is a schematic and logic diagram of a shift register stage used in the shift register circuit of FIG. 7.

Each of the shift register stages 252 is shown in greater detail in FIG. 8. Each of the shift register stages 252 includes a first transfer gate 260, a second transfer gate 264, and a second latch 266. The transfer gate 260 includes a first pass gate 270 operated by the CLK0 and CLK0* signals and a second pass gate 272 in parallel with the first pass gate 270 and operated by the CLK1 and CLK1* signals. The first latch 262 and the second latch 266 are each formed by a pair of inverters 276, 278 connected input-to-output. The second transfer gate 264 is formed by three PMOS transistors 280, 282, 284 connected between a supply voltage and the input to the second latch 266. The second transfer gate 264 also includes three NMOS transistors 290, 292, 294 connected in series between the input to the second latch 266 and ground. As explained below, the second transfer gate 264 inverts the signal from the first latch 262. Therefore, to restore the correct phasing of the command signals CA, an inverter 298 is provided at the output of the second latch 266.

Each of the pass gates 270, 272 is formed by an NMOS transistor and a PMOS transistor (not shown) connected in parallel with each other with the gate of the NMOS transistor being coupled to the non-inverting input and the gate of the PMOS transistor coupled to the inverting input.

Figure 9:
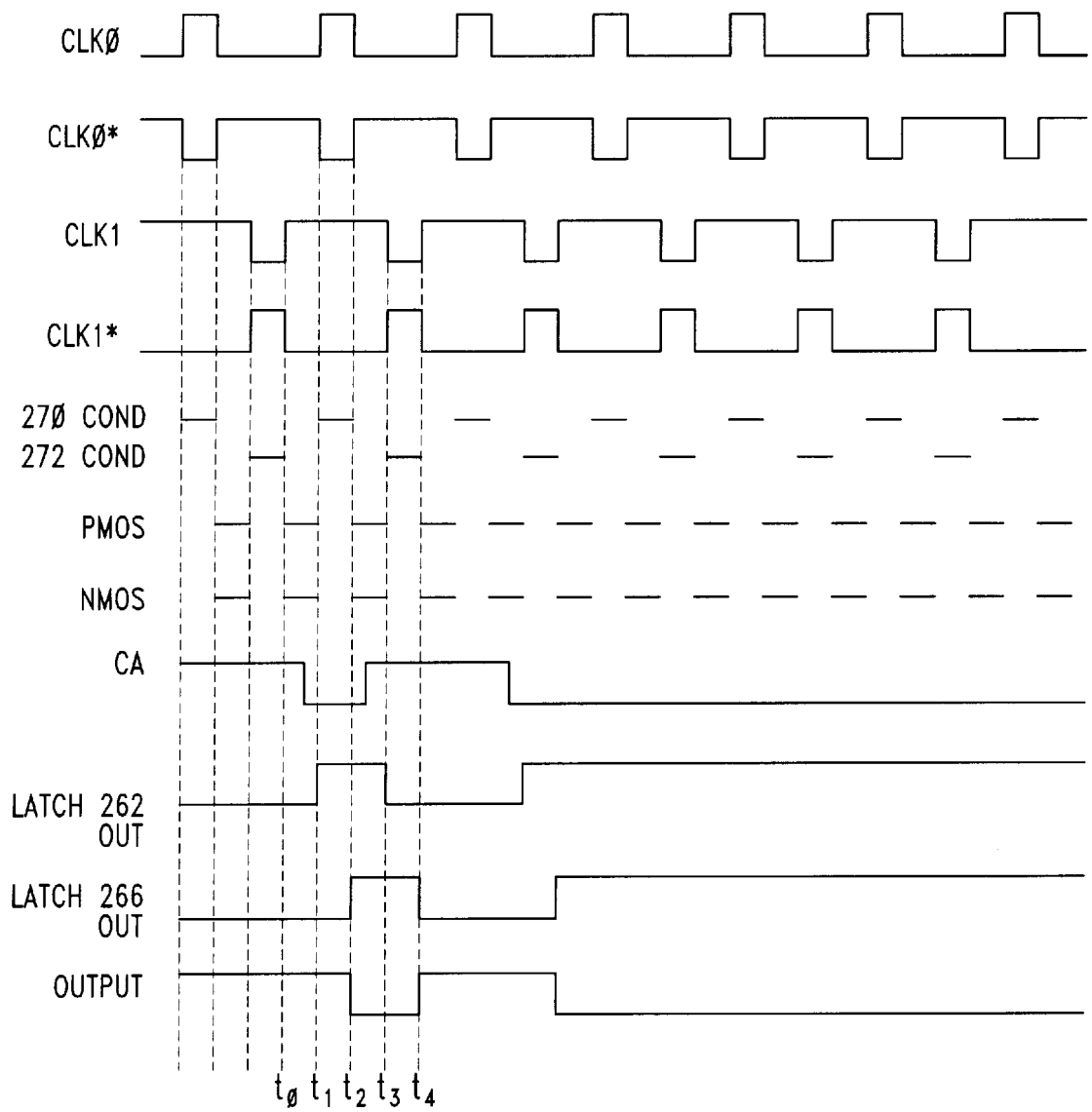
FIG. 9 is a timing diagram showing the various signals present in the shift register stage of FIG. 8.

The operation of the shift register stage 252 shown in FIG. 8 is best explained with reference to the timing diagram of FIG. 9. The pass gate 270 is conductive whenever the CLK0 signal is high and the CLK0* signal is low. Thus, the pass gate 270 is conductive for a short period each clock cycle, as shown by the line segments adjacent the 270 COND designation in FIG. 9. Similarly, the pass gate 272 is conductive whenever the CLK1 signal is low and the CLK1* signal is high. As shown by the line segments in FIG. 8, the pass gate 272 is conductive for a short period each clock cycle, with the conductive period of the pass gate 270 being equally spaced from the conductive period of the pass gate 272. Thus, the first transfer gate 260 is conductive twice each clock cycle, with each conductive period followed by a period of non-conductivity. Each time the transfer gate 260 is conductive, the inverse of the command bit CA is output from the latch 262 to the second transfer gate 264.

The function of the second transfer gate 264 is to couple the input to the second latch 266 to either $V_{CC}$ or ground at the proper time depending upon the value at the output of the first latch 262. The PMOS transistors 280, 282 are conductive whenever CLK0 and CLK1* are both low, which occurs at times designated by the line segments adjacent the "PMOS" designation in FIG. 9. The NMOS transistors 292, 294 are both conductive whenever the CLK1 signal and the CLK0* signal are both high, which occurs twice each clock cycle at the times designated by the line segments adjacent "NMOS" in FIG. 9. Thus, the PMOS transistors 280, 282 and the NMOS transistors 292, 294 are all conductive at the same times, and these periods of conductivity alternate with the periods of conductivity of the first transfer gate 260. The input to the second latch 260 is coupled to either $V_{CC}$ or ground during these periods of conductivity depending upon whether the output of the first latch 262 turns ON the PMOS transistor 284 or the NMOS transistor 290. More specifically, if the output of the first latch 262 is high, the NMOS transistor 290 will turn ON, thereby applying a low to the input of the second latch 266. If the output of the first latch 262 is low, the PMOS transistor 284 will turn ON, thereby applying a high to the input of the second latch 266. Thus, the second transfer gate 264 couples the inverted output of the first latch 262 to the input of the second latch 266.

During the time that the second transfer gate 264 is conductive, the second latch 266 outputs a signal that is the same as the output of the first latch 262 which, after passing through the inverter 298, is the same phase as the incoming command bit CA. The operation of the latch circuit 250 is shown using a command bit CA, which is initially high, but goes low shortly after $t_0$. During the next conductive period of the first transfer gate 260 at time $t_1$, the high command bit CA is transferred to the output of the first latch 262 in inverted form as shown in FIG. 9. During the next conductive period of the second transfer gate 264, the high at the output of the latch 262 is coupled to the output of the latch 266, thereby causing the output to go low at time $t_2$. Shortly thereafter, the command bit CA goes high. At the next conductive period of the first latch 260 at time $t_3$, this high is coupled through the first latch 260, thereby causing the output of the second latch 262 to go low. On the next conductive period of the second transfer gate 264 at time $t_4$, the high output of the first latch 262 is coupled to the output of the second latch 266, thereby causing the output to go high. Thus, a command bit coupled to the shift register stage 252 is shifted to the output of the shift register stage 252 less than one clock cycle later. On the next half clock cycle, the command bit is shifted to the output of the next shift register stage until one clock cycle has elapsed, at which time two command bits have been shifted into each shift register circuit 250. Thus, two command bits are shifted through each shift register circuit 250 each clock cycle in the same manner that the FLAG signal is shifted through two stages of the shift register circuit 246, 248 (FIG. 5) each clock cycle.

The shift register circuits 250 shown in FIG. 7, including the shift register stages shown in FIG. 8, are also used as the shift registers 246, 248 in the control circuit 206 (FIG. 5).

Figure 10:
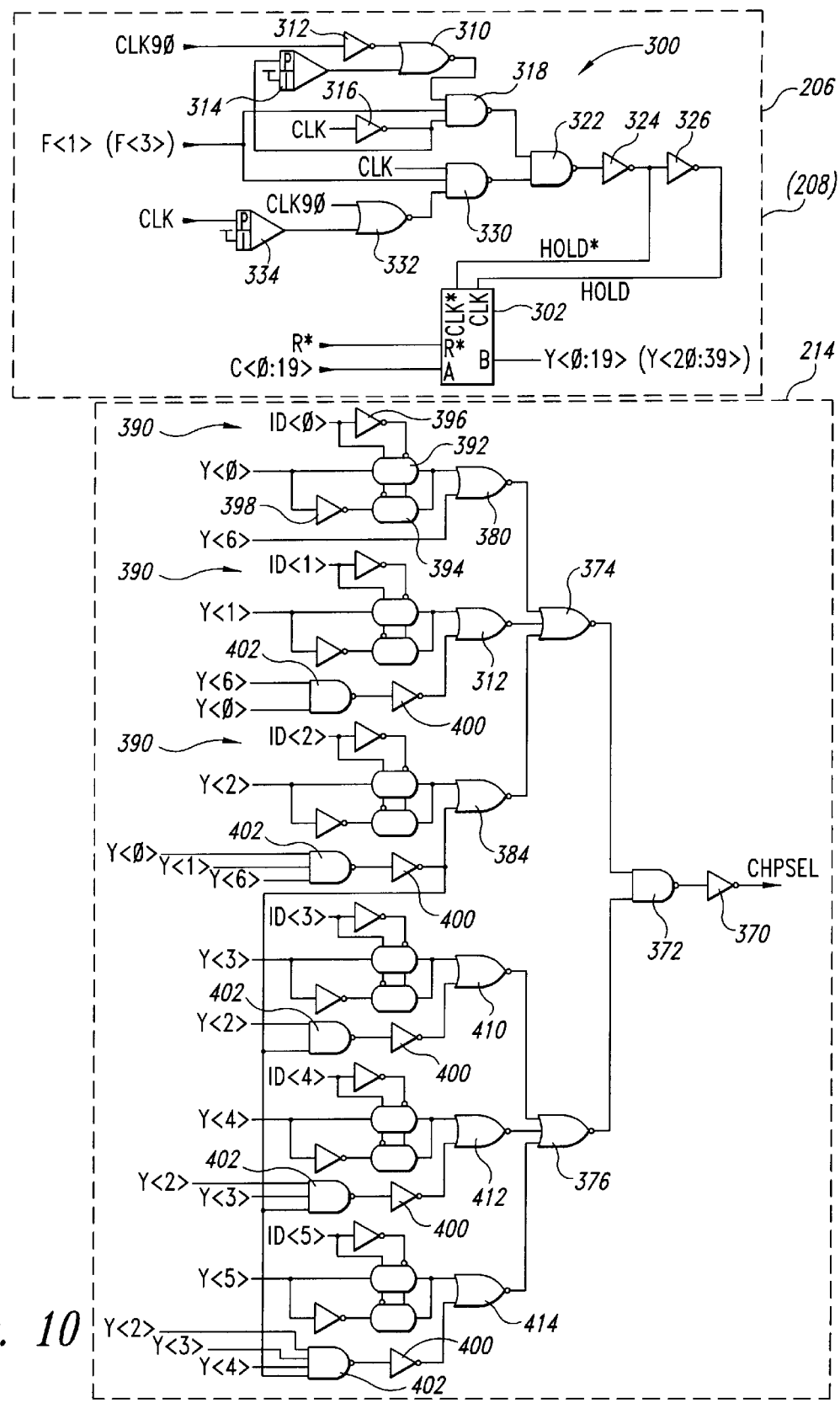
FIG. 10 is a schematic and logic diagram of a storage register and a comparator used in the command generator shown in FIGS. 4 and 5.
Figure 11:
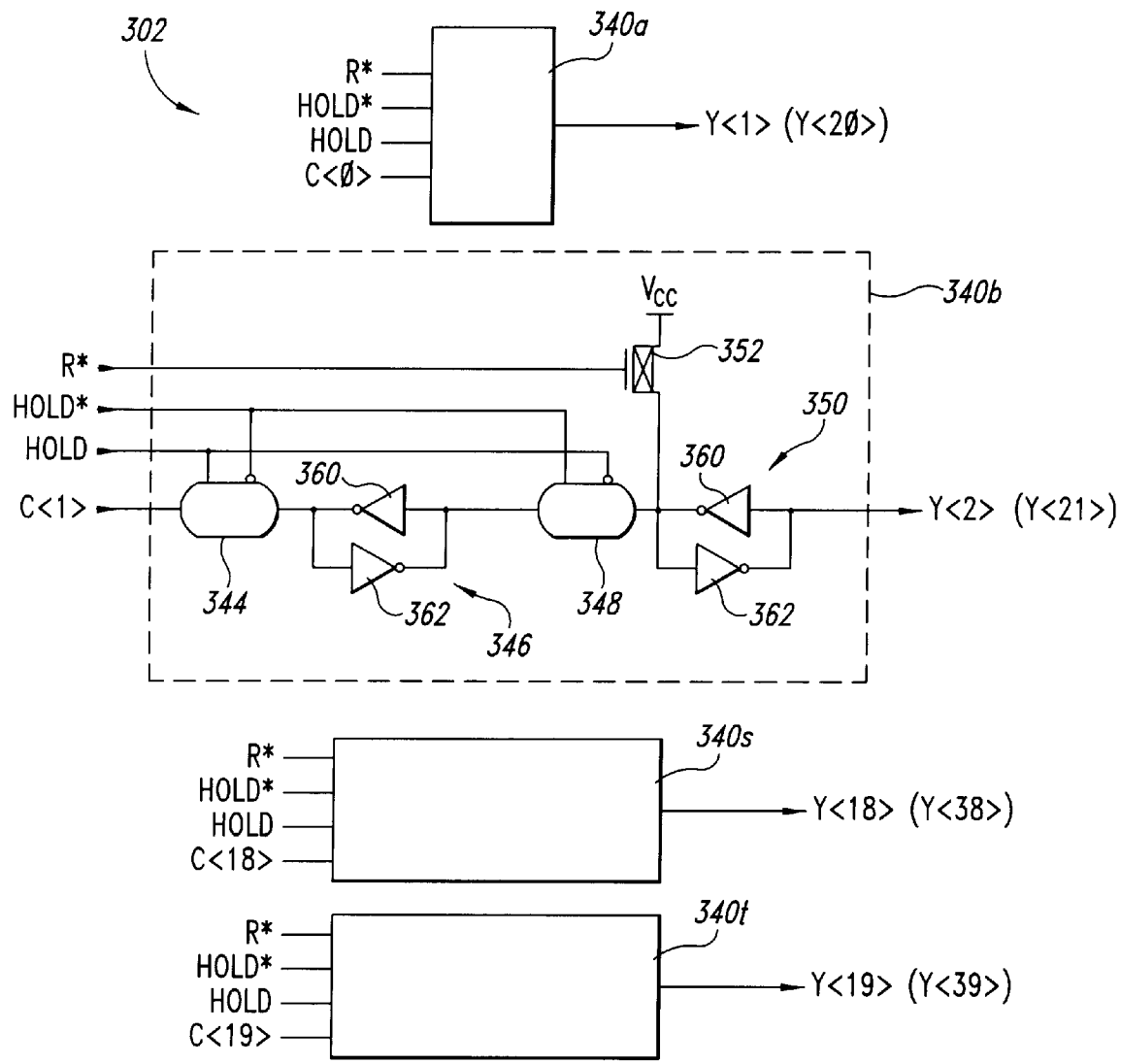
FIG. 11 is a logic diagram of a register circuit used in the storage register shown in FIG. 10.

The storage registers 206, 208 and the comparator 214 are illustrated in FIG. 10, in which the reference numerals and signal names for the storage register 208 are placed in parentheses and the reference numerals and signal names for the storage register 206 are without parentheses. The storage registers 206, 208 each include a control circuit 300 for generating HOLD signals to load two 10-bit command words from the shift register 202 into a 20-bit register 302. The control circuit 300 includes a NOR gate 310 that receives a CLK90* signal generated by passing the CLK90 signal through an inverter 312. The NOR gate 310 also receives the output of a delay circuit 314 which, in turn, is driven by the output of an inverter 316 that receives the CLK signal. The output of the NOR gate 310 goes high whenever CLK90 is high and whenever CLK is high after the delay provided by the delay circuit 314. The output of the NOR gate 310 is applied to one input of a three input NAND gate 318. The NAND gate 318 also receives a CLK* signal from the inverter 316 and an F signal (F<1> in the case of the storage register 206 and F<3> in the case of the storage register 208) from the control circuit 206 (FIG. 5). The output of the NAND gate 318 is low when all of its inputs are high. Thus, the output of the NAND gate 318 is low when the CLK90 signal is high, the delayed CLK is high, the CLK signal is low, and the F signal (F<1> or F<3>) is high. This combination of signals exists whenever the F signal is high at a falling edge of the CLK signal.

The low at the output of the NAND gate 318 is applied to a NAND gate 322 which then outputs a high which is coupled through two inverters 324, 326. Thus, on the falling edge of CLK following the F signal (F<1> or F<3>) going high, the output of the inverter 324 generates an active low HOLD* and the inverter 326 generates an active high HOLD signal.

The active low HOLD* signal and the active high HOLD signal are also generated if the other input to the NAND gate 322 goes low. The other input to the NAND gate 322 is driven by the output of a NAND gate 330 which receives the CLK signal, the F signal (F<1> for register 206 and F<3> for register 208) and the output of a NOR gate 332. The NOR gate 332, in turn, receives the CLK90 signal and the CLK signal after being delayed by a delay circuit 334. Thus, the output of the NAND gate 330 goes low to generate an active HOLD and HOLD* signals when the CLK signal is high, the CLK90 signal is low, the delayed CLK signal goes low, and the F signal (F<1> for register 206 and F<3> for register 208) goes high. This combination of signals exists whenever the F signal (F<1> or F<3>) is high at a rising edge of the CLK signal.

In summary, active HOLD and HOLD* signals are generated and applied to the 20-bit register 302 for the storage register 206 on either the rising edge or the falling edge of the CLK signal after the F<1> signal is generated by the control circuit 205 (FIG. 5). The control circuit 205 generates the F<1> signal two clock edges after the FLAG signal is applied to the control circuit 205. As explained above, after two clock edges (i.e., one clock cycle), the first two 10-bit command words have been shifted into the shift register 202, and it is at this time that the HOLD and HOLD* signals transfer these 20 bits to the register 302.

Similarly, active HOLD and HOLD* signals are generated and applied to the 20-bit register 302 for the storage register 208 on either the rising edge or the falling edge of the CLK signal after the F<3> signal is generated by the control circuit 205. The control circuit 205 generates the F<3> signal four clock edges after the FLAG signal is applied to the control circuit 205. As explained above, after four clock edges (i.e., two clock cycles), the second two 10-bit command words have been shifted into the shift register 202. It is at this time that the HOLD and HOLD* signals transfer these 20 bits to the register 302 for the storage register 208.

The register 302 includes 20 register cells 340a–340t each of which receives an active low reset signal R*, the HOLD and HOLD* signals and one of the 20 bits C<19:0> from the shift register 202. One of the register cells 340b is shown in detail in FIG. 11, where the signals for the register 302 in the storage register 208 are once again shown in parentheses. The register cells 340 each include a first pass gate 344, a first latch 346, a second pass gate 348, and a second latch 350. The input to the second latch 350 is selectively pulled high by a PMOS transistor 352 whenever the reset signal R* goes low to cause its output Y to go low. Thus, upon reset, all of the outputs Y of the storage registers 206, 208 are set low.

The pass gate 344 includes an NMOS transistor (not shown) having its gate connected to the HOLD input and a PMOS transistor (not shown) connected in parallel with the NMOS transistor having its gate connected to the HOLD* input. Thus, the transfer gate 344 is closed when the HOLD and HOLD* signals are active. The second pass gate 348 also uses an NMOS transistor (not shown) in parallel with a PMOS transistor (not shown), but their gates are connected to the HOLD and HOLD* signals with the opposite polarity. Thus, when HOLD and HOLD* are inactive, a command bit from the shift register 202 is transferred to the latch 346. Shortly thereafter when the HOLD and HOLD* signals become active, the pass gate 348 closes to transfer the command bit to the second latch 350. As with the latches used in the shift register stages 252 (FIG. 8), each of the latches 346, 350 is formed by a pair of inverters 360, 362 connected input-to-output.

Returning to FIG. 10, the comparator 214 includes a collection of logic circuits that compare 6 bits of identifying data ID<5:0> with six command bits from the storage register 208 to generate an active high chip select CHPSEL signal when a command is intended for use by the memory device containing the command buffer 200. The operation of the comparator 214 can best be understood by tracing backward from an active high chip select CHPSEL output. The CHPSEL output is generated at the output of an inverter 370 that is coupled to the output of a NAND gate 372. The CHPSEL will be active high whenever the output of the NAND gate 372 is low, which will occur whenever both inputs to the NAND gate 372 are high. The inputs to the NAND gate 372 are generated at the outputs of NOR gates 374, 376. The outputs of the NOR gates 374, 376 will both be high if all of the inputs to the NOR gates 374, 376 are low.

The inputs to the NOR gate 374 will all be low if the output of any of three NOR gates 380, 382, 384 is high. Each NOR gate 380, 382, 384 has two inputs, one of which is connected to the output of an exclusive OR circuit 390 and the other of which is coupled to one of the command bits Y, either directly or through additional logic circuitry.

Each of the exclusive OR circuits 390 includes a pair of pass gates 392, 394 which are alternately enabled by an ID bit and its compliment ID* at the output of an inverter 396. The pass gate 392 receives the command bit Y while the pass gate 394 receives the complement of the command bit Y* from an inverter 398. If the command bit Y and the ID bit are both low, then the pass gate 394 is enabled, and the high complement of the command bit is coupled through the pass gate 394 to the input of the NOR gate 380. If the command bit Y and the ID bit are both high, then the pass gate 392 is enabled, and the high command bit is coupled to the input to the NOR gate 380. Thus, the output of the exclusive OR circuit 390 is high if the command bit Y matches the identifying bit ID.

If the command bit Y is low and the identifying bit ID is high, then the pass gate 392 is enabled and the low command bit is transferred to the input of the NOR gate 380. Finally, if the command bit is high but the identifying bit ID is low, then the pass gate 394 is enabled, and the low complement of the command bit Y is coupled through the pass gate 394 to the NOR gate 380. Thus, the output of the exclusive OR circuit 390 is low in the event the command bit Y does not match the identifying bit ID.

The output of the NOR gate 380 will thus be low if either the Y<0> command bit matches the ID<0> identifying bit or the Y<6> command bit is high. Similarly, the output of the NOR gate 382 will be low if either the Y<1> command bit matches the ID<1> bit or the output of an inverter 400 is high which results when the output of a NAND gate 402 is low which occurs when the Y<6> and Y<0> commands bits are both high. Similarly, the output of the NOR gate 384 is low whenever either the Y<2> command bit matches the ID<2> bit or the Y<0>, Y<1>, and Y<6> commands bits are all high after being coupled through the NAND gate 402 and inverter 400.

The inputs to the NOR gate 376 will all be low if either input to each of three NOR gates 410, 412, 414 is high. Thus, the inputs to the NOR gate 376 will all be low if the Y<3> command bit matches the ID3 bit, the Y<4> command bit matches the ID<4> bit, and the Y<5> command bit matches the ID<5> bit. All three inputs to the NOR gate 376 will also be low if the Y<0>, Y<1>, Y<6>, Y<2>, Y<3> and Y<4> commands bits are all high. Therefore, the CHPSEL signal will be generated if either the Y<5:0> command bits match the ID<5:0> identifying bits or if the Y<6:0> command bits are all high. The Y<6:0> command bits will all be high whenever the Y<6> command bit is high and the Y<5:0> command bits correspond to number 63. As mentioned above, at power-up, the identifying data ID<5:0> are set to "63" (binary "111111"). Thus, when unique identification data is to be recorded in the ID register 212 (FIGS. 3 and 4), the processor generates a command packet in which the Y<6:0> bits are all high. As a result, the comparator circuit 214 generates a CHPSEL signal which allows the decoder 210 to output a LOADID signal. After the unique Y<5:0> bits have been stored in the ID register 212, they are thereafter compared with the Y<5:0> command bits and, in the event of a match, the CHPSEL signal is generated to allow the memory device containing the command buffer 200 to perform a function corresponding to other bits of the command word.

Figure 12:
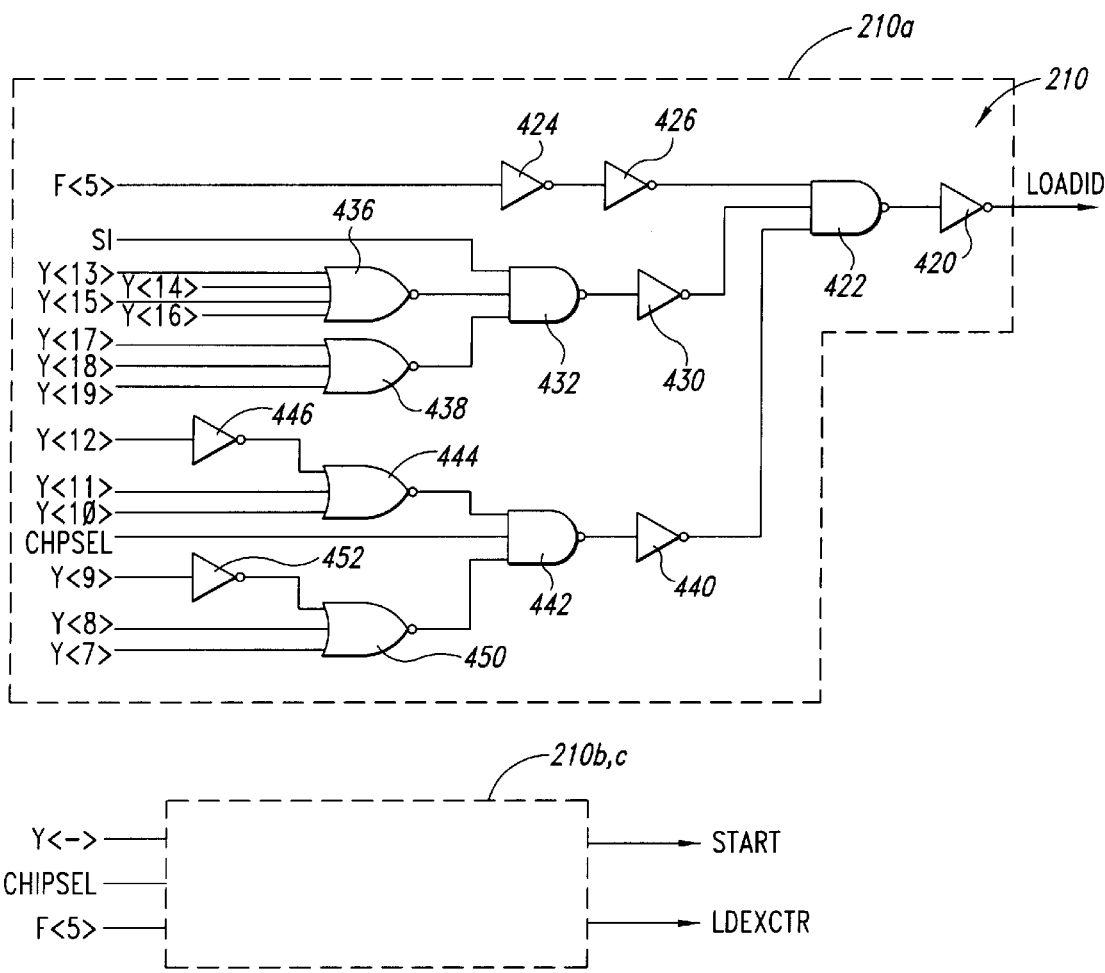
FIG. 12 is a logic diagram of a decoder used in the command generator shown in FIGS. 4 and 5.

The decoder 210 (FIGS. 4 and 5) is illustrated in further detail in FIG. 12. As shown in FIG. 5, the decoder 210 includes three decoder units 210a–c, each of which decodes respective combinations of command word bits Y<19:5> responsive to the CHPSEL and F<5> signals. The decoder unit 210a generates the LOADID signal, the decoder unit 210b generates the START signal, and the decoder unit 210c generates the LDEXCTR signal. Since the decoder units 210a–c operate in substantially the same manner, only one of these decoder units 210a will be explained in detail.

The operation of the decoder 210a can best be understood by tracing the circuit back from an active high LOADID output. The LOADID output will be high whenever the input of an inverter 420 is low. The input of the inverter 420 is coupled to the output of a NAND gate 422 that will generate a low whenever all of its inputs are high. All of the inputs to the NAND gate 422 will be high when the chip CHPSEL and F<5> inputs are high and the Y<19:7> command bits have a predetermined pattern. More specifically, the F<5> input from the control circuit 205 is coupled through a pair of inverters 424, 426 to one input of the NAND gate 422. Another input to the NAND gate 422 is generated by an inverter 430 that receives the output of a NAND gate 432. The output of the NAND gate 432 will be low to cause the inverter 430 to apply a high to the input of the NAND gate 422 when all of the inputs to the NAND gate 432 are high. The inputs to the inverter 432 will all be high when the SI input is high and all of the inputs to two NOR gates 436, 438 are all low. Thus, the second input to the NAND gate 422 will be high whenever the SI signal is high and Y<19:13> are all low. The third input to the NAND gate 422 will be high whenever a low is applied to an inverter 440 by a NAND gate 442. The output of the NAND gate 442 will be low whenever all of its inputs are high. The first input to the NAND gate 442 is output by a NOR gate 444 which receives the complement of the Y<12> command bit from an inverter 446 and the Y<10> and Y<11> command bits. Thus, the output of the NOR gate 444 will be high when Y<10> and Y<11> are low and Y<12> is high. The second input to the NAND gate 442 is the CHPSEL signal which, as explained above, is high whenever a command packet is intended for execution by the memory device containing the command buffer 200. The third input to the NAND gate 442 will be high whenever all three inputs to a NOR gate 450 are low. The NOR gate 450 receives the Y<7> and Y<8> command bits and the complement of the Y<9> command bit through an inverter 452. Thus, the output of the NAND gate 442 will be low whenever CHPSEL, Y<12> and Y<9> are high and Y<7>, Y<8>, Y<9>, Y<10> and Y<11> are low.

In summary, a LOADID pulse will be generated to load identifying data into the ID register 212 (FIGS. 4 and 5) on the F<5> pulse from the control circuit 205 (FIGS. 4 and 5) whenever the SI signal is high and Y<19:7> are decoded as "0000000100100." As explained above, the SI input is coupled to the SO output of another memory device so that the command buffer of only one memory device at a time will generate a LOADID pulse responsive to an initialization command packet.

As mentioned above, the decoder 210 also includes decoder units 210b,c for generating the START pulse and the LDEXCTR pulse. Each of these decoder units 210b,c is structured and operates in a manner that is substantially similar to the decoder unit 210a. In each case, the decoder units 210b,c generate the START pulse and the LDEXCTR pulse responsive to decoding respective combinations of the command word bits Y<19:0> responsive to the F<3> signal and the CHPSEL signal being active high.

Figure 13:
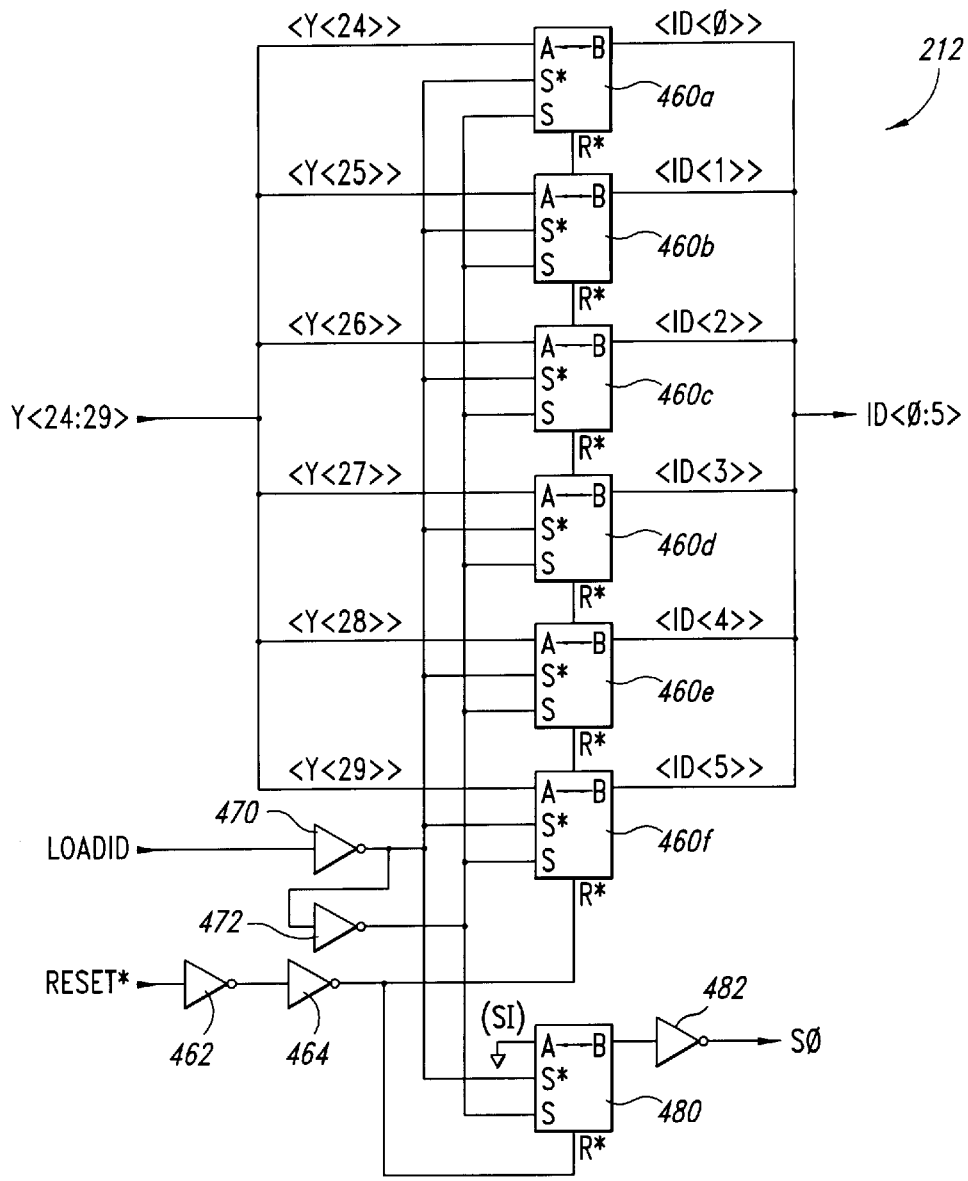
FIG. 13 is a logic diagram of an ID Register used in the command generator shown in FIGS. 4 and 5 to store identifying data unique to each memory device.

The ID register 212 is shown in greater detail in FIG. 13. The ID register 212 includes six latch circuits 460a–460f, each of which receives a respective command bit Y<29:Y24> from the storage register 208 (FIGS. 4 and 5). The latch circuits 468a–468f each include a RESET* input that is coupled to an active low reset signal RESET* through inverters 462, 464. As explained above, prior to receiving the initialization command packet, the memory device is reset. The active low RESET* signal causes all of the latch circuits 460a–f to output a high which causes all of the bits of the identifying data ID<5:0> to correspond to binary number "63" which allows the comparator circuit 214 to output a CHPSEL signal upon initialization as explained above with reference to FIG. 12. Thereafter, identifying data unique to each memory device are applied to the latch circuits 460a–f through the Y<29:24> command bits, and the LOADID pulse is then generated as explained above. The LOADID pulse is coupled through an inverter 470 to the S* inputs of the latch circuits 460a–f while the output of the inverter 470 is coupled through an inverter 472 to the S inputs of the latch circuits 460a–f. The active high S and active low S* signals cause the latch circuits 460a–f to store the Y<29:24> command bits as the unique identifying data ID<5:0> for the memory device containing the command buffer.

The ID register 212 also contains a latch circuit 480 and an inverter 482 for generating the SO output. When the RESET* signal is driven active low, the latch 480 is reset to cause the inverter 482 to output a low SO signal. However, the LOADID pulse latches a low to the output of the latch circuit 480, thereby causing the inverter 482 to drive SO high. The high SO signal is applied to the SI input of the decoder 210 in another memory device as explained above so that the other memory device will respond to the next initialization command packet.

Figure 14:
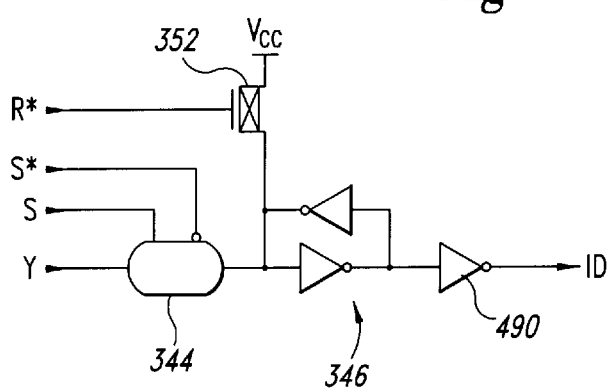
FIG. 14 is a schematic diagram of a latch circuit used in the ID Register Circuit of FIG. 13.

The latch circuit 460a–f used in the ID register 212 of FIG. 13 is shown in greater detail in FIG. 14. The latch circuit 460 is identical to the latch circuit 340 shown in FIG. 11 except that it includes only a single latch 346, it pulls the input to the first latch 346 high using the PMOS transistor 352, and it uses an inverter 490 in place of a second pass gate 348 and latch 350 in the latch circuit 340 of FIG. 10. In operation, the active low RESET* signal turns ON the transistor 352 to drive the output of the inverter 490 high. In response to the active high S and active low S* signals, a pass gate 344 closes to couple the command bit Y to the output ID after being inverted twice, once by the latch 346 and once by the inverter 490.

The storage register 208 shown in FIG. 3 stores all of the packet words in a command packet after all four of the packet words have been shifted into the shift register 202. However, it will be understood that packet words shifted into a shift register may be transferred to one or more storage registers before all of the packet words of a command packet have been shifted into the shift register. For example, where each command packet contains 4 packet words, the packet words may be transferred to one of two storage registers after only 2 packet words have been shifted into the shift register 202. After the remaining 2 packet words have been shifted into the shift register 202, they can be transferred to either the same storage register or a second storage register (not shown) so that each of 2 storage registers stores respective sets of 2 packet words. Together, the two storage registers would then output a 40-bit command word in the same manner as the storage register 208 in FIG. 3.

Figure 15:
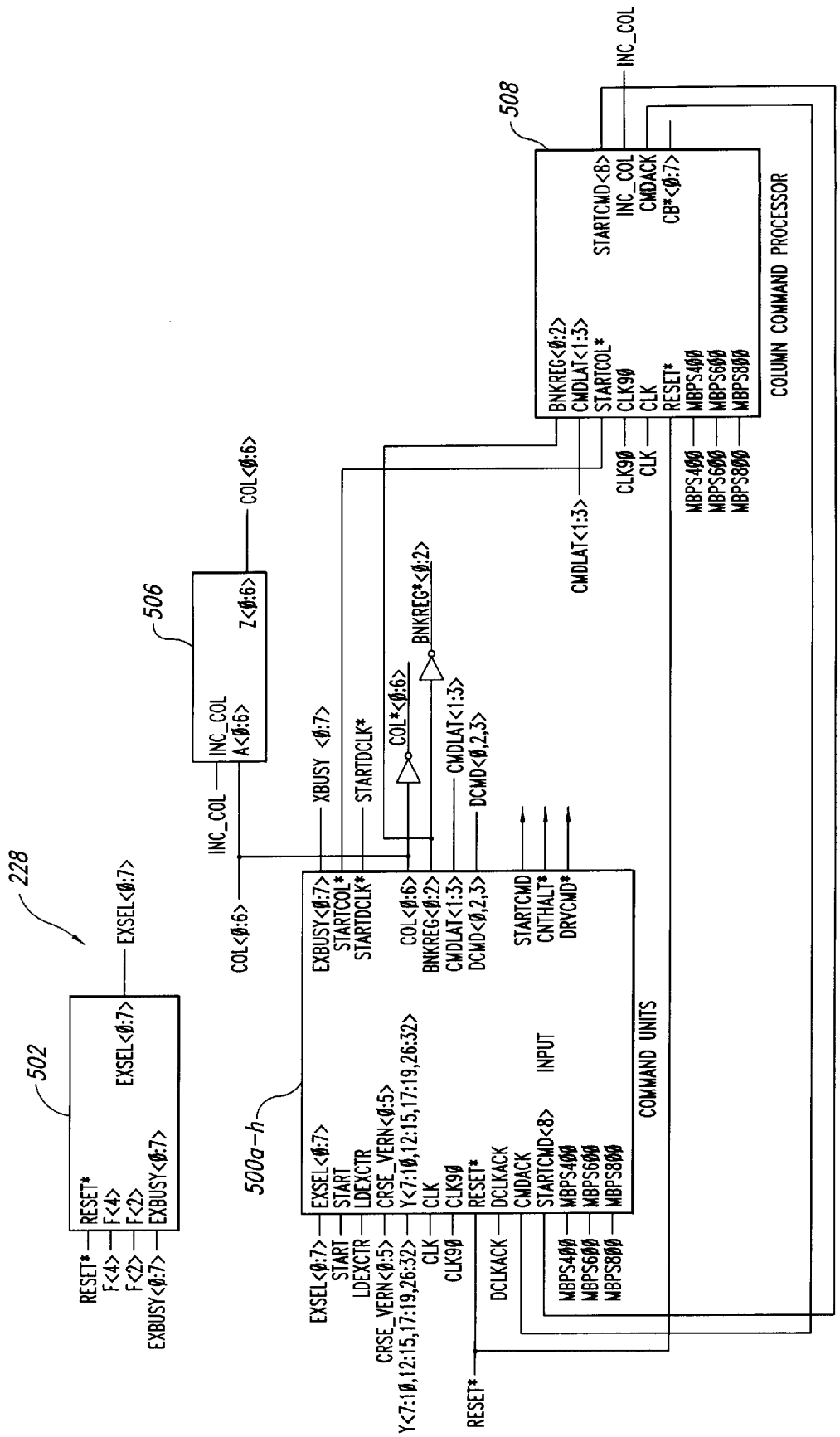
FIG. 15 is a block diagram of an embodiment of a command execution system that may be used in the command generator of FIG. 4.

As explained above with reference to FIG. 4, the command buffer 200 also includes a column command unit 228, a command execution unit 232 and a sequencer. These components are illustrated in greater detail in FIGS. 15–24. With reference to FIG. 15, the column command unit 228 includes eight command units 500 (shown as a single block in FIG. 15), and corresponding command unit selectors 502 (also shown as a single block in FIG. 15). The command units 500 receive bits Y<32:26, 19:17, 15:12, 10:7> of the command word stored in the storage registers 206, 208 (FIG. 4). The command units also receive the coarse vernier signals CRSE_VERN<5:0> from the coarse vernier circuit 331 (FIG. 5), MBPS400–800 signals indicative of the clock speed from elsewhere in the command decoder 200, the clock signals CLK and CLK90, a data clock acknowledge signal DCLKACK, and eight select signals EXSEL<7:0>. As explained below, the EXSEL<7:0> signals enable respective ones of the eight command units 500. The command units 500 generate a seven bit column address COL<6:0> that is applied to a column address processing unit 506. The column address processing unit 506 outputs a column address COL<6:0> that corresponds to an initial column address which may be incremented responsive to an INC_COL signal. Finally, the command units 500 output busy signals EXBUSY<7:0> indicating that a respective one of the command units 500 is busy, and various control signals STARTCOL*, STARTDCLK*, BNKREG<2:0>, CMDLAT<3:1>, DCMD<3,2,0>, STARTCMD<7:0>, CNTHALT*, and DRVCMD* which are used in a manner described below.

The command unit selector 502 controls the storing of command words in each of the command units 500a–h in a manner that prevents a single command word from being stored in more than one command unit 500. As described below with reference to FIG. 18, the command unit selector 502 also prevents a command word from overwriting a command word previously stored in a command unit 500 before the command unit has generated corresponding command signals from the stored command word. Basically, each command unit 500 generates a respective active high EXBUSY<7:0> signal when a command word has been stored in the command unit 500a–h. After command signals have been generated from the stored command word, the EXBUSY<7:0> signals transitions inactive low so that command words may once again be stored in the command unit 500a–h.

The command unit selector 502 controls which of the command units 500a–h store a command word output from the storage registers 206, 208 by issuing an active high EXSEL<7:0> signal to one and only one of the command units 500a–h at a time. The command unit 500a–h receiving the EXSEL<7:0> signal then stores the command word. The command unit selector 502 determines which command unit 500a–h should receive the EXSEL<7:0> signal by examining the BUSY<7:0> signals from all of the command units 500a–h. The command unit selector 502 arranges the command units 500a–h in a hierarchy from the first command unit 500a to store a command word (i.e., none of the command units have yet stored a command word) to the last command unit 500h to store a command word (i.e., all of the other command units 500a–g have already stored a command word). The command unit selector 502 issues an active high EXSEL<7:0> signal to a command word only if its BUSY<7:0> signal is active low and the respective BUSY<7:0> signals for all command units 500 higher in the hierarchy are active high. The selected command unit 500 then receives and processes the command word COMMAND from the storage units 206, 208 as explained in greater detail below.

The column command unit 228 also includes a column command processor 508 that includes the column execution unit 232 and the sequencer 233 of FIG. 4. The column command processor 508 receives the BNKGEG<2:0>, CMDLAT<3:1>, and STARTCOL* signals from the command units 500, as well as the clock signals CLK and CLK90, and clock speed signals MBPS400–800 that are also applied to the command units 500a–h. The column command processor 508 then outputs the INC_COL signal to the column address processing unit 506, and STARTCMD<8>, CMDACK and CB*<7:0> signals to the command units 500a–h. The operation of the command units 500, column address processing unit 506, and the column command processor 508, both individually and in connection with each other, is explained in detail below.

Figure 16A:
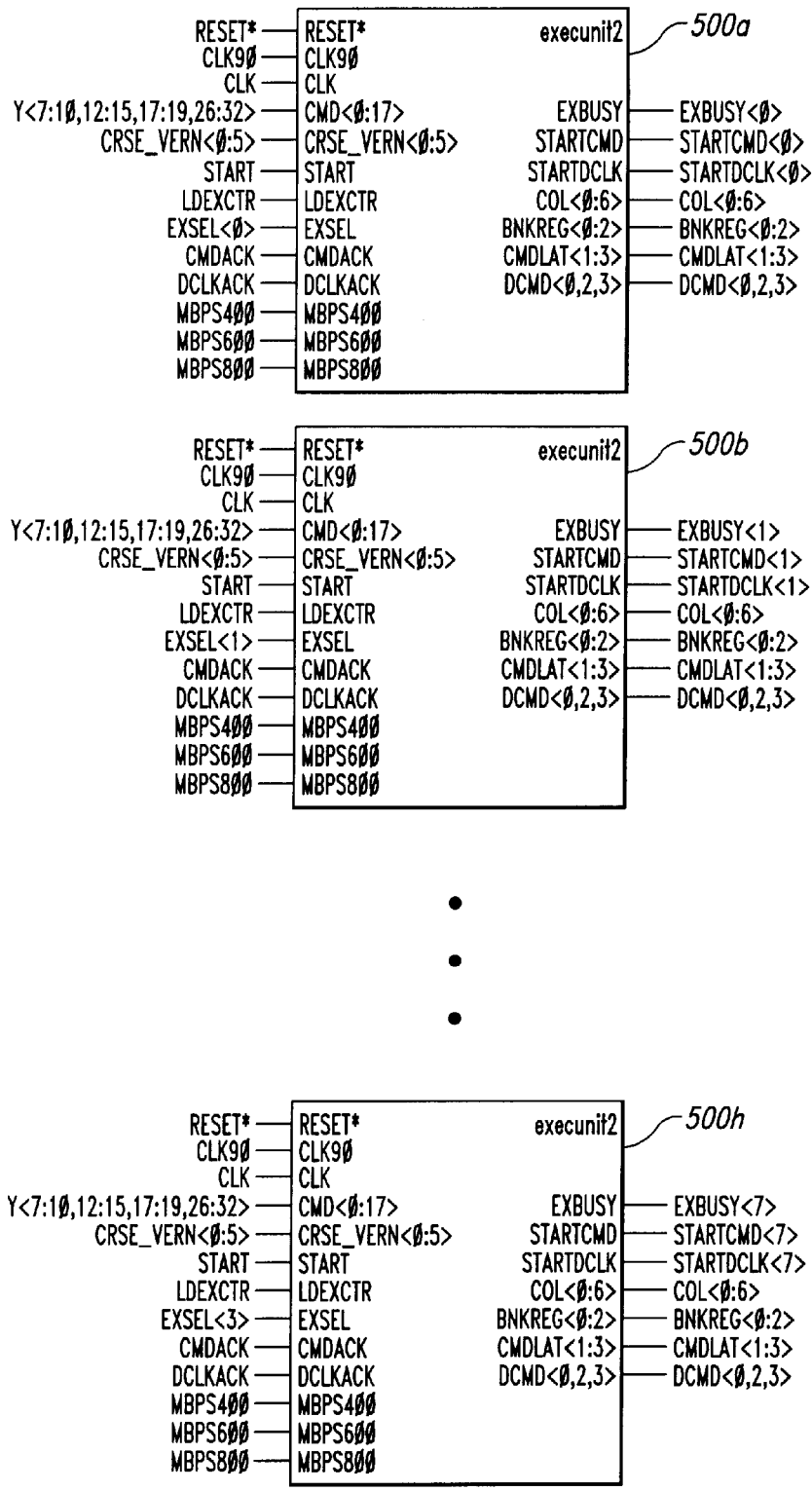
FIG. 16 is a block diagram of command units and other circuitry used in the command execution system of FIG. 15.
Figure 16B:
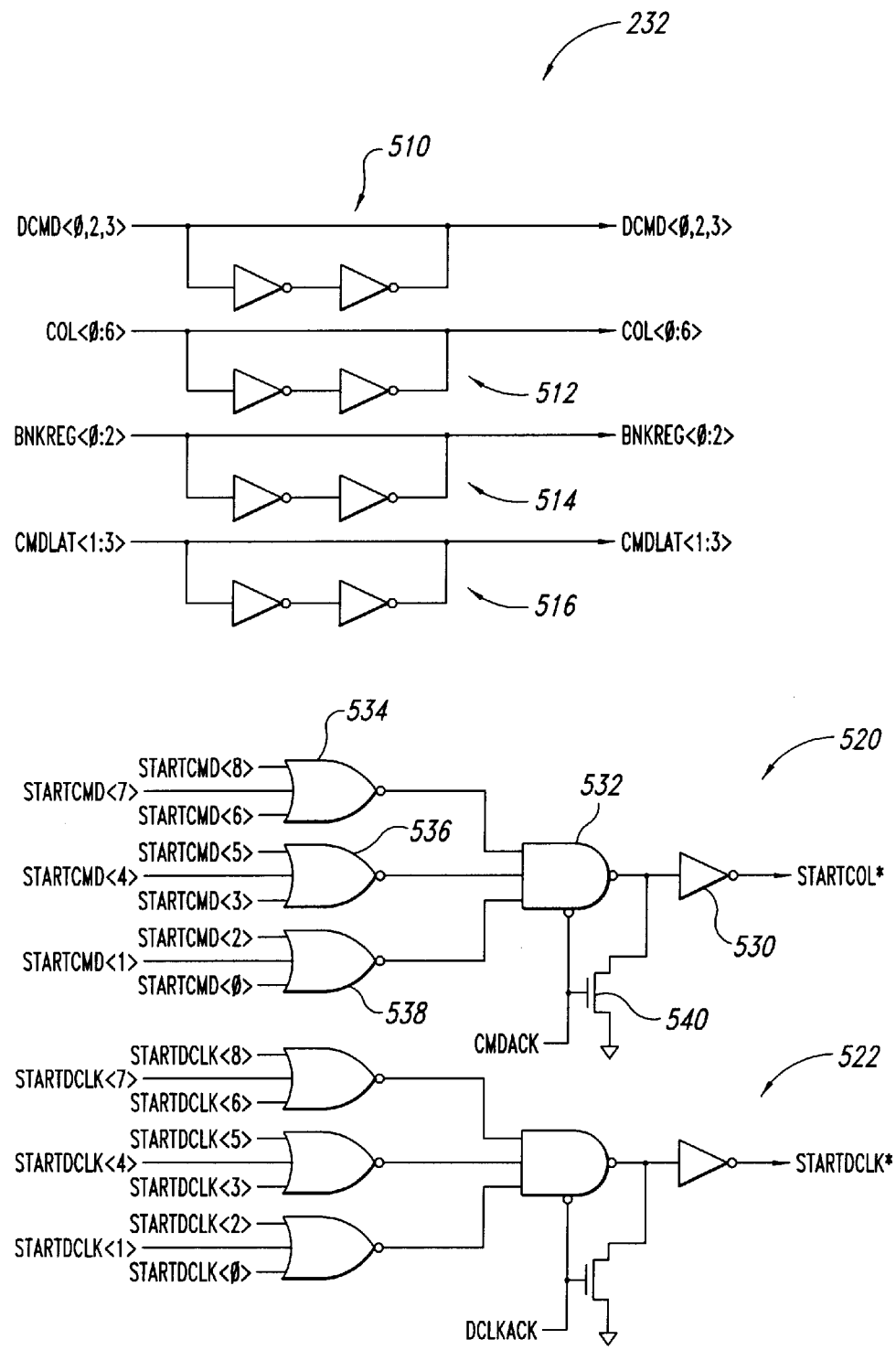

As mentioned above, the command execution unit 232 includes eight identical command units 500a–h. One of these command units 500 is shown in FIG. 16 along with some additional circuitry that is part of the command execution unit 232. Each of the command units 500a–h is capable of storing predetermined portions of the command word Y<39:0> received from the storage registers 206, 208. The stored command words are used to generate a sequence of command signals that cause corresponding functions to be performed in the memory device. The command words may be stored in the command units 500a–h at a faster rate than the memory device 16 is able to perform the corresponding functions. The use of multiple command units 500a–h, each of which stores a respective command word, provides significant advantages to increase the speed of the memory device 16. By using multiple command units 500a–h, the memory device 16 can continue to receive command packets even though the prior command packet has not yet been processed. In fact, the command packets can be received as long as the average rate at which the command packets are received is less than the average time to process the command packets and complete memory transfer operations. As a result, memory devices using the command buffer 200 are able to operate at a relatively high speed.

The command execution unit 232 also includes four latches 510, 512, 514, 516 formed by respective pairs of inverters connected in a loop. The latches 510–516 output respective latched DCMD<3,2,0>, COL<6:0>, BNKREG<0>, and CMDLAT<3:1> signals. The command execution unit 232 also includes a pair of identical logic circuits 520, 522 for generating STARTCOL* and STARTDCLK* signals, respectively. The STARTCOL* signal is generated at the output of an inverter 530 which is, in turn, driven by a NAND gate 532. The NAND gate 532 is driven by three NOR gates 534, 536, 538 each of which receives a respective bit of a STARTCMD<7:0> signal. The NAND gate 532 is enabled by an active low CMDACK signal. When the CMDACK signal is high, a transistor 540 is turned on to force STARTCOL* high. The logic circuit 520 generates an inactive high STARTCOL* signal when all nine bits of STARTCOL<7:0> are in active low. Thus, if one or more bits of STARTCOL<7:0> is active high, STARTCOL* will be active low. Active high STARTCOL<7:0> bits signify the start of a column command by a respective command unit 500a–h. Thus, an active low STARTCOL* signal indicates the start of a column command by one of the command unit 500a–h.

The logic circuit 522 is structurally and functionally identical to the logic circuit 520, and its operation will therefore not be explained in detail. Briefly, the logic circuit 522 generates an inactive high STARTDCKL* signal when all nine bits of STARTDCLK<7:0> are in active low. Thus, if one or more bits of STARTDCLK<7:0> is active high, STARTDCLK* will be active low. The STARTDCLK* signal can also be forced high by DCLKACK being high.

Figure 17:
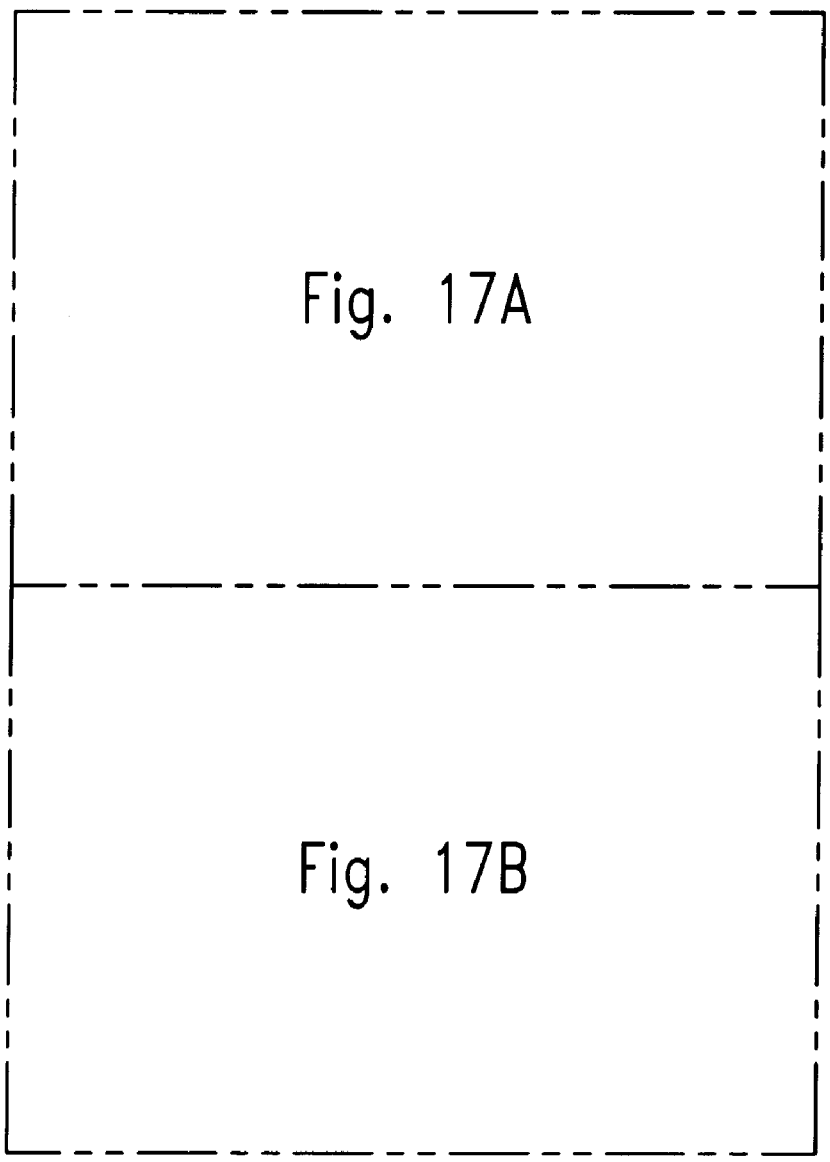
FIG. 17 is a block and logic diagram showing the command units of FIG. 16 in greater detail.
Figure 17:
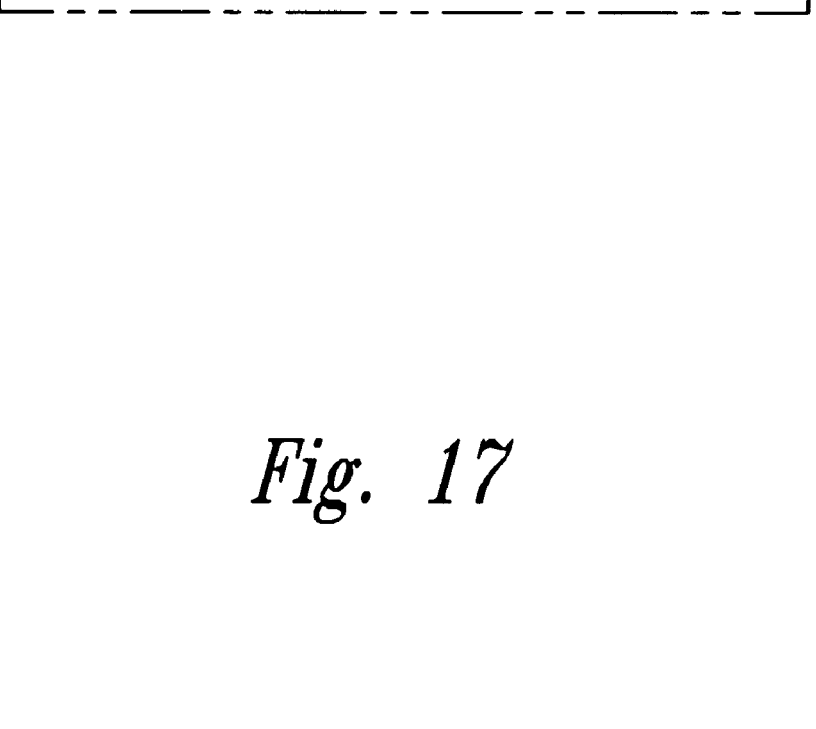
Figure 17A:
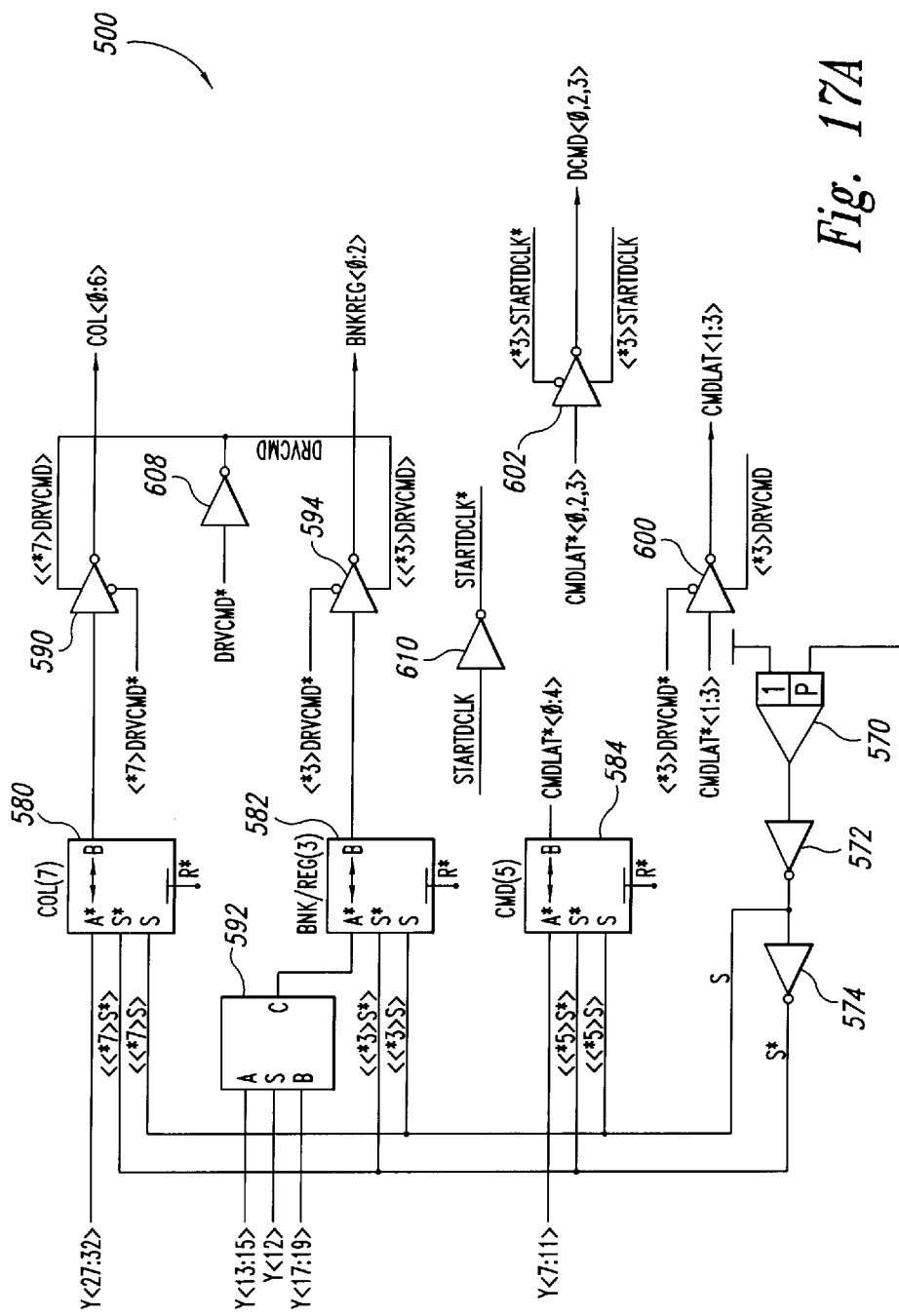
Figure 17B:
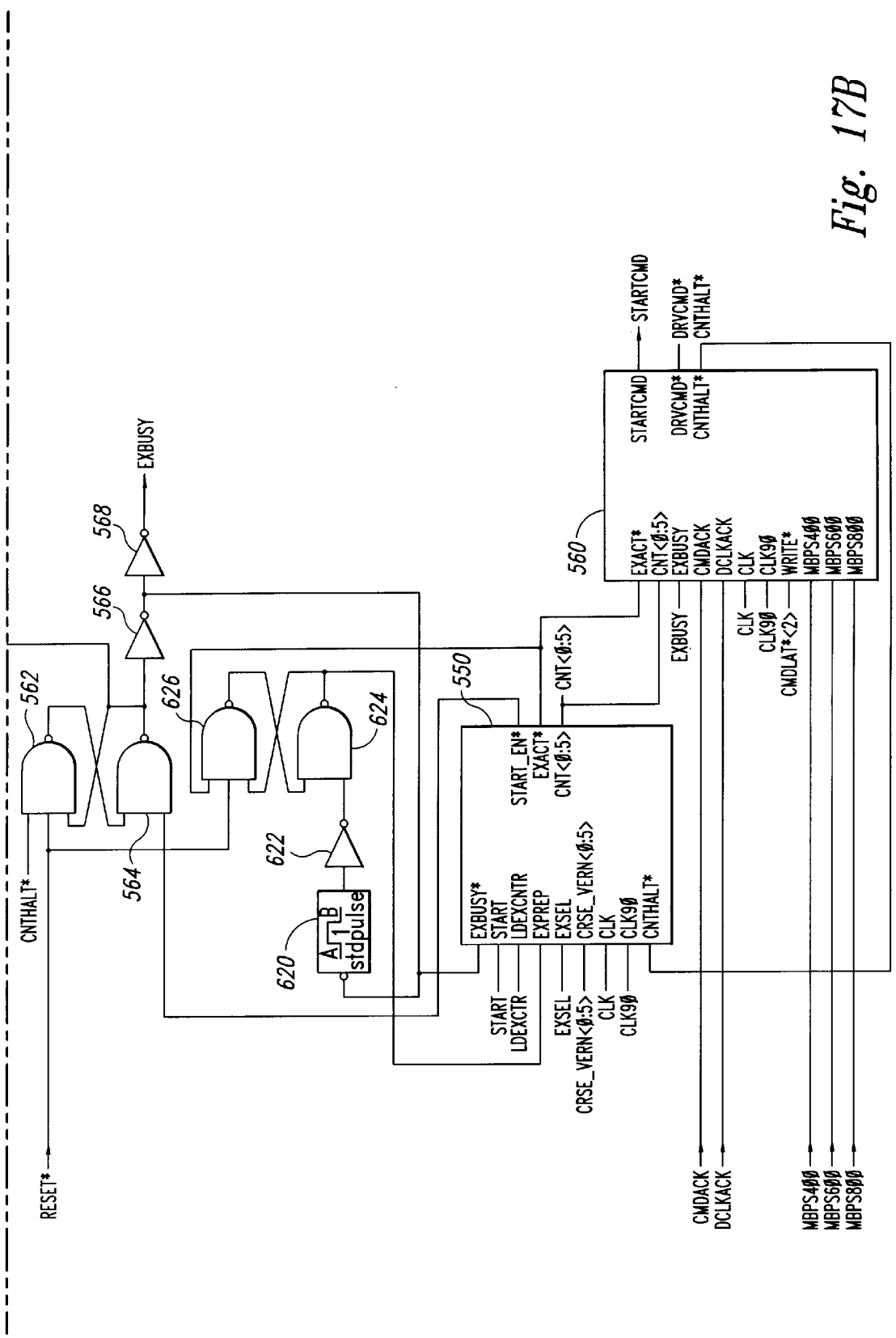

The command units 500a–h are illustrated in greater detail in FIG. 17. As mentioned above, each of the command units 500 includes a counter 550 that is preloaded with the CRSE_VERN<5:0> word responsive to the LDXCTR signal generated by the decoder 210 (FIG. 5). The counter 550 also receives a START signal which is also generated by the decoder 210. The START signal causes the counter 550 to begin decrementing. However, it will also be understood that the counter 550 alternatively can be an incrementing counter. The counter 550 is able to decrement responsive to the CLK and CLK90 signals only if its EXSEL input is high. Whenever the counter 550 starts decrementing, the counter 550 generates a short, active low START_EN* signal. The output of the counter is a 6-bit word CNT<5:0>. The zero terminal count of counter is decoded by a start command generator 560 to generate an active low CNTHALT* signal when the terminal count of the counter 550 is reached, as explained in greater detail below. The CNTHALT* signal causes the counter 550 to stop decrementing and performs other functions explained below. The CNT<5:0> output of the counter 550 is decoded to generate various command signals by other portions of the memory device.

As explained above with reference to FIG. 15, each of the command units 500 also includes a respective command unit selector 502 that generates a respective EXSEL signal responsive to the EXBUSY signals from each of the command units 500. The EXBUSY signal is generated by a pair of NAND gates 562, 564 connected to form a flip-flop. The output of the NAND gate 564 is coupled through two inverters 566, 568 to generate the EXBUSY signal at the output of the inverter 568. The flip-flop formed by the NAND gates 562, 564 is set to generate the active high EXBUSY signal by the START_EN* pulse when the counter 550 starts decrementing. Thus, when the counter 550 is decrementing, the active high EXBUSY signal indicates that the counter 550 is busy decrementing. The flip-flop formed by the NAND gates 562, 564 is reset at power on by an active low RESET* signal. The flip-flop formed by the NAND gates 562, 564 is also reset by the active low CNTHALT* signal generated when the zero terminal count of the counter 560 is reached. As mentioned above, the CNTHALT* signal prevents the counter 560 from decrementing further, and this CNTHALT* signal also terminates the EXBUSY signal to indicate that the counters 560 is no longer busy decrementing.

When the flip-flop formed by the NAND gates 562, 564 is set, the output of the NAND gate 564 triggers a delay circuit 570 which is inverted by a pair of inverters 572, 574 to latch signals applied to various latches 580, 582, 584. The latch 580 stores command word bits Y<32:27> which, after being coupled through a tri-state inverter 590, comprises the column address COL<6:0>. Similarly, the latch 582 stores a bank or register address received from a multiplexer 592 which, after being inverted by a tri-state inverter 594, is output as a bank address BNKREG<2:0>. The bank address is Y<15:13>, and it is used to select one of the eight memory banks for a memory access. The multiplexer 592 selects either Y<15:13> or Y<19:17> as the bank address BNKREG<2:0> depending upon the state of the Y<12> command word bit. Finally, the command word bits Y<11:7> are stored in the latch 584 to generate a latched command word CMDLAT*<4:0>. Bits 1–3 are CMDLAT<4:0> are applied to a tri-state inverter 600 as CMDLAT*<3:1> to generate a CMDLAT<3:1> output. Similarly, CMDLAT* bits <3, 2, 0> are applied to a tri-state inverter 602 to generate a DCMD<3, 2, 0> output. The tri-state buffers 590, 594, and 600 are switched between their active and high impedance states by the DRVCMD* signal and its compliment DRVCMD generated at the output of an inverter 608 to which a DRVCMD* signal is applied. The DRVCMD* signal is generated by the start command generator 560 as explained below. Similarly, the tri-state buffer 602 is switched between its active and high impedance states by the STARTDCLK signal and its compliment STARTDCLK* which is generated at the output of an inverter 610 to which a DRVCMD signal is applied.

When the EXBUSY signal transitions inactive low, the low-to-high transition at the output of the inverter 566 triggers a pulse generator 620 that causes a pulse to be generated at the output of an inverter 622. The pulse at the output of the inverter 622 sets a flip-flop formed by a pair of NAND gates 624, 626. As a result, an active high EXPREP signal is generated at the output of the NAND gate 624 which is used in a manner explained below. The flip-flop formed by the NAND gates 624, 626 is reset by either the active low RESET* signal or an active low EXACT* signal generated by the counter 550.

Figure 18:
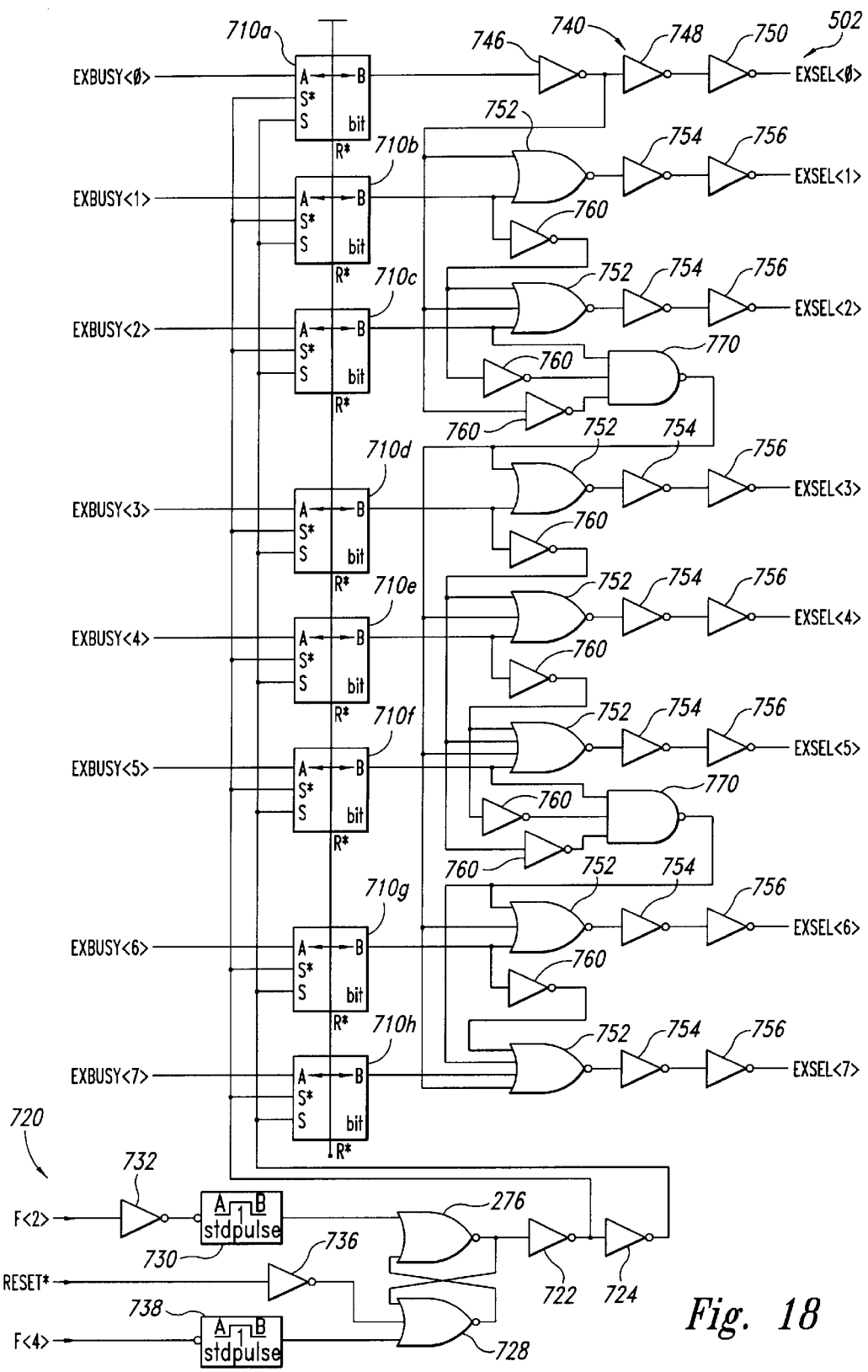
FIG. 18 is a logic diagram showing the command unit selector of FIG. 15.

The command unit selector 502 (FIG. 15) generating the EXSEL<7:0> signals responsive to the EXBUSY<7:0> signals for controlling the operation of the counters 550 is illustrated in FIG. 18. As explained above, the command unit selector 502 examines respective BUSY signals from each of the command units 500 to generate respective EXSEL signals to control the storing of command words in each of the command units 500. As a result, the command unit selector 502 prevents a single command word from being stored in more than one command unit 500, and it prevents a command word from prematurely overwriting a previously stored command word. As also mentioned above, the command unit selector 502 performs these functions by arranging each of the command units, and their respective EXBUSY signals, in a hierarchy.

The command unit selector 502 includes a respective latch 740 corresponding to each command unit 500a–h that is operated by a latch control circuit 720. Each of the latches 710 store a respective EXBUSY signal when the output of an inverter 722 goes high and the output of an inverter 724 goes low. This condition will occur whenever a flip-flop formed by NOR gates 726, 728 is set by a pulse generated by a pulse generator 730. The pulse generator 730 is triggered by a negative going transition at the output of an inverter 732 which receives the F<2> signal at its input. The F<2> signal is generated by the shift register circuit 246 (FIG. 5) on the third CLK signal transition after the FLAG signal is received by the shift register circuit 246. Thus, when the F<2> signal is generated, the EXBUSY signals are stored in their respective latches 710. The flip-flop formed by the NOR gates 726, 728 is reset by either the negative going power-on reset signal RESET* coupled through an inverter 736 or a pulse from pulse generator 738 which occurs responsive to the F<4> signal one clock period after the F<2> signal. The EXSEL<7:0> signals are therefore stable during the time that the F<3> signal is active, i.e., between the F<2> signal going high and the F<4> signal going high. It is during this time that an available command unit 500 is selected, and loaded with a command word, and then enabled. When F<4> goes high, the EXSEL output of the selected command unit 500 goes high to indicate that the selected command unit is busy. In summary, the busy status of the command units 500 is frozen at F<2>, an available command unit 500 is selected, loaded and enabled at F<3>, and the busy status of the selected command unit is indicated at F<4>.

The remainder of the command unit selector 502 comprises a logic circuit 740 which arranges the EXBUSY signals from respective command units 720 in a hierarchy as explained above. The EXBUSY<0> signal has the highest hierarchy while the EXBUSY<7> signal has the lowest hierarchy. In other words, the command unit 500 receiving the EXSEL<0> signal will store a command word before any other command unit 500, and the command unit receiving the EXSEL<7> signal will not store a command word until all of the other command units 500 have stored a command word. The logic circuit 740 generating the EXSEL<0> output includes three inverters 746, 748, 750. The logic circuit 740 generating all other EXSEL signals includes a NOR gate 752 and a pair of inverters 754, 756. Inverters 760 couple the output of respective latch circuit 710 to NOR gates 752 having a lower hierarchy for reasons that will be explained below.

It will be apparent from FIG. 18 that the active high EXSEL<0> signal is generated whenever an inactive low EXBUSY<0> signal is stored in the latch 710a. Thus, as long as the command unit 500a generating the EXBUSY<0> signal is not busy counting, a high EXSEL<0> signal will be generated to cause the command unit 500a to store a command word. The output of the inverter 746 is coupled to the NOR gates 752 to prevent EXSEL<7:1> signals from being active even if their respective busy input signals EXBUSY<7:1> are inactive low. More specifically, a low EXBUSY<0> signal at the output of the latch 710a will cause the output of the inverter 746 to be high. The high at the output of the inverter 746 will disable the NOR gates 752 to which it is coupled, thereby preventing the EXSEL<2: 1> signals from going high. The output of the inverter 746 is coupled through an inverter 760 to a NAND gate 770 so that the high at the output of the inverter 746 will cause the NAND gate 770 to output a high. The high at the output of the NAND gate 770 disables the remaining NOR gates 752 for the EXSEL<7:3> signals. Thus, whenever the EXBUSY<0> signal is low, an active high EXSEL<0> signal is generated, and the EXSEL<7:1> signals are forced inactive low.

If the EXBUSY<0> signal is active high, then the inverter 746 outputs a low. The low at the output of the inverter 746 enables all of the NOR gates 752, either directly or through the NAND gate 770. However, an active high EXSEL<N> signal can be generated responsive to an inactive low EXBUSY<N> signal only if the EXBUSY<N+1> signals that are higher in the hierarchy are active high. For example, if the EXBUSY<4> signal is inactive low, an active high EXSEL<4> signal will be generated only if the NAND gate 752 generating the EXBUSY<4> signal is enabled. The NAND gate 752 will be enabled only if the latched EXBUSY<3> signal is active high and the output of the NAND gate 770 is low responsive to the EXBUSY<2:0> signals being active high. If an EXSEL<4> signal is generated from the inactive low EXBUSY<4> signal, then the high at the output of its latch 410e is coupled through the inverter 760 to disable all of the NAND gates 752 having a lower hierarchy. In this manner, the command unit selector 502 ensures that each command word is stored in one and only one command unit 500 and that a command word does not overwrite a stored command until its respective EXBUSY signal goes inactive low. As mentioned above, the EXBUSY signal for a command unit 500 goes inactive low responsive to the CNTHALT* signal when the counter 550 has decremented to the terminal count.

The looping nature of the EXBUSY and EXSEL signals (i.e., the EXSEL signal controls the EXBUSY signal, and the EXBUSY signal controls the EXSEL signal, etc.) makes it important to control the time at which the EXSEL signals are generated. Basically, the timing circuit 720 freezes the status of the EXBUSY signals when the F<2> signal is generated. Shortly after the F<2> signal, the F<3> signal is generated, during which time one of the EXSEL outputs from the command unit selector 502 will go active high to load and enable a command unit 500. As explained above, on the next transition of the CLK signal at F<4>, the START signal is generated to cause the counter 550 to begin decrementing. The F<4> signal also unfreezes the latches 720 by resetting the flip-flop formed by the NOR gates 726, 728. As a result, race conditions in which the transient nature of the signals cause two command units 500 to store the same command word or cause a command word to overwrite another command word are prevented.

The structure and operation of the counter 550 will now be explained with reference to FIG. 19. The counter 550 is a 6-stage quadrature counter that decrements from an initial preloaded count to 0 responsive to the clock signals CLK0, CLK0*, CLK1, CLK1* produced by the control circuit 205 (FIG. 5) as explained above. However, the principles described herein are equally applicable to counters having a larger or smaller number of stages and to incrementing counters, rather than decrementing counters.

The counter 550 includes six registers 800a–f each of which provides a respective one of the six bits of the count CNT<5:0>. Each of the registers outputs a signal that is the compliment of its input responsive to predetermined combinations of the clock signals CLK0, CLK0*, CLK1, CLK1* that occur each clock period. Registers having these characteristics are conventional and will therefore not be explained in detail.

In a conventional counter formed by a series of registers, each register responds to transitions of the immediately preceding register. Before each register can transition, all of the preceding registers must sequentially transition. For example, for a transition of the third least significant bit, the least significant bit transitions first and causes a transition of the second least significant bit, which in turn causes a transition of the third least significant bit. One skilled in the art will recognize that the transition of the least significant bit must "ripple" through the registers to cause a transition of the most significant bit. Since each register imposes a delay, the third least significant bit in the counter is delayed by the delay of the two preceding registers.

Unlike a conventional counter, each of the registers 800b–f in the counter 500, except the first register 800a, feeds its output forward to successive registers 800b–f through respective logic circuits 804b–f. Each logic circuit logic circuit 804b–f can then determine when all of the preceding bits are "0" and enable its corresponding register 800b–f to transition during the next clock cycle. Because the preceding bits bypass any interceding registers 800b–f, it is not necessary for signal transitions to ripple through each of the registers 800b–f in sequence.

Figure 19A:
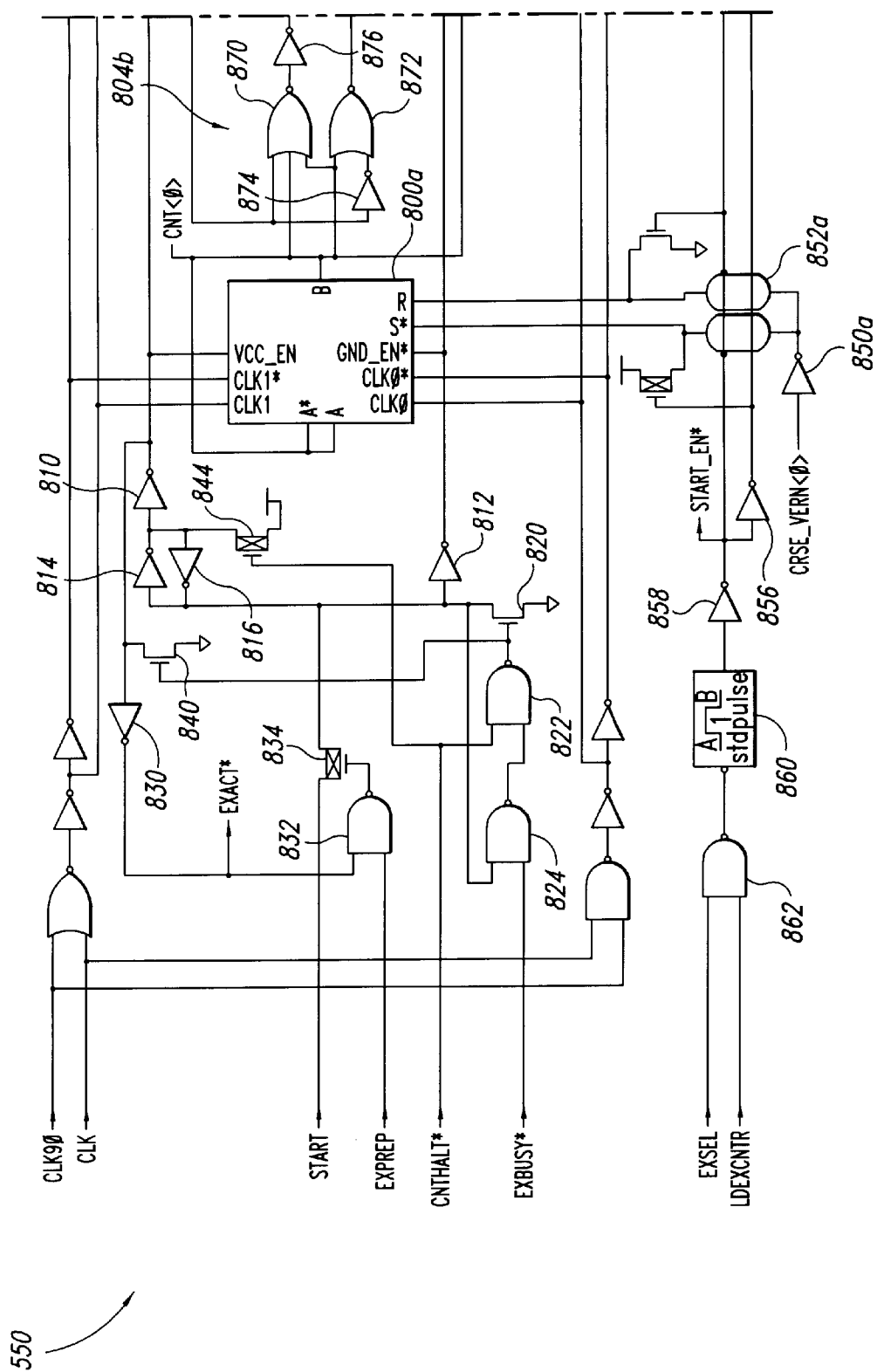
FIG. 19 is a logic diagram showing a counter used in the command unit of FIG. 17.
Figure 19B:
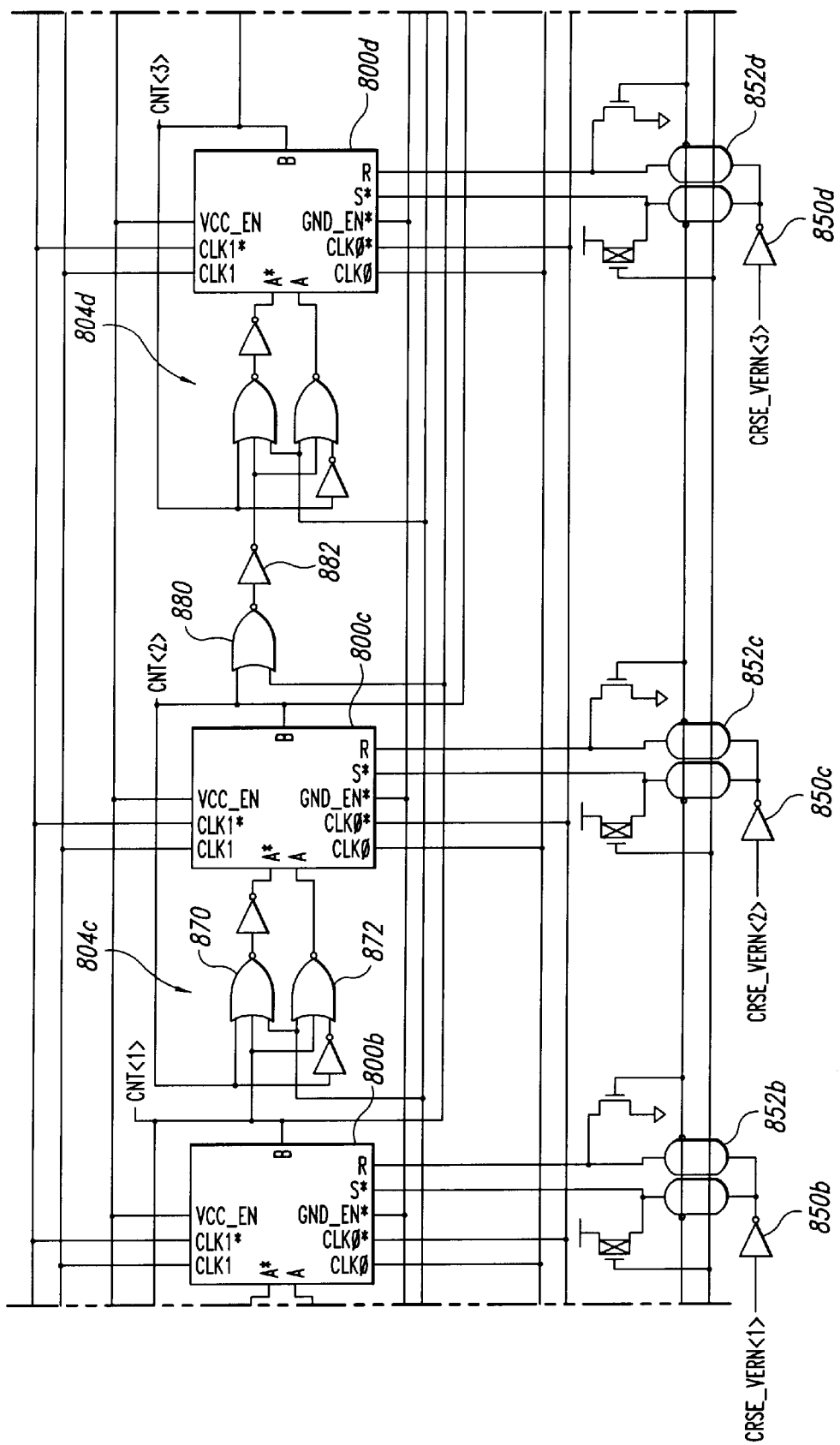
Figure 19C:
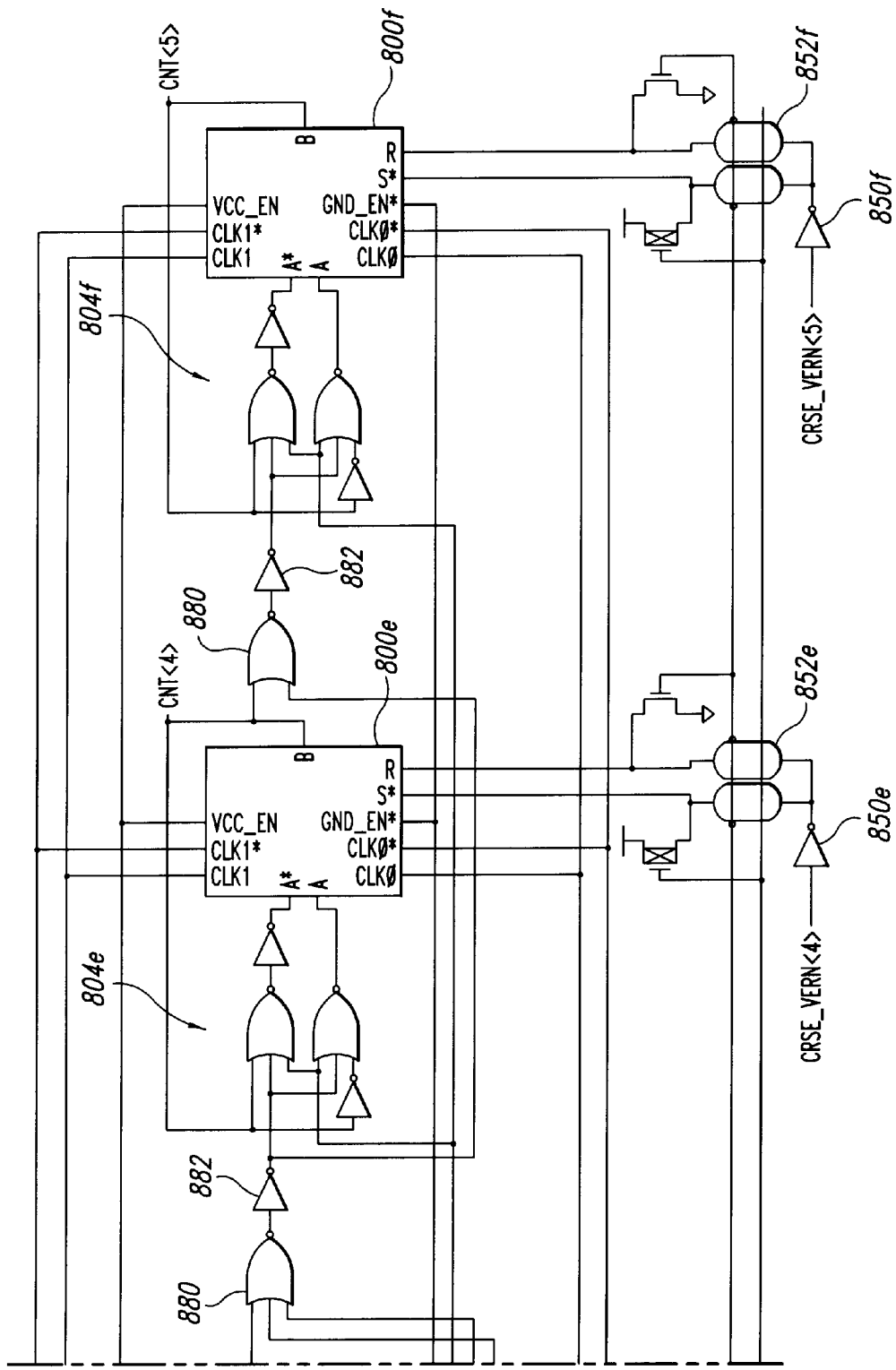

With further reference to FIG. 19, the registers 800a–b receive power at the output of an inverter 810, and also receive ground potential at the output of inverter 812. The inverter 810, in turn, is driven by a latch formed by a pair of inverters 814, 816. The inverters 812, 814 are coupled to the drain of an NMOS transistor 820. The gate of the NMOS transistor 820 is driven by a NAND gate 822 which receives the output all of a NAND gate 824 and the CNTHALT* signal. The CNTHALT* signal will be high whenever the counter 550 is enabled to count, thus enabling the NAND gate 822. When the NAND gate 824 detects an active low EXBUSY* signal, the NAND gate 824 outputs a high that causes the NAND gate 822 to output a low, thereby turning off the transistor 820. Prior to enabling the counter 550, the output of the inverter 810 is low thereby causing an inverter 830 to output a high that enables a NAND gate 832. Since the EXPREP signal is also high at that time, the NAND gate 832 outputs a low that turns on a PMOS transistor 834. Therefore, when the START signal goes high, the output of the inverter 810 goes high to supply power to the registers 800a–f. The START signal also causes the output of the inverter 812 to output a low, thereby coupling the ground terminal of the registers 800a–f to ground. The inputs to the inverters 812, 814 thereafter remain high because the inverter 816 continues to output a high since it forms a latch with the inverter 814. Thus, the registers 800a–f will be coupled to power and ground responsive to the START signal as long as the EXBUSY* signal is active low.

When the EXBUSY* signal goes inactive high, the NAND gate 824 outputs a low thereby causing the NAND gate 822 to output a high. The high at the output of the NAND gate 822 turns on the transistor 820, thereby pulling the inputs to the inverters 812, 814 low. The output of the inverter 810 then goes low to remove power from the registers 800a–f, and the output of the inverter 812 goes high to remove ground potential from the registers 800a–f. The low produced by the ON transistor 820 is fed back to the NAND gate 824, which then outputs a high to cause the NAND gate 822 to output a low. The transistor 820 then turns OFF. However, the inputs to the inverters 812, 814 remain low because the latched inverter 816 continues to output a low. The high at the output of the NAND gate 822 that turns ON the transistor 820 also turns ON a transistor 840. As a result, the input to the inverter 830 is pulled low thereby causing the inverter 830 to apply a high to the NAND gate 832. The NAND gate 832 then outputs a low to turn ON the PMOS transistor 834.

The registers 800a–f are also decoupled from power and ground when the CNTHALT* signal goes active low responsive to the terminal count of the counter 550 being reached. When the CNTHALT* signal goes low, it causes the output of the NAND gate 822 to output a high, thereby turning ON the transistor 820 and pulling the inputs to the inverters 812, 814 low, as explained above. The low CNTHALT* signal also turns ON a PMOS transistor 844 to pull the input to the inverter 810 high, thereby causing the inverter 810 to output a low.

As mentioned above, the counter 550 is pre-loaded to a value corresponding to a coarse vernier word CRSE_VERN<5:0> prior to beginning its count. Each bit of the coarse vernier word CRSE_VERN<5:0> is applied through a respective inverter 850a–f to a respective pass gate 852a–f. The multiplexers 852a–f are enabled by a high at the output of inverter 856 and a low at the output of an inverter 858 which occurs responsive to a pulse from a pulse generator 860. The pulse generator 860 generates a pulse responsive to being triggered by a low at the output of a NAND gate 862. The NAND gate 862 triggers the pulse generator 860 responsive to the LDEXCNTR pulse whenever the NAND gate 862 is enabled by a high EXSEL signal. As explained above, the EXSEL signal is high to enable the counter 550. Thus, when the counter 550 is enabled by the EXSEL signal, the registers 800a–f are preloaded with the coarse vernier word CRSE_VERN<5:0>. The coarse vernier word CRSE_VERN<5:0> is generated by other circuitry as described in U.S. patent application Ser. No. 08/933,324, which is incorporated herein by reference.

As also mentioned above, the registers 800b–f receive inputs coupled through respective logic circuits 804b–f. The first register 800a that generates the least significant bit CNT<0> receives its input from the output of the register 800a. Thus, the output of the register 800a toggles each clock period. The logic circuit 804b includes a pair of NOR gates 870, 872. The output of the register 800b is applied to the NOR gate 870 directly into the input of the NOR gate 872 through an inverter 874. Thus, the NOR gates 870, 872 are alternately enabled by the output of the register 800b. As a result, a low generated at the output of the register 800a is alternately coupled through the NOR gate 870 and the NOR gate 872. The low at the output of the register 800a is coupled to the A input of the register 800b as a high, while the low at the output of the register 800a is coupled to the A* input of the register 800b through in inverter 876 as a low. As a result, the register 800b toggles with each low generated at the output of the register 800b.

The logic circuit 804c operates in essentially the same manner as the logic circuit 804b except that its NOR gates 870, 872 receive outputs from all previous registers, i.e., registers 800a,b. As a result, is not necessary for a high-to-low transition at the output of the register 800a to be coupled through the register 800b before it reaches the register 800c.

The logic circuits 804d–f operate in essentially the same manner as the logic circuits 804b,c except that they include a NOR gate 880 and an inverter 882 to combine outputs from the immediately preceding register and upstream registers.

Figure 20:
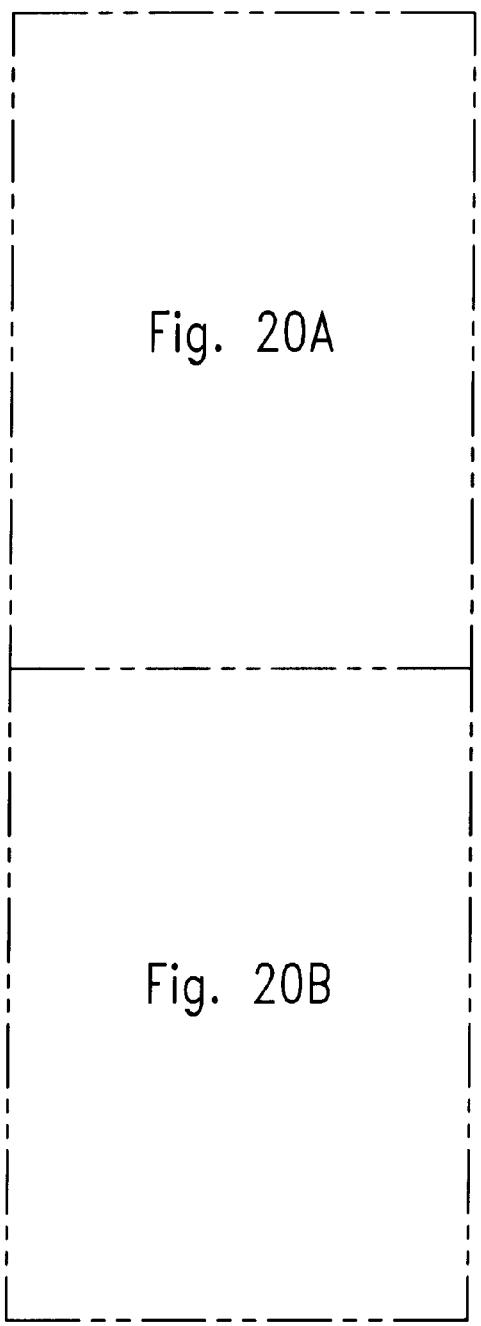
FIG. 20 is a logic diagram of the start command generator used in the command unit of FIG. 17.
Figure 20A:
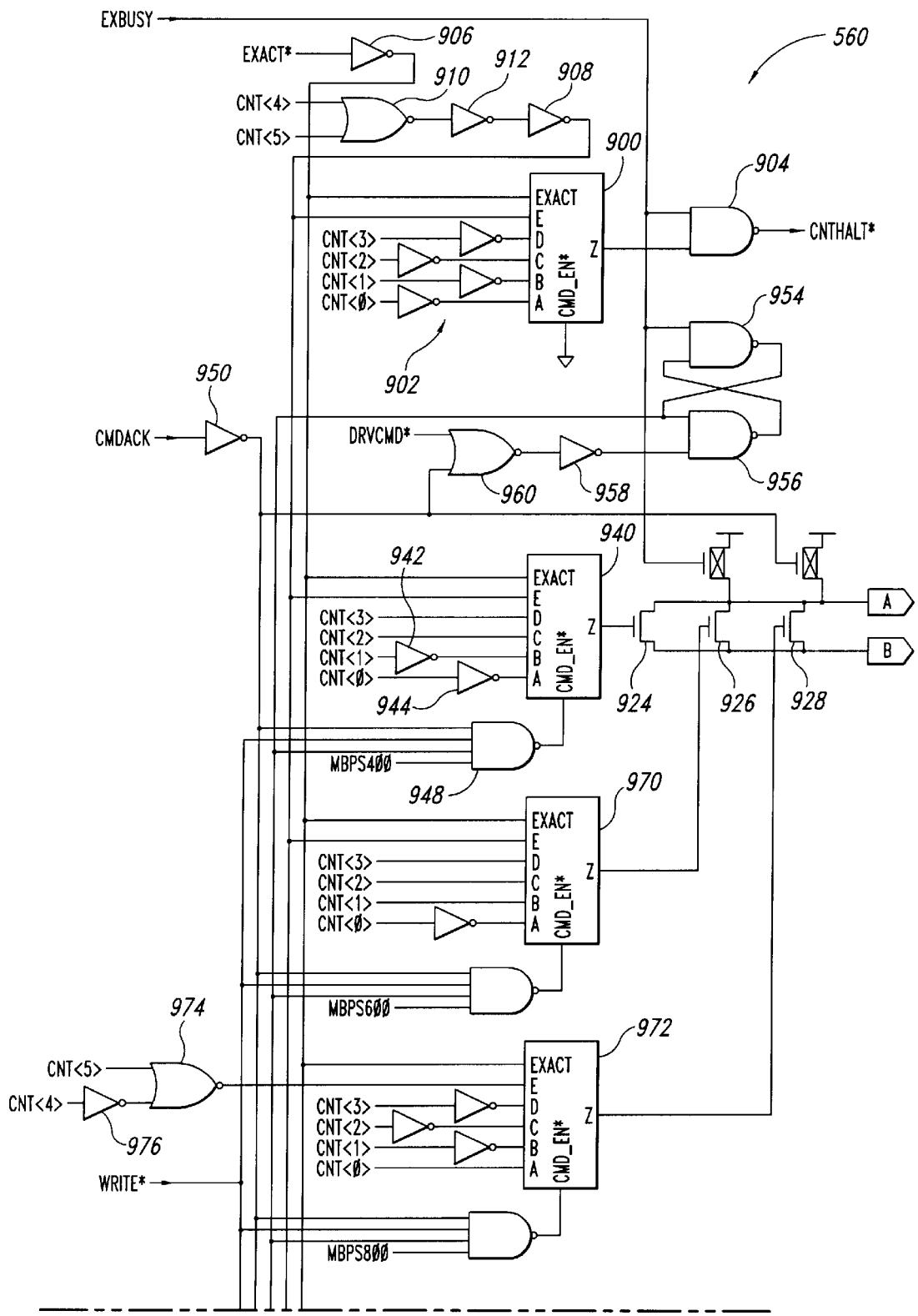
Figure 20B:
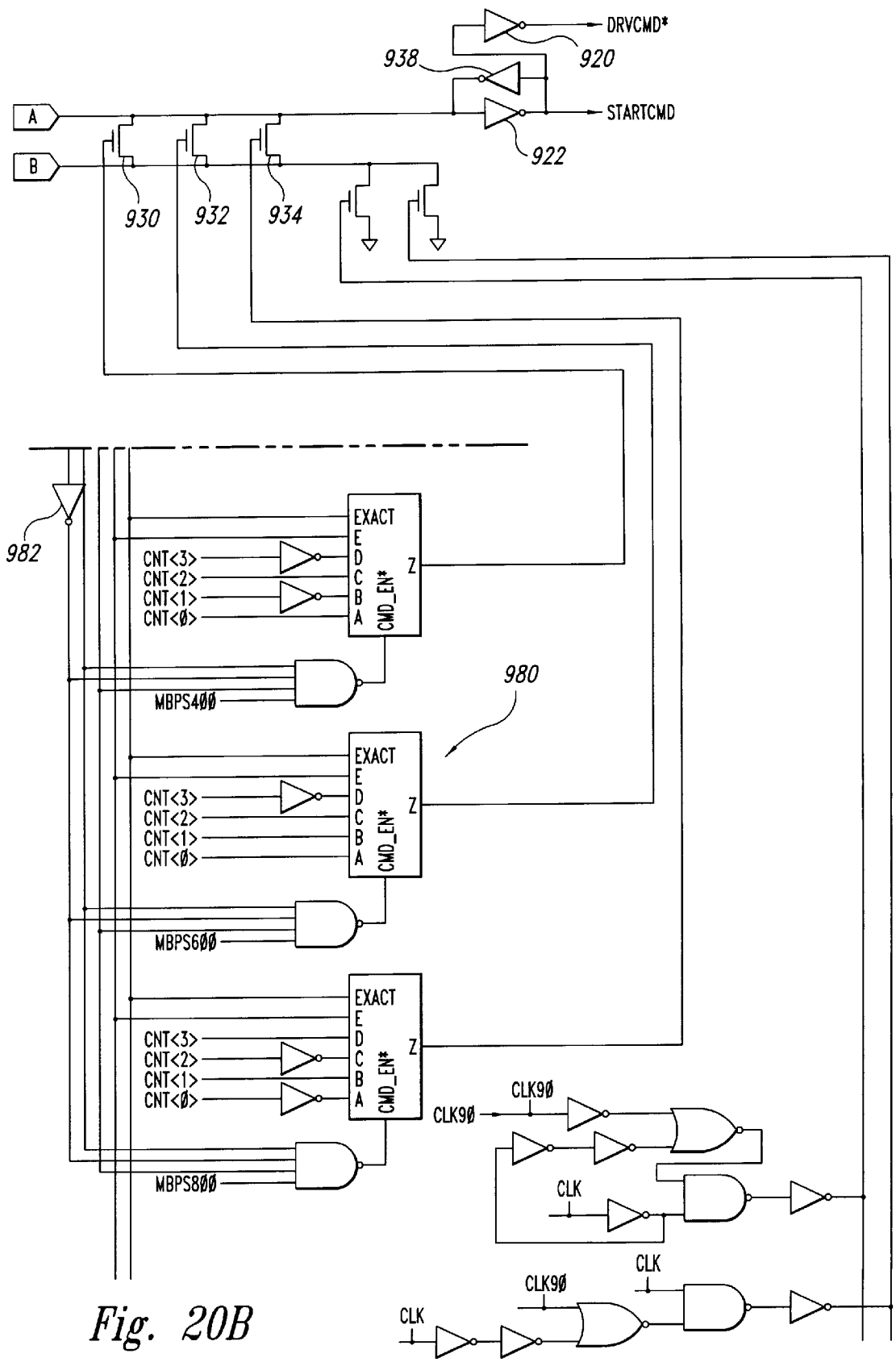

The start command generator 560 (FIG. 17) is illustrated in greater detail in FIG. 20. The basic function of the start command generator 560 is to generate various commands, namely CNTHALT*, DRVCMD*, and STARTCMD, at the proper time depending upon the frequency of the clock signals CLK and CLK90. The timing of these commands if a function of clock speed. For example, the commands are generated earlier at higher clock speeds to allow the memory device containing the command buffer more clock cycles to complete the various operations corresponding to the commands. As explained above with reference to FIG. 19, the CNTHALT* signal prevents the clock 550 from continuing to decrement when the "000000" terminal count of the counter 550 is reached. The DRVCMD* signal is used to generate a command in the command unit 500 (FIG. 17) containing the start command generator 560, and the STARTCMD signal is used to start a column command as explained below.

The "000000" terminal count of the counter 550 is detected by a multiple input AND gate 900 that receives the compliment of the four least significant bits of the count CNT<3:0>. The compliment of CNT<3:0> is generated by applying CNT<3:0> to respective inverters, indicated generally at 902. The AND gate 900 also receives the output of an inverter 908, which is high whenever the output of an inverter 912 is low. The output of the inverter 912 will be low whenever the CNT<4> and CNT<5> inputs to a NOR gate 910 are both low. Thus, all of the inputs to the NOR gate 900 will be high when CNT<5:0> are all low. The AND gate 900 will then generate a high as long as it is enabled by a high at the output of an inverter 906 whenever EXACT* is active low. When the terminal count of the counter 950 is reached, the AND gate 900 thus outputs a high that is detected by a NAND gate 904, which is normally enabled by a high EXBUSY signal when the counter 550 corresponding to the start command generator 560 is decrementing. Thus, when the terminal count is reached, the CNTHALT* signal goes active low.

The remainder of the start command generator 560 shown in FIG. 20 generates the DRVCMD* and STARTCOMD signals at the proper time depending upon the clock frequency. The start command generator 560 then waits for the CMDACK signal acknowledging that a command has been received by downstream circuitry described below.

The DRVCMD* signal at the output of an inverter 920 will go low whenever the STARTCMD signal goes high. The STARTCMD signal at the output of an inverter 922 goes high whenever its input is pulled low by any one of six NMOS transistors 924–934 turning ON. The high at the output of the inverter 922 is then latched by an inverter 938. Thus, the DRVCMD* and STARTCMD signals are generated responsive to any one of the transistors 924–934 turning ON.

The NMOS transistor 924 will turn ON responsive to the output of an AND gate 940 going high. The AND gate 940 receives the four least significant bits CNT<3:0> of the counter 550, two of which CNT<1:0> are inverted by inverters 942, 944. The AND gate 940 also receives the output of the inverter 908 which, as explained below, is high whenever CNT<5:4> are both high. Thus, the AND gate 940 decodes a "001100" count of the counter 550, i.e., count 12. The AND gate 940 is enabled by a low at the output of a NAND gate 948 which occurs whenever all of the inputs to the NAND gate 948 are high. The NAND gate 948 normally receives a high at the output of an inverter 950, since the CMDACK signal is normally low until a command initiated by the start command generator 560 is acknowledged by downstream circuitry, as explained above. The NAND gate 948 also receives the WRITE* signal, which is inactive high for read operations. The NAND gate 948 also receives the output of a flip-flop formed by a pair of NAND gates 954, 956. The flip-flop is initially set by EXBUSY being low prior to the time that the counter 550 begins decrementing. The flip-flop is reset responsive to a low at the output of an inverter 958, which occurs when a NOR gate 960 is enabled by a low DRVCMD* signal and CMDACK goes active high. Finally, the NAND gate 948 receives the MBPS400 signal indicative of a 400 MHz clock frequency. Thus, the transistor 924 turns ON at count 12 of the counter 550 during a read operation at a 400 MHz clock frequency.

Similarly, the transistor 926 will turn ON responsive to a high from an AND gate 970, which occurs when the NOR gate 970 decodes a count CNT<5:0> of "001110", i.e., count 14 of the counter 550, during a read operation at a clock frequency of 600 MHz. The transistor 928 will turn ON responsive to a high at the output of an AND gate 972. The AND gate 972 receives CNT<0>, the compliment of CNT<3:1>, and the output of a NOR gate 974. The NOR gate 974 receives CNT<5> and the compliment of CNT<4> through an inverter 976. The output of the NOR gate 974 thus goes high when CNT<5:4> are "01". Thus, the AND gate 972 decodes a count CNT<5:0> of "010001", i.e., count 17 of the counter 550, during a read operation at a clock frequency of 800 MHz. It can therefore been seen that STARTCMD will go high in a read operation at a time corresponding to the clock speed designated by the MBPS signals, with a higher clock speed causing the STARTCMD signal to be generated earlier in the count-down and a lower clock speed causing the STARTCMD signal to be generated later in the count-down. By generating the STARTCMD signal earlier at higher clock speeds, the memory device has more clock cycles to respond to commands so that the time allotted to process commands is relatively uniform regardless of the clock speed.

The start command generator 560 includes additional circuitry that is structurally and functionally identical to the above-described circuitry except that the AND gates in the circuitry 980 receive the compliment of WRITE* at the output of an inverter 982 rather than WRITE*, and they decode different counts of CNT<5:0>. Thus, in the interest of brevity, this additional circuitry will not be explained in detail. Since the AND gates are enabled by a high compliment of WRITE*, the AND gates in the circuitry 980 cause the STARTCMD signal to be generated at counts of the clock corresponding to respective clock speeds. Specifically, for write operations, the STARTCMD signals will be generated at count 5 of the counter 550 for a 400 MHz clock frequency, at count 7 of the counter 550 for a 600 MHz clock frequency, and at count 10 of the counter 550 for an 800 MHz clock frequency. These counts of 5, 7 and 10 for a write operation occur later than counts 12, 14 and 17 for a read operation since a read operation requires more time than a write operation, thereby requiring that the STARTCMD signal for a read operation be generated earlier, i.e., at a higher count.

Figure 21:
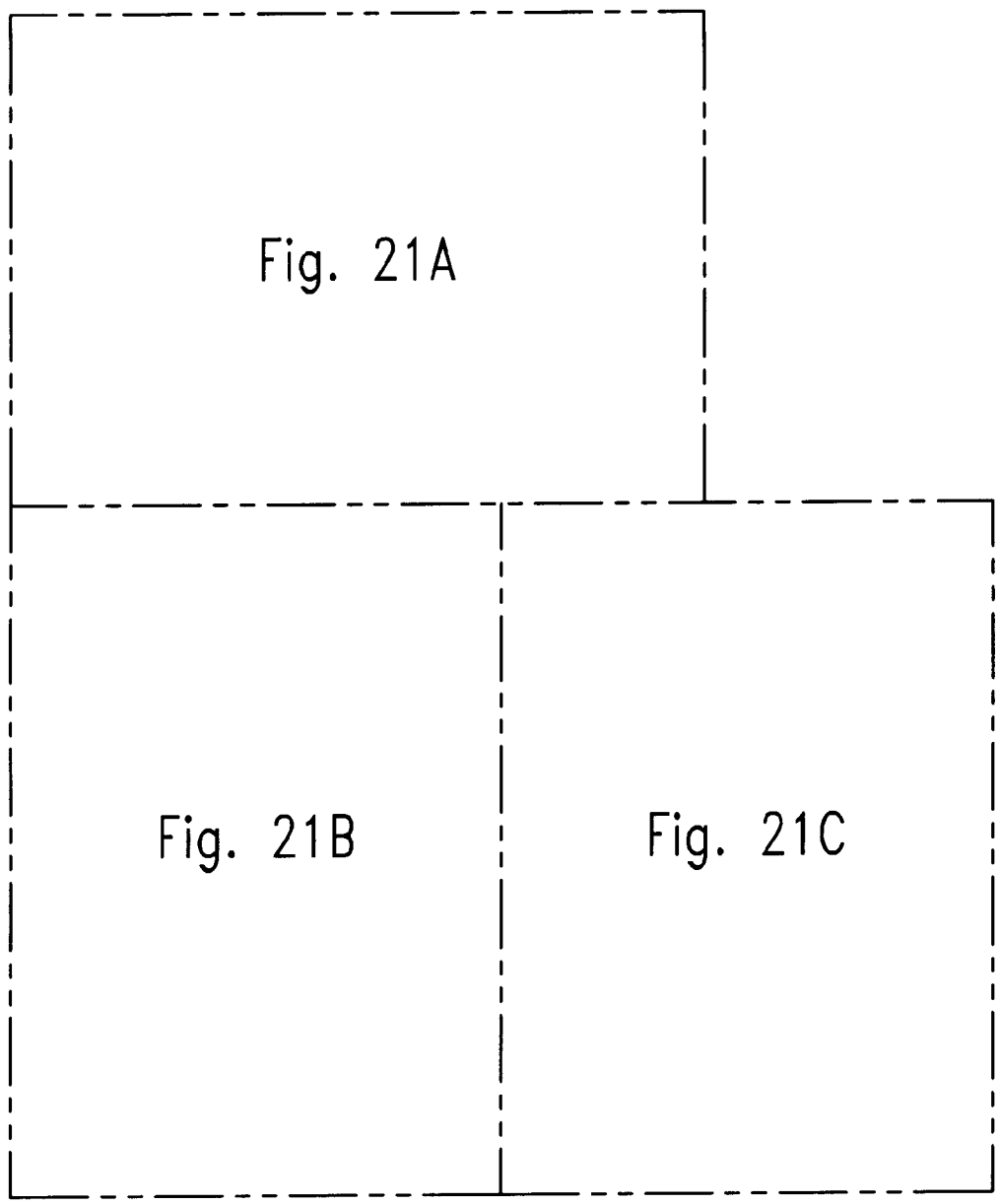
FIG. 21 is a logic diagram of the column command processor used in the column command unit of FIG. 15.
Figure 21A:
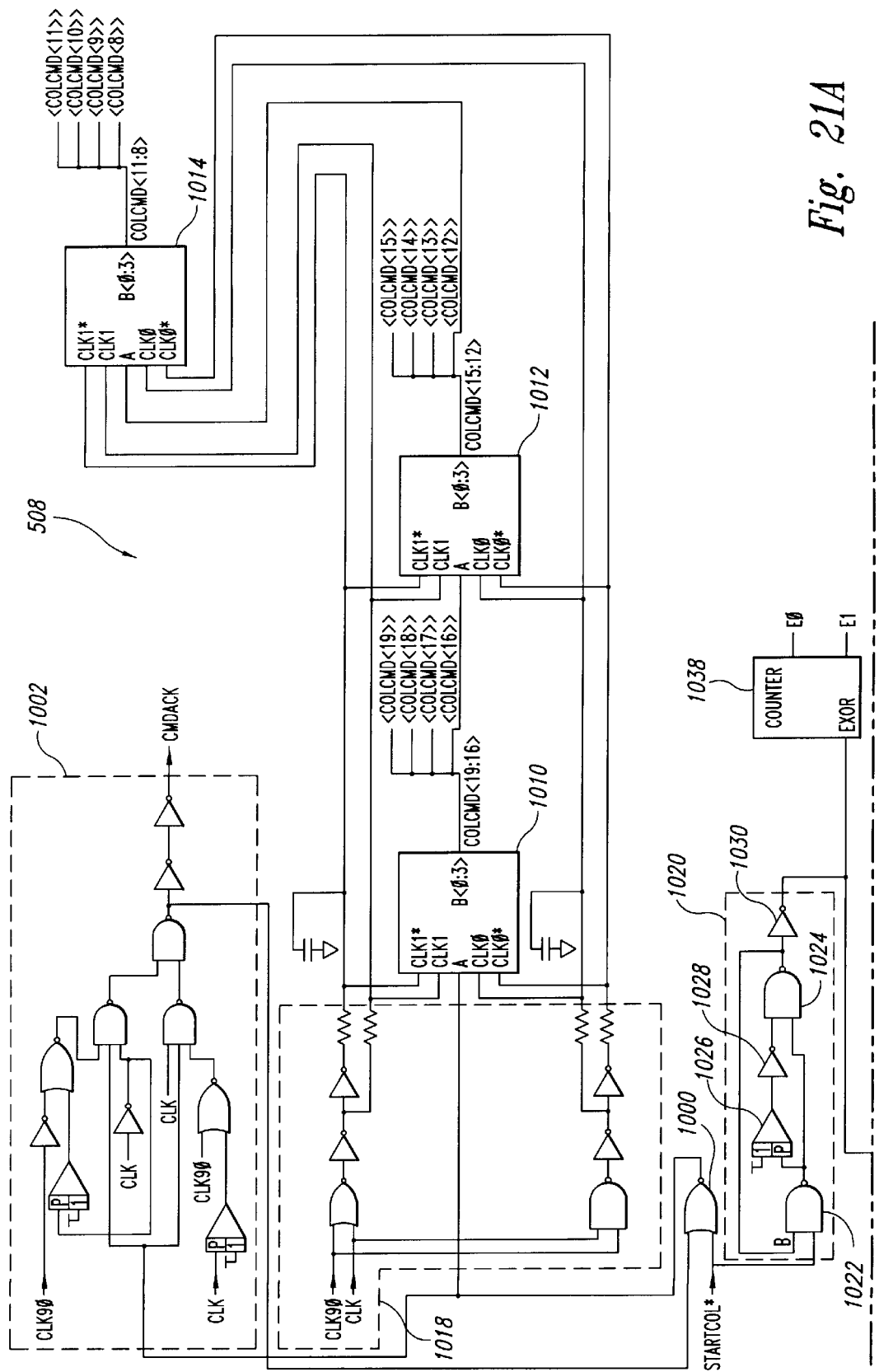
Figure 21B:
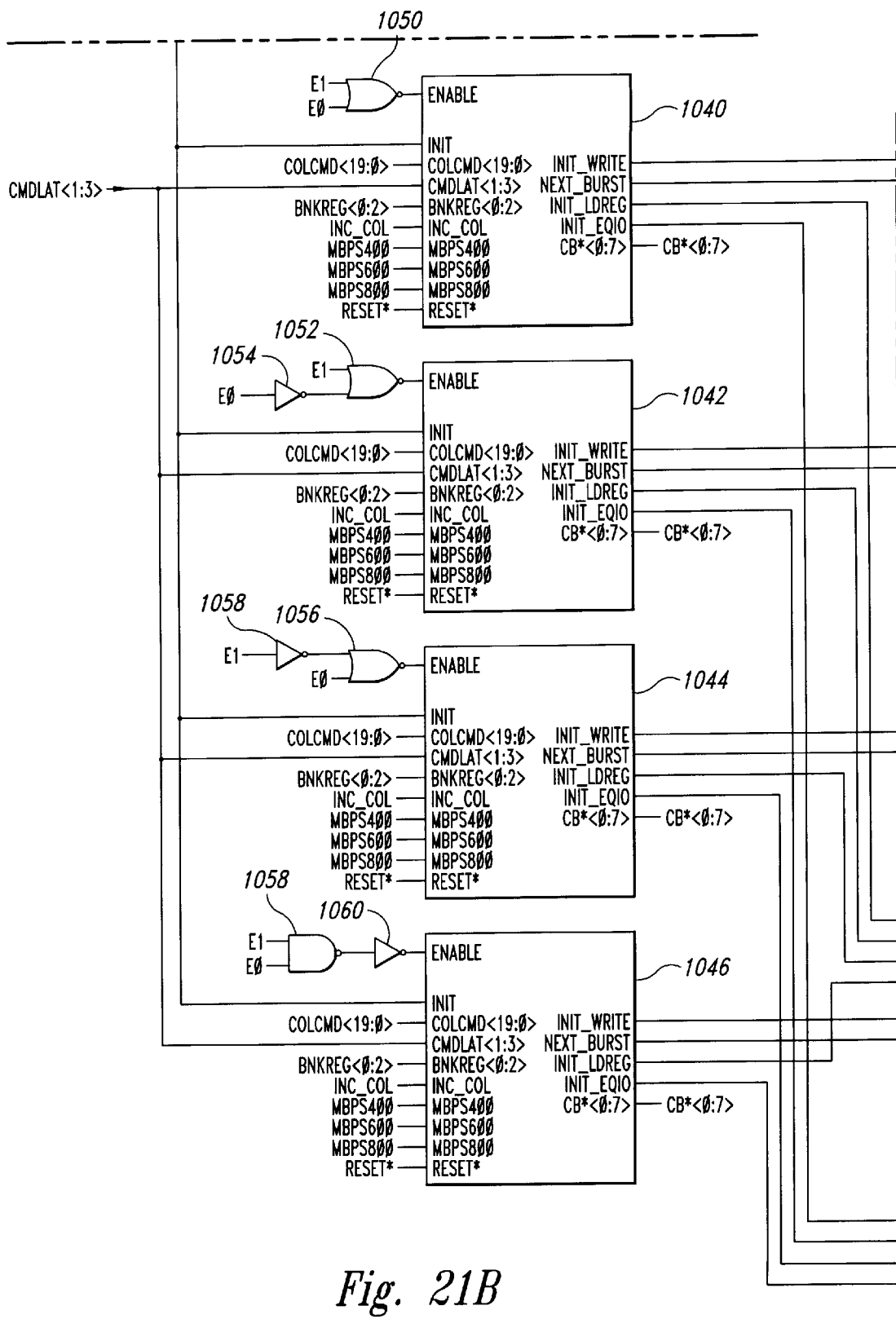
Figure 21C:
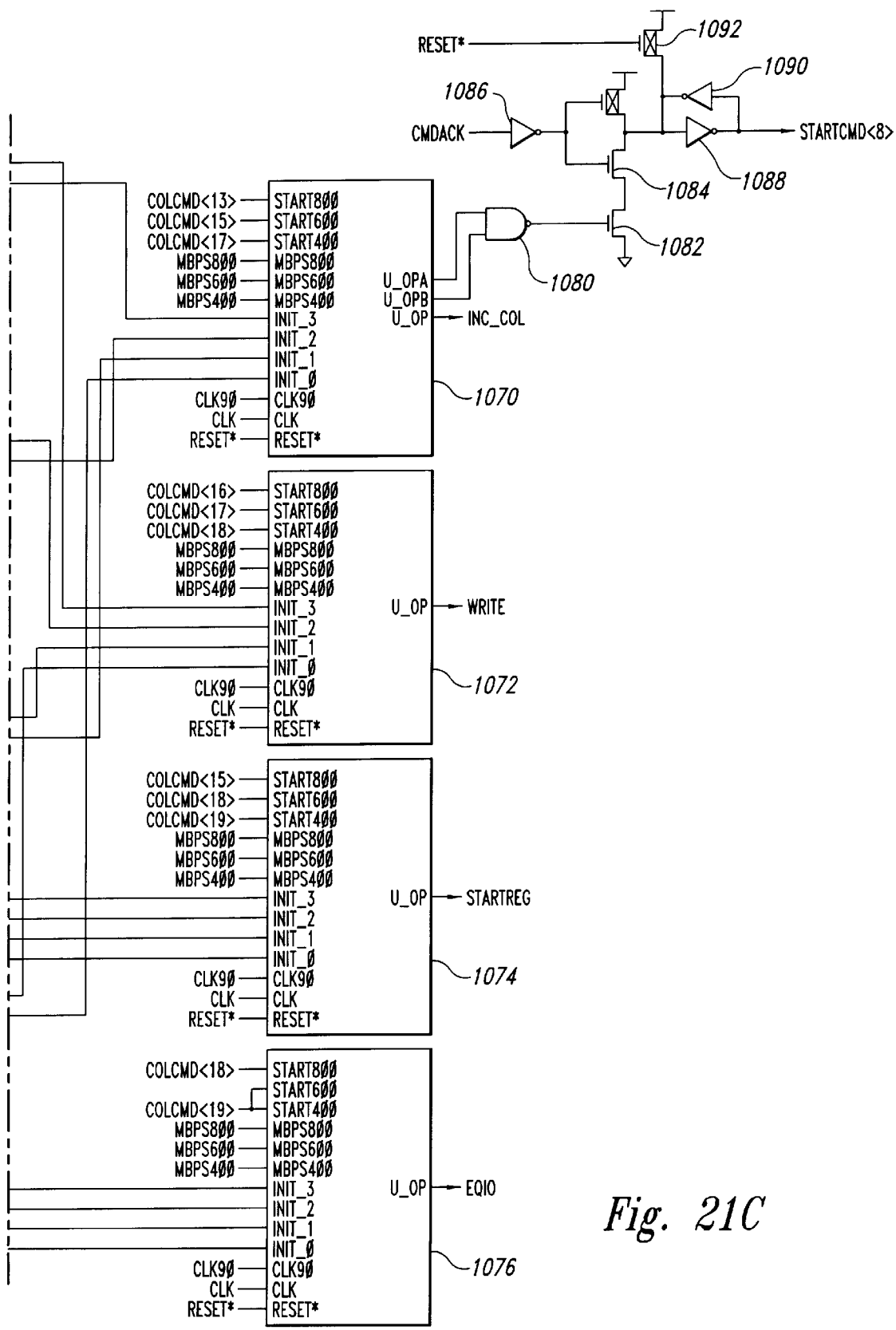

The column command processor 508 in the column command unit 228 of FIG. 15 is illustrated in greater detail in FIG. 21. As mentioned above, the function of the column command processor 508 is to generate a number of commands at times corresponding to the clock speed as indicated by a clock speed signal MBPS400–MBPS800. The operation of the column command processor 508 is initiated by the STARTCOL* signal going active low. As explained above with reference to FIG. 16, the STARTCOL* signal is generated by the logic circuit 520 whenever any of the eight STARTCMD<8:0> signals go high. The high to low transition of STARTCOL* is detected by a NOR gate 1000 which, prior to STARTCOL* going low, is outputting a low. The low is at the output of the NOR gate 1000 disables a control circuit 1002. The control circuit 1002 is essentially the same as the control circuit 300 used in the storage register 206 shown in FIG. 10 except that it is enabled by the output of the NOR gate 1000. Thus, in the interest of brevity, a detailed explanation of the control circuit 1002 will not be repeated. Basically, the control circuit 1002 outputs a pulse on the rising and falling edge of the clock signal CLK after it has been enabled by the output of the NOR gate 1000 going high. As a result, when STARTCOL* goes low, the control circuit 1002 outputs a positive-going pulse to the other input of the NOR gate 1000. The positive going pulse immediately disables the NOR gate 1000. Thus, the NOR gate 1000 can generate a high or logic "1" signal for only one transition of the clock signal CLK responsive to STARTCOL* going low.

The positive-going pulse generated by the control circuit 1002 produces the command acknowledge signal CMDACK. As explained above with reference to FIG. 20, the CMDACK signal is used to acknowledge to the start command generator 560 that the results of the STATCMD signal has been received and processed by the downstream column command processor 508.

The logic "1" at the output of the NOR gate 1000 is also applied to three 4-bit shift registers 1010, 1012, 1014. The shift registers 1010–1014 are clocked by a clock circuit 1018 that is identical to the clock circuit 235 shown in FIG. 5. Again, in the interest of brevity, a detailed explanation of the clock circuit 1018 will not been repeated. However, it will be recalled that the clock circuit 1018 clocks the shift registers 1010–1014 on each transition of CLK, i.e., on each rising and falling edge of CLK. As the logic "1" signal is shifted through the shift registers 1010–1014, each of the 12 column command signals COLCMD<19:8> goes high in succession from CMDCOL<19> to CMDCOL<8>. As explained below these column command signals COL-CMD<19:8> are used as timing signals in a column state machine to control the timing of various command signals. Thus, in operation, these column command signals COL-CMD<19:8> are generated in succession whenever START-COL* goes low. The control circuit 1002 prevents a logic "1" from being shifted into the shift registers 1010–1014 on successive transitions of CLK. However, more than one logic "1" may be shifted through the shift registers 1010–1014 at a time as long as they were not shifted into the shift register 1010 on successive transitions of CLK.

The high-to-low transition at the output of the NOR gate 1000 responsive to STARTCOL* going low also causes a pulse generator 1020 to output a positive-going pulse. The pulse generator 1020 includes a NAND gate 1022 that outputs a low prior to STARTCOL* going low. This low is applied to a NAND gate 1024 directly and through a delay circuit 1026 and an inverter 1028. Thus, prior to START-COL* going low, the NAND gate 1024 receives a high from the inverter 1028. When STARTCOL* goes low, the NAND gate 1022 outputs a high. However, because of the delay produced by the delay circuit 1026, the inverter 1028 continues to output a high for a short time before transitioning low. During the time that both inputs to the NAND gate 1024 are high, the NAND gate 1024 outputs a low to disable the NAND gate 1022. A positive-going pulse is therefore generated at the output of an inverter 1030.

The pulse at the output of the pulse generator 1020 is applied to a counter 1038 and to 4 column state machines 1040–1046. The function of the counter 1038 is to repeatedly increment from "0" to "3" to generate corresponding enable signals E0 and E1 which sequentially enable each of the column state machines 1040–1046. For this purpose, a NOR gate 1050 decodes the "0" count of the counter 1038, a NOR gate 1052 and an inverter 1054 decode the "1" count of the counter 1038, a NOR gate 1056 and an inverter 1058 decode the "2" count of the counter 1038, and a NAND gate 1058 and an inverter 1060 decode the "3" count of the counter 1038. As explained in greater detail below, when each of the state machines 1040–1046 is enabled, it generates a number of command signals at various times designated by the column command signals COLCMD<10:8>. The specific column command signals used to generate the commands are, in turn, a function of the clock speed and the type of command being issued.

The remaining circuitry in the column command processor 508 are four micro-operation circuits 1070–1076 that generate respective commands from the command signals generated by respective column state machines 1040–1046 at the proper times. These commands are an increment column command INC_COL, a write command WRITE, a start register command STARTREG, and an equilibrate I/O command EQIO. The INC_COL command goes high whenever data in the memory device are accessed in bursts of 8 columns. The WRITE command goes high when the I/O lines in a memory array are to be coupled to the digit lines designated by a column address. The STARTREG command goes high to enable a data path for read operations. Finally, the EQIO goes high whenever the I/O lines in the memory array are to be equilibrated.

The micro-operation circuit 1070 that generates the INC_COL command also applies signals to a NAND gate 1080. Whenever either of the inputs to the NAND gate 1080 are low, the NAND gate 1080 turns ON an NMOS transistor 1082. A second NMOS transistor 1084 will be turned ON whenever the output of an inverter 1086 is high, which will occur whenever the CMDACK signal is low. Under the circumstances, an inverter 1088 will output a high STARTCMD<8> signal that is latched by an inverter 1090. The active high STARTCMD<8> signal can also be generated by the reset signal RESET* going low to turn on a PMOS transistor 1092. The STARTCMD<8> signal is generated when a memory access with a burst of 8 columns is occurring. The STARTCMD<8> signal is generated at the start of the second burst of 4 columns and is used as described above. As further described above, the STARTCMD<8> signal is terminated by the acknowledgment signed CMDACK going high.

Figure 22:
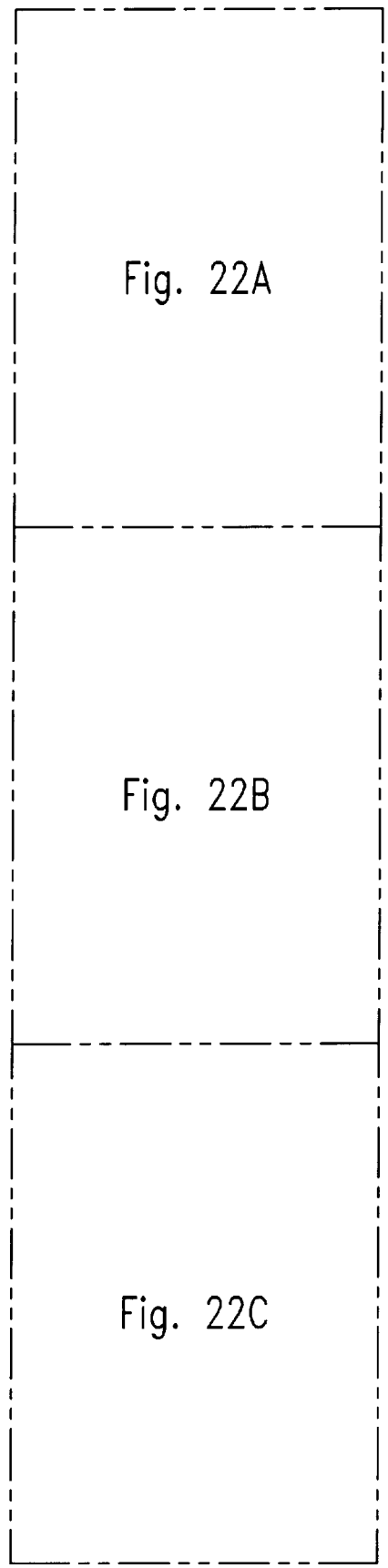
FIG. 22 is a logic diagram of the column state machine used in the column command processor of FIG. 21.
Figure 22A:
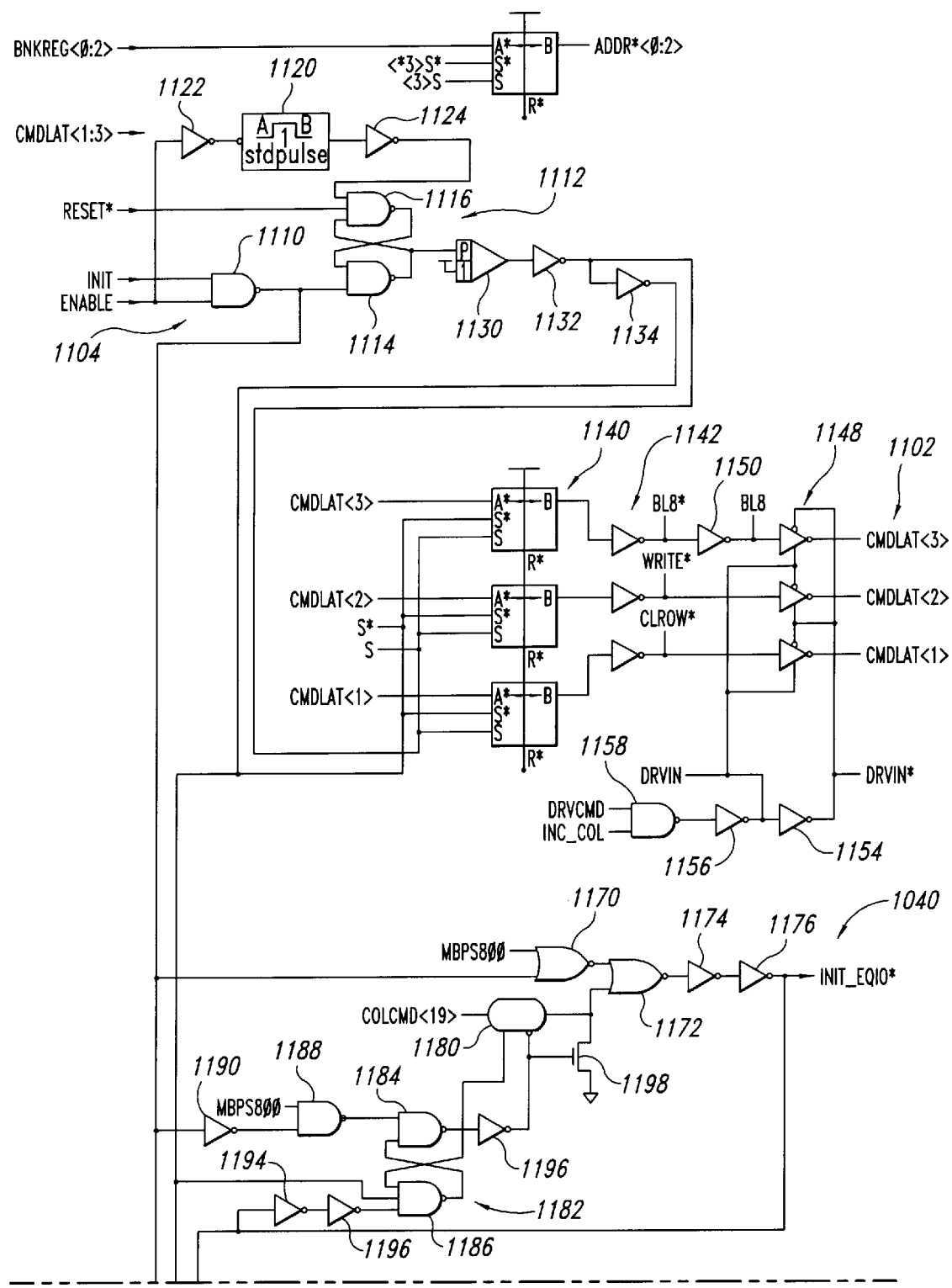
Figure 22B:
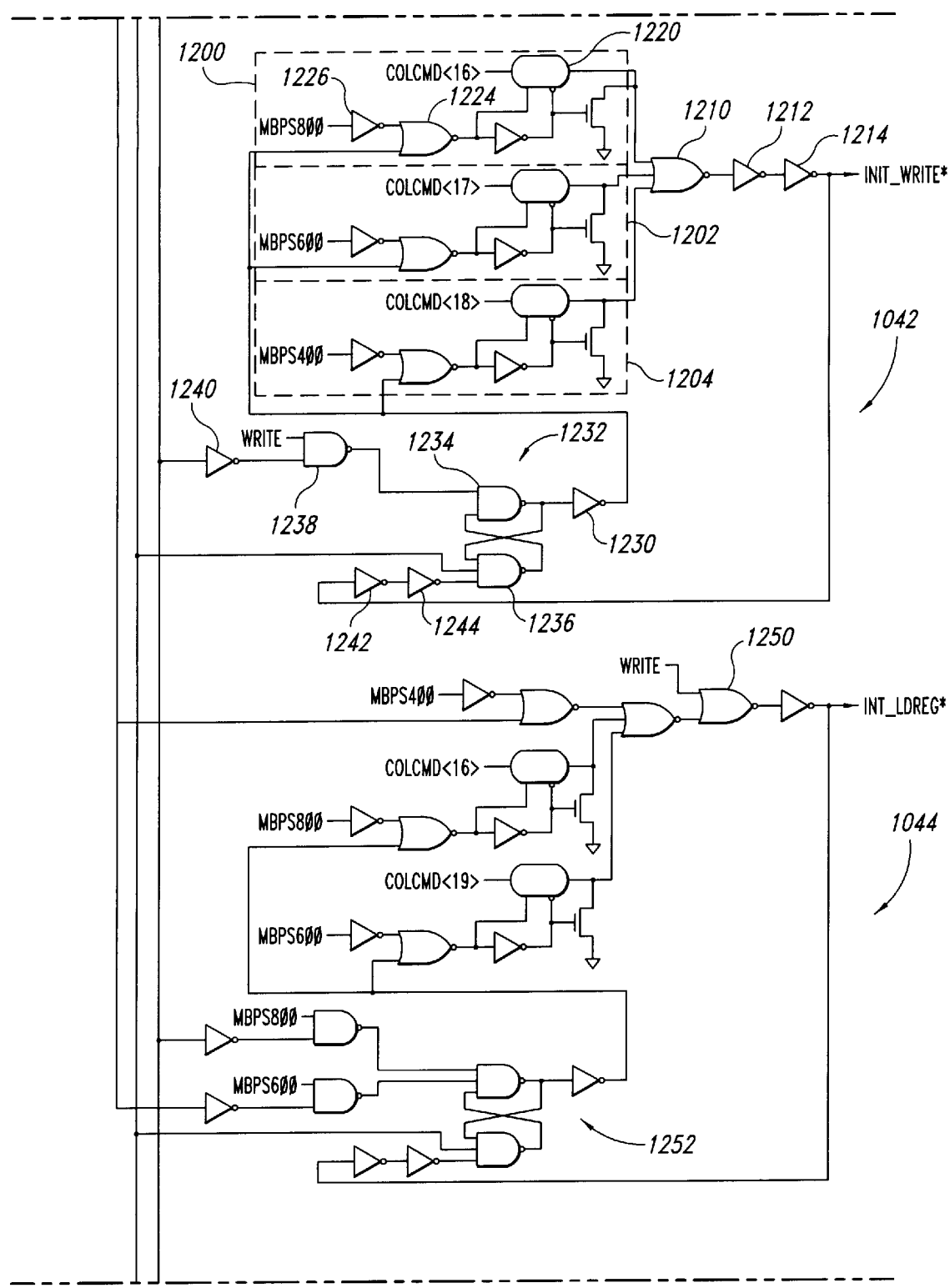
Figure 22C:
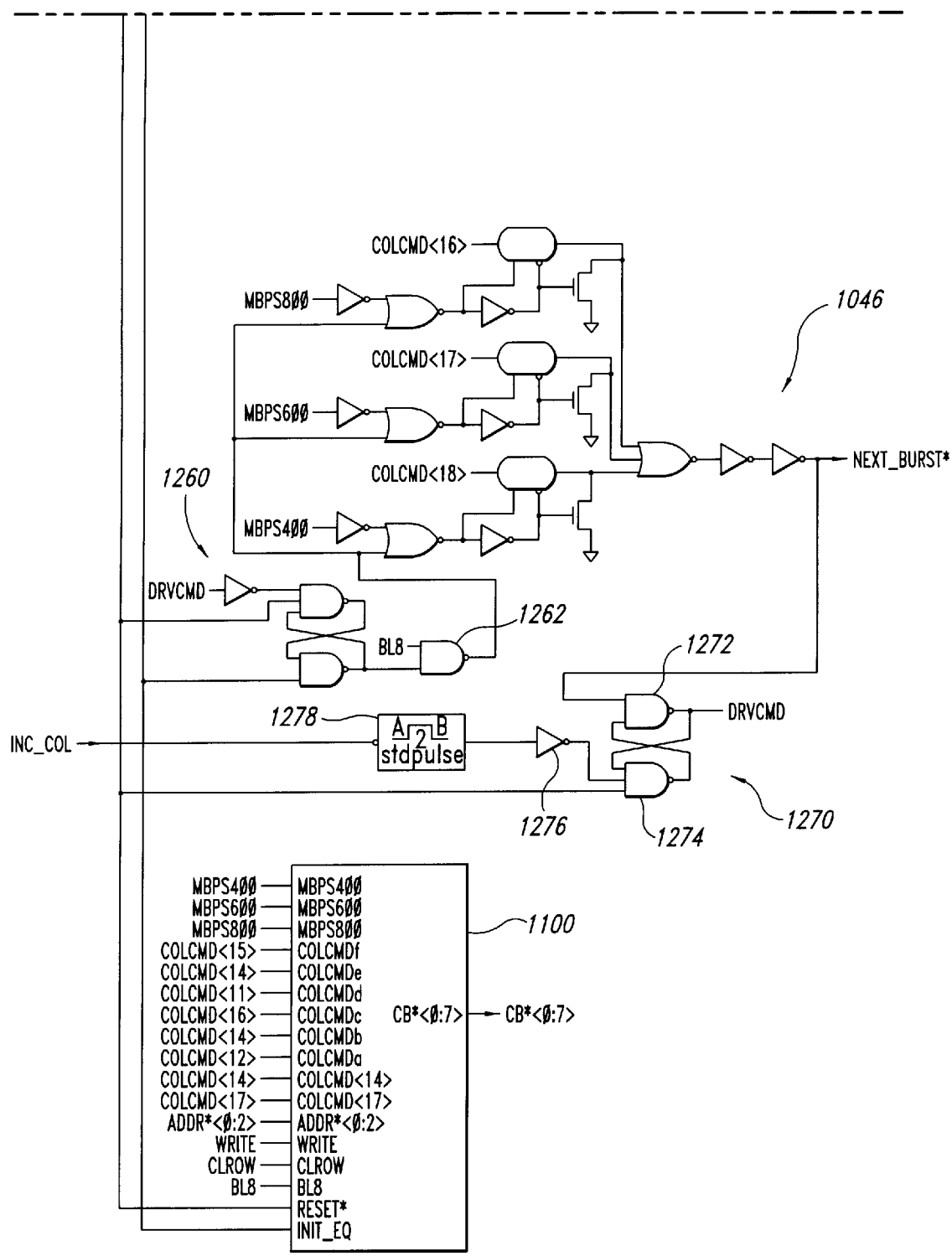

The four column state machines 1040–1046 shown in FIG. 21 are illustrated in great detail FIG. 22. Also shown in FIG. 22 are a close bank control circuit 1100 (which is shown as part of each column state machine 1040–1046 in FIG. 21), a logic circuit 1102 that is used to generate three command latch signals CMDLAT<3:1> and a drive signal, DRVIN*. The column state machines 1040–1046 also include an enable circuit 1104. As mentioned above with reference to FIG. 21, each one of the column state machines 1040–1046 is sequentially enabled by the E0, E1 signals generated by the counter 1038. With reference to FIG. 22, the enable input is applied to a NAND gate 1110 in the enable circuit 1104. When the NAND gate 1110 receives an INIT signal, the NAND gate 1110 outputs a low that sets a flip-flop 1112 formed by a pair of NAND gates 1114, 1116. As explained with reference to FIG. 21, the INIT signal is generated at the output of the pulse generator 1020 responsive to STARTCOL* going low. When the enable signal goes high, a pulse generator 1120 is triggered through an inverter 1112 which, after being inverted by an inverter 1124, resets the flip-flop 1112.

When the flip-flop 1112 is initially set, it triggers a delay circuit 1130, which causes complementary pulses to be generated at the output of respective inverters 1132, 1134. These pulses trigger three registers, indicated generally at 1140, which latch respective command latch signals CMD-LAT<3:1>. As explained with reference to FIG. 17, the CMDLAT<3:1> signals are generated by the command units 500 from the Y<19:17> bits of the command word from the storage registers 206, 208 (FIG. 5). The outputs of the registers 1140 are coupled through respective inverters 1142 to generate a burst length signal BL8*, a write signal WRITE*, and a close row signal CLROW* corresponding to CMDLAT<3>, CMDLAT<2>, and CMDLAT<1>, respectively. A logic "0" BL8* signal designates a burst of 8 columns while a logic "1" BL8* signal designates a burst of four columns. A logic "0" WRITE* signal designates a write operation while a logic "1" WRITE* signal designates a read operation. Finally, a logic "0" CLROW* signal specifies that the row of the memory array currently being accessed is to be closed down after the current memory access. A logic "1" CLROW* signal specifies that the row currently been accessed is to be left open so that additional columns from at row can be accessed. The BL8*, WRITE*, and CLROW* signals are applied to respective tri-state inverters 1148 either directly (in the case of WRITE* and CLROW*) or through an inverter 1150 (in the case of BL8). The inverters 1148 are enabled by a high DRVIN signal that is coupled through an inverter 1154 to generate a DRVIN*. The DRVN signal is generated at the output of the inverter 1156 when a NAND gate 1158 outputs a low responsive to DRVCMD and INC_COL both being high.

The column state machine 1040 generates the initiate equilibrate signal INIT_EQIO*. However, the timing of the INIT_EQIO* signal will be a function of the clock speed signal 800 MBPS. Under these circumstances, a NOR gate 1170 is enabled so that it can output a high when the NAND gate 1110 in the enable circuit 1104 outputs a low responsive to the INIT signal. The high at the output of the NOR gate 1170 is applied to a NOR gate 1172 which then outputs a low. After being inverted twice by inverters 1174, 1176, the low of the output of the NOR gate 1172 results in an active low INIT_EQIO* signal.

The INIT_EQIO* signal is also generated when the other input to the NOR gate 1172 goes high. The other input to the NOR gate 1172 will go high responsive to COLCMD<19> being high as long as a pass gate 1180 is enabled. The pass gate 1180 will be enabled when a flip-flop 1182 formed by a pair of NAND gates 1184, 1186 is set. The flip-flop 1182 is set by a NAND gate 1188 when the NAND gate 1188 is enabled by a high MBPS800 signal (i.e., the clock frequency is 800 MBPS) and the NAND gate 1110 outputs a low which causes an inverter 1190 to output a high to the NAND gate 1188. The flip-flop 1182 is reset once the INIT_EQIO* signal is generated since the INIT_EQIO* signal is applied to the NAND gate 1186 through two inverters 1194, 1196. The flip-flop 1182 is also reset responsive to the flip-flop 1112 since the output of the inverter 1134 is applied to the NAND gate 1186. When the flip-flop 1182 reset, the NAND gate 1184 outputs a low which causes an inverter 1196 to output a high that turns ON an NMOS transistor 1198. The NMOS transistor 1198 then holds the input to the NOR gate 1172 low.

The column state machine 1044 that generates the INIT_WRITE* signal includes three identical selection circuits 1200, 1202, 1204, only one of which will be explained in detail. The outputs of all three of these selection circuits 1200–1204 are coupled to respective inputs of a NOR gate 1210. The NOR gate 1210 generates the INIT_WRITE* signal through a pair of inverting buffers 1212, 1214.

The selection circuit 1200 includes a pass gate 1220 that receives the COLCMD<16> signal from the shift registers 1010–1014 (FIG. 21). When the pass gate 1220 is enabled, the COLCMD<16> signal is coupled through the pass gate 1220 to cause the INIT_WRITE* signal to be generated. The pass gate 1220 is enabled whenever the NOR gate 1224 outputs a high. The NOR gate 1224 will enable the pass gate 1220 whenever the output of an inverter 1226 is low responsive to MBPS800 being high and the output of an inverter 1230 is low. The output of the inverter 1230 will be low whenever a flip-flop 1232 formed by a pair of NAND gates 1234, 1236 is set. The flip-flop 1232 is set by a low at the output of a NAND gate 1238, which occurs whenever WRITE is active high and the INIT_EQIO* signal is generated since the INIT_EQIO* signal is applied to the NAND gate 1238 through an inverter 1240. The flip-flop 1232 is reset whenever either the flip-flop 1112 is reset or the INIT_WRITE* signal is generated, since the INIT_WRITE* signal is applied to the NAND gate 1236 by a pair of inverters 1242, 1244.

In summary, the INIT_WRITE* signal is generated during a write operation at a clock frequency of 800 MBPS responsive to the COLCMD<16> signal. In a similar manner, the selector circuit 1202 causes the INIT_WRITE* signal to the generated during a write operation at a clock frequency of 600 MBPS responsive to the COLCMD<17> signal. Since the COLCMD<16> signal is generated later than the COLCMD<17> signal is generated, a greater number of clock cycles is allotted for a write operation at 800 MBPS. The selection circuit 1204 operates in a similar manner to generate the INIT_WRITE* signal during a write operation at a clock frequency of 400 MBPS.

The column state machine 1044 operates in substantially the same manner as the column state machine 1042 although it contains slightly different circuit. Basically, the column state machine causes the INIT_LDREG* signal to be generated in the event of the read operation (since the active high WRITE signal is applied to ignore gate 1250) responsive to the COLCMD<16> signal at 800 MBPS, responsive to the COLCMD<19> signal at 600 MBPS, and responsive to the output of the NAND gate 1110 going low at 400 MBPS. However, a flip-flop 1252 that allows the INIT_LDREG* signal to be generated is set responsive to the INIT_EQIO* signal at a clock frequency of 800 MBPS, and responsive to the output of the NAND gate 1110 going low at a clock frequency of 600 MBPS.

The column state machine 1046 operates in substantially the same manner to generate the NEXT_BURST* signal. When a flip-flop 1260 is set by DRVCMD being low, a NAND gate 1262 is enabled. If a memory access is to occur in a burst of 8 columns, then BL8 will be high, as explained above. As a result, all of the selection circuits in the column state machine 1046 are enabled. Under these circumstances, the NEXT_BURST* signal will be generated responsive to the COLCMD<16> signal at a clock frequency of 800 MBPS, responsive to the COLCMD<17> signal at a clock frequency of 600 MBPS, and responsive to the COLCMD<18> signal at a clock frequency of 400 MBPS.

The active low NEXT_BURST* signal also resets a flip-flop 1270 formed by a pair of NAND gates 1272, 1274 to generate an active high drive command signal DRVCMD. The flip-flop 1270 is set through an inverter 1276 whenever a pulse generator 1278 is triggered by the increment column signal INC_COL going high. The flip-flop 1270 is also set by the high-to-low transition at the output of the NAND gate 1110 responsive to INIT going high. The DRVCMD signal is driven high in the event of a "burst of eight" memory access so that command signals used to access the first four columns of memory are once again used to access the second four columns of memory.

Figure 23:
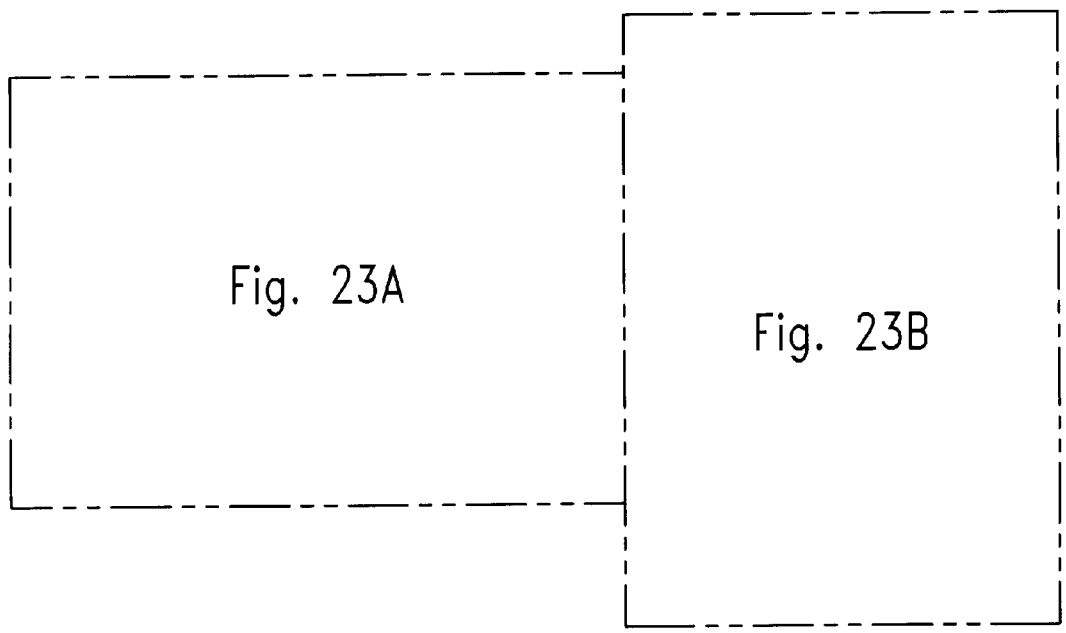
FIG. 23 is a logic diagram of the close bank control circuit used in the column state machine of FIG. 22.
Figure 23A:
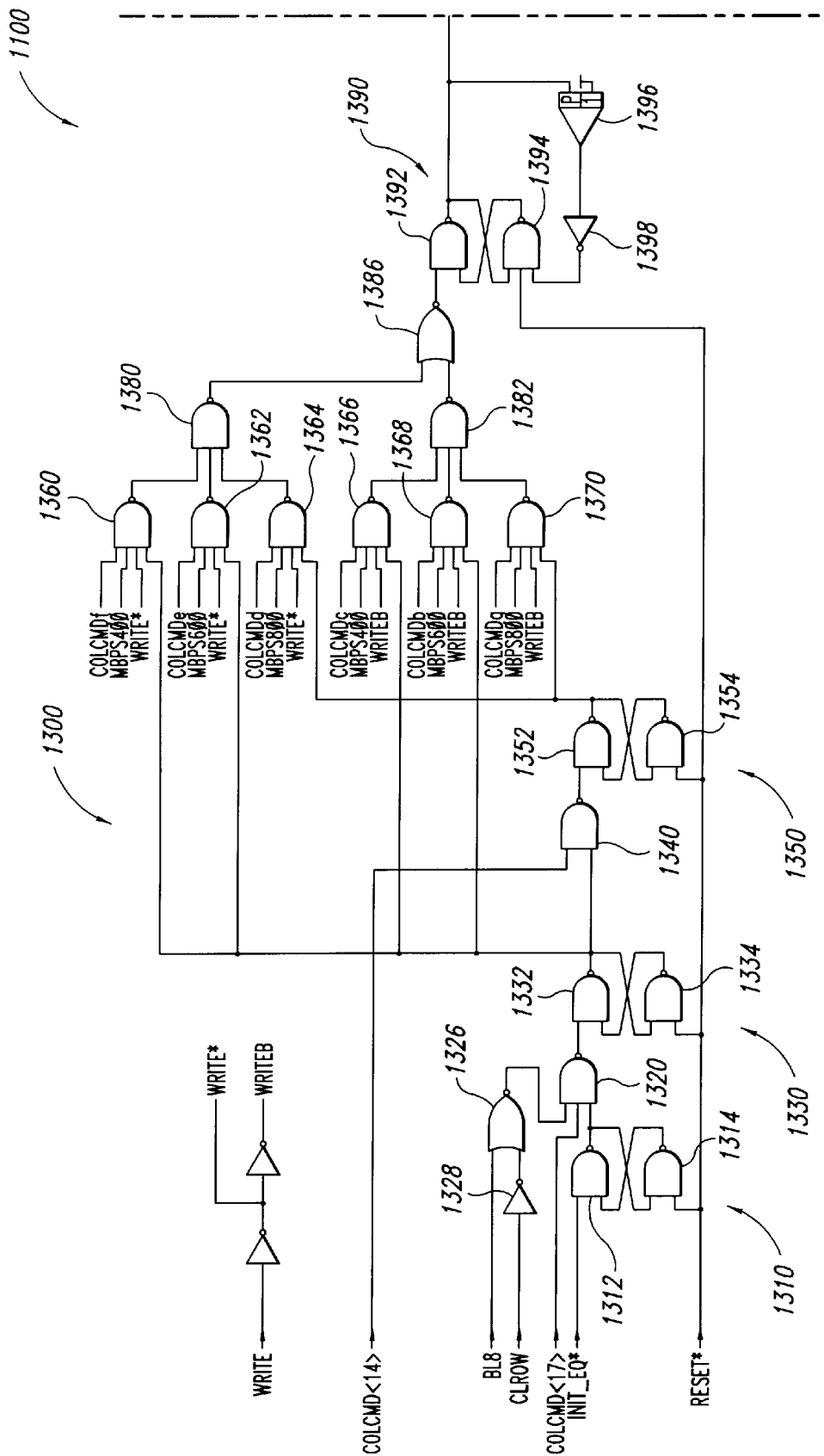
Figure 23B:
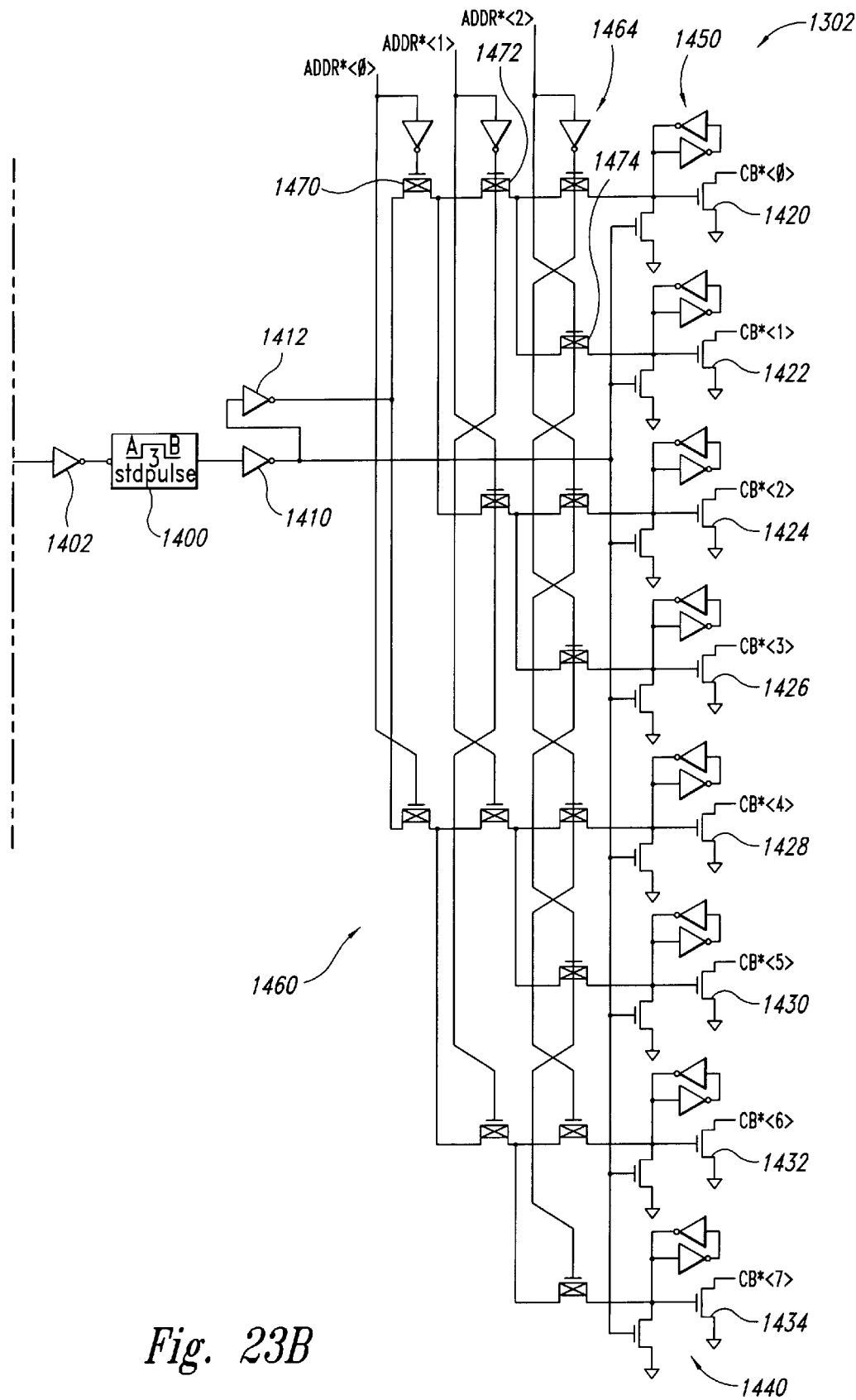

The close bank control circuit 1100 is shown in greater detail in FIG. 23. The close bank control circuit 1100 includes a decoder control circuit 1300 and a decoder 1302. The decoder 1302 generates one of 8 bank select signals CB*<7:0> based on a three-bit bank address ADDR*<0:2> that is obtained by latching the three bank register bits BNKREG<2:0>* as explained above with reference to FIG. 22. Thus, one of the 8 memory banks 80 (FIG. 3) is enabled by a respective CB<7:0>* signal corresponding to the bank address ADDR<2:0>*.

The decoder control circuit 1300 includes a first flip-flop 1310 formed by a pair of NAND gates 1312, 1314. The flip-flop 1310 is set by the initiate equilibrate signal INIT_EQIO* generated by the column state machine 1040, as explained above with reference to FIG. 22. When the flip-flop 1310 is set, it enables a NAND gate 1320.

The NAND gate 1320 also receives the output of a NOR gate 1326 and the COLCMD<17> signal that goes high one clock cycle after the falling edge of STARTCOL*, as explained above with reference to FIG. 21. The output of the NOR gate 1326 is high when the BL8 signal is low and the CLROW signal is high since the CLROW signal is applied to the NOR gate 1326 through an inverter 1328. As explained above with reference to FIG. 22, the BL8 signal will be high when data is to be read from the memory in bursts of eight columns, and CLROW* will be high when a row currently being accessed is to be left open so additional columns in that row can be read. Therefore, the NAND gate 1320 will output a low during a burst read of 4 columns from a currently accessed row when the COLCMD<17>* signal goes high after INIT_EQIO* has gone low.

When the output of the NAND gate 1320 goes low, it sets a flip-flop 1330 that is also formed by a pair of NAND gates 1332, 1334. Setting of the flip-flop 1330 enables a NAND gate 1340 which also receives the COLCMD<14> signal. Thus, 1½ clock cycles after the COLCMD<17> signal sets the flip-flop's 1310, 1330 under the conditions explained above, the NAND gate 1340 outputs a low. The low at the output of the NAND 1340 sets another flip-flop 1350 formed by a pair of NAND gates 1352, 1354.

The flip-flops 1330, 1350 together enable six NAND gates 1360–1370. The flip-flop 1330 enables the NAND gates 1360, 1362, 1366, 1368, and the flip-flop 1350 enables the NAND gates 1364, 1370. The NAND gates 1360–1364 receive the WRITE* signal and are thus enabled during a read operation. The NAND gates 1366–1370 receive the WRITEB signal and are thus enabled during a write operation. The NAND gates 1360 and 1366 receive the MBPS400 signal and are thus enabled at a clock frequency of 400 MBPS, the NAND gates 1362, 1368 receive the MBPS600 signal and are thus enabled at a clock frequency of 600 MBPS, and the NAND gates 1364–1370 receive the MBPS800 signal and are thus enabled at a clock frequency of 800 MBPS. Each of the NAND gates 1360–1370 receive a respective column command signal, and the single NAND gate 1360–1370 that is enabled thus outputs a low at a different time. Thus, one of the NAND gates 1360–1370 will output low at a respective time depending upon the clock frequency and whether a memory access is a read or a write operation.

When one of the NAND gates 1360–1370 outputs a low, the low is detected by one of two NAND gates 138, 1382 which then applies a high to a NOR gate 1386. The NOR gate 1386 then outputs a low that sets a flip-flop 1390 formed by a pair of NAND gates 1392, 1394. When the flip-flop 1390 is set, the NAND gate 1392 outputs a high that triggers a pulse generator 1396. The pulse generator 1396 then generates a pulse that is inverted by an inverter 1398 to reset the flip-flop 1390. Thus, when the flip-flop 1390 is set, it is automatically reset a short time later. When the flip-flop 1390 is reset, the high-to-low transition at the output of the NAND gate 1392 is coupled to a pulse generator 1400 by an inverter 1402 as a low-to-high transition that triggers the pulse generator 1400. The pulse generator 1400 then outputs a positive-going pulse that causes an inverter 1410 to output a negative-going pulse and an inverter 1412 to output a positive-going pulse. As explained below, the negative-going pulse at the output of the inverter 1410 removes a reset from the decoder 1302 while the positive-going pulse at the output of the inverter 1412 applies power to the decoder 1302. In summary, the decoder control circuit 1300 enables the decoder 1302 for a short period at a time that is determined by the clock frequency and whether a memory access is a read or a write operation.

The decoder 1302 generates output signals CB<7:0>* at the drains of respective NMOS transistors 1420–1434. The gates of the transistors 1420–1434 are normally pulled low by respective NMOS transistors, generally indicated by reference numeral 1440. The gates of the transistors 1440 are coupled to the output of the inverter 1410. As explained above, the output of the inverter 1410 is normally high, thereby turning ON the transistors 1440, which pull the gates of their respective transistors 1420–1434 low. The gates of the transistors 1420–1434 are maintained at whenever level they are set by respective latches, each of which are formed by a pair of inverters, indicated generally at 1450.

The transistors 1420–1434 are selectively turned ON by the positive-going pulse at the output of the inverter 1412 that is selectively coupled through respective groups of series-connected PMOS transistors, indicated generally at 1460. The PMOS transistors 1460 are turned ON by the bank address signals ADDR*<2:0> either directly or through inverters, indicated generally at 1464.

The operation of the decoder 1302 will be explained with reference to a single example since it will then be apparent to one skilled in the art how the remainder of the decoder 1302 operates. By way of example, when the bank address ADDR*<2:0> is "011", the high ADDR*<1:0> bits are coupled through the inverters 1464 to turn ON the PMOS transistors 1470, 1472. The low ADDR*<2> bit turns ON the PMOS transistor 1474 so that there is now a current path from the output of the inverter 1412 through the PMOS transistors 1470–1474 to the gate of the NMOS transistor 1422. As a result, the transistor 1422 is turned ON to drive CB*<1> low. All of the other NMOS transistors 1420, 1424–1434 remain OFF. The remaining close bank signals CB*<7:2,0> are generated as a function of the bank address signals ADDR*<2:0> in a similar manner. Thus, the close bank control circuit 1100 generates close bank signal CB*<7:0> as a function of the bank address ADDR*<2:0> at a time that is a function of the clock speed and whether a memory access is a write or a read operation.

Figure 24:
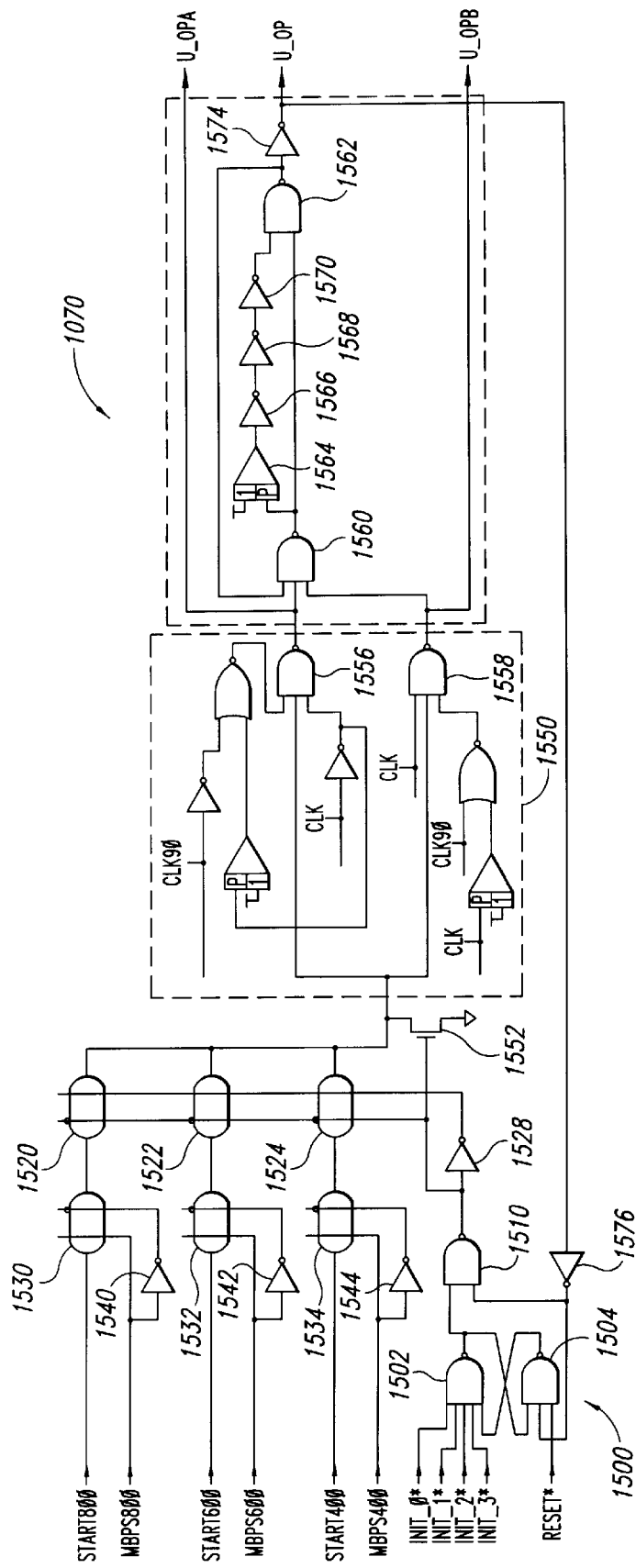
FIG. 24 is a logic diagram of the micro-operation circuit used in the column command processor of FIG. 21.

The micro-operation circuits 1070–1076 of FIG. 21 are shown in greater detail in FIG. 24. Each of the micro-operation circuits 1070–1076 are identical, and therefore only one micro-operation circuit 1070 is shown in FIG. 24 and explained herein. The function of the micro-operation circuits 1070–1076 is to generate a single respective command pulse at a time determined by a column command signal CMDCOL depending on the clock speed responsive to one of the initiate signals INIT*<3:0> from a respective columns state machine 1040–1046.

When any one of the initiate signals INIT*<3:0> goes low, it sets a flip-flop 1500 formed by a pair of NAND gates 1502, 1504. When the flip-flop 1500 is set, it causes a NAND gate 1510 to output a low, since the NAND gate 1510 is initially enabled, as explained below. The NAND gate 1510 then enables a set of pass gates 1520, 1522, 1524, either directly or through an inverter 1528. The pass gates 1520–1524 receive the outputs of respective pass gates 1530–1534. Each of the pass gates 1530–1534 is enabled by a respective clock speed signal MBPS400–MBPS800 coupled to the pass gates 1530–1534 either directly or through respective inverters 1540–1544. Thus, only one pass gate 1530–1534 is enabled since there is only one clock speed signal that is active. The enabled pass gate 1530–1534 couples its respective start signal START400–START800 through a respective pass gate 1520–1524 when the flip-flop 1500 is set. As explained above with reference to FIG. 21, the START signals correspond to respective column command signals COLCMD<19:6> as indicated in FIG. 21. In particular, START400 corresponds to COLCMD<17>, START600 corresponds to COLCMD<15>, and START800 corresponds to COLCMD<13>.

The output of the enabled pass gate 1520–1524 is applied to a clock input of a pulse generator 1550. The input to the pulse generator 1550 is normally held low by an NMOS transistor 1552 that is normally held ON by the high at the output of the NAND gate 1510. The pulse generator 1550 is substantially identical to the pulse generator 300 (FIG. 10) used in the storage registers 206, 208, and a description of its operation will therefore not be repeated. Briefly, the pulse generator 1550 generates a negative-going pulse at the output of either NAND gate 1556 or NAND gate 1558 on the transition of CLK following a high output from one of the pass gates 1520–1524. One of the NAND gates 1556, 1558 outputs a low on the first transition of CLK while the other one of the NAND gates 1556, 1558 outputs and low on the next transition of CLK. The low at the output of either NAND gate 1556, 1558 causes a NAND gate 1560 to output a high. The output of the NAND gate 1560 is applied to a NAND gate 1562 and to the series combination of a delay circuit 1564 and three inverters 1566–1570. Since the output of the NAND gate 1560 is initially low, the output of the inverter 1570 is initially high. When the pulse generator 1550 outputs a low thereby causing the NAND gate 1560 to output a high, the output of the inverter 1570 does not immediately transition low because of the delay of the delay circuit 1564 and the inverters 1566–1570. Thus, the NAND gate 1562 outputs a low until the low-to-high transition at the output of the NAND gate 1560 propagates through the delay circuit 1564 and the inverters 1566–1570. The output of the inverter 1570 then transitions low to cause the NAND gate 1562 to terminate its negative-going pulse. An inverter 1574 outputs a positive-going pulse from the negative-going pulse output from the NAND gate 1562. The positive-going pulse at the output of the inverter 1574 is coupled through an inverter 1576 as a negative-going pulse to reset the flip-flop 1500. When the flip-flop 1500 is reset, it causes the NAND gate 1510 to output a high that turns ON the NMOS transistor 1552. The transistor 1552 then disables the pulse generator 1550 from generating any additional pulses until the flip-flop 1500 has again been set. The negative-going pulse at the output of the NAND gate 1562 also disables the NAND gate 1560.

In summary, in response to one of the initiate signals INIT*<3:0>, the micro-operation circuit 1070–1076 outputs low U_OPA and U_OPB signals and a positive going U_OP pulse at a time that is determined by the clock speed. As shown in FIG. 21, only the micro-operation circuit 1070 utilizes the level signals U_OPA and U_PAB. The remaining micro-operation circuits 1072–1076 utilize only the positive-going pulse U_OP. As shown in FIG. 21, the positive-going pulses generated by the micro-operation circuits 1070–1076 are respective command pulses INC_COL, WRITE, STARTREG, and EQIO. As explained above with reference to FIG. 21, the INC_COL signal increments the column address during a burst of eight memory access, the WRITE signal connects complementary I/O lines in the memory arrays to respective digit lines corresponding to the column address, the STARTREG signal enables a data path read register, and the EQIO signal causes the I/O lines to be equilibrated. As also shown in FIG. 21, the logic levels signals U_OPA and U_OPB cause the STARTCMD<8> signal to be generated.

As explained above with reference to FIGS. 15–17, bits Y<27:32> of each packet word constitute a column address COL <6:0> that is stored in a latch 580 (FIG. 17) of each command unit 500 (FIGS. 15–17). As explained above with reference to FIG. 15, the column address from each command unit 500a–h is applied to a respective column address processing unit 506. The column address processing unit 506 shown in FIG. 15 is illustrated in detail in FIGS. 25 and 26.

The use of multiple column address processing units 506, each of which stores a respective column address, provides significant advantages to increase the speed of the memory device 16. In conventional DRAMs and known architectures for packetized DRAMs, the DRAM cannot receive a column address for a memory operation until the prior column address has been latched and processed, such as by decoding the address. By using multiple column address processing units 506, memory devices can continue to receive column addresses even though one or more prior column addresses have not yet been processed, such as by decoding the column addresses.

Figure 25:
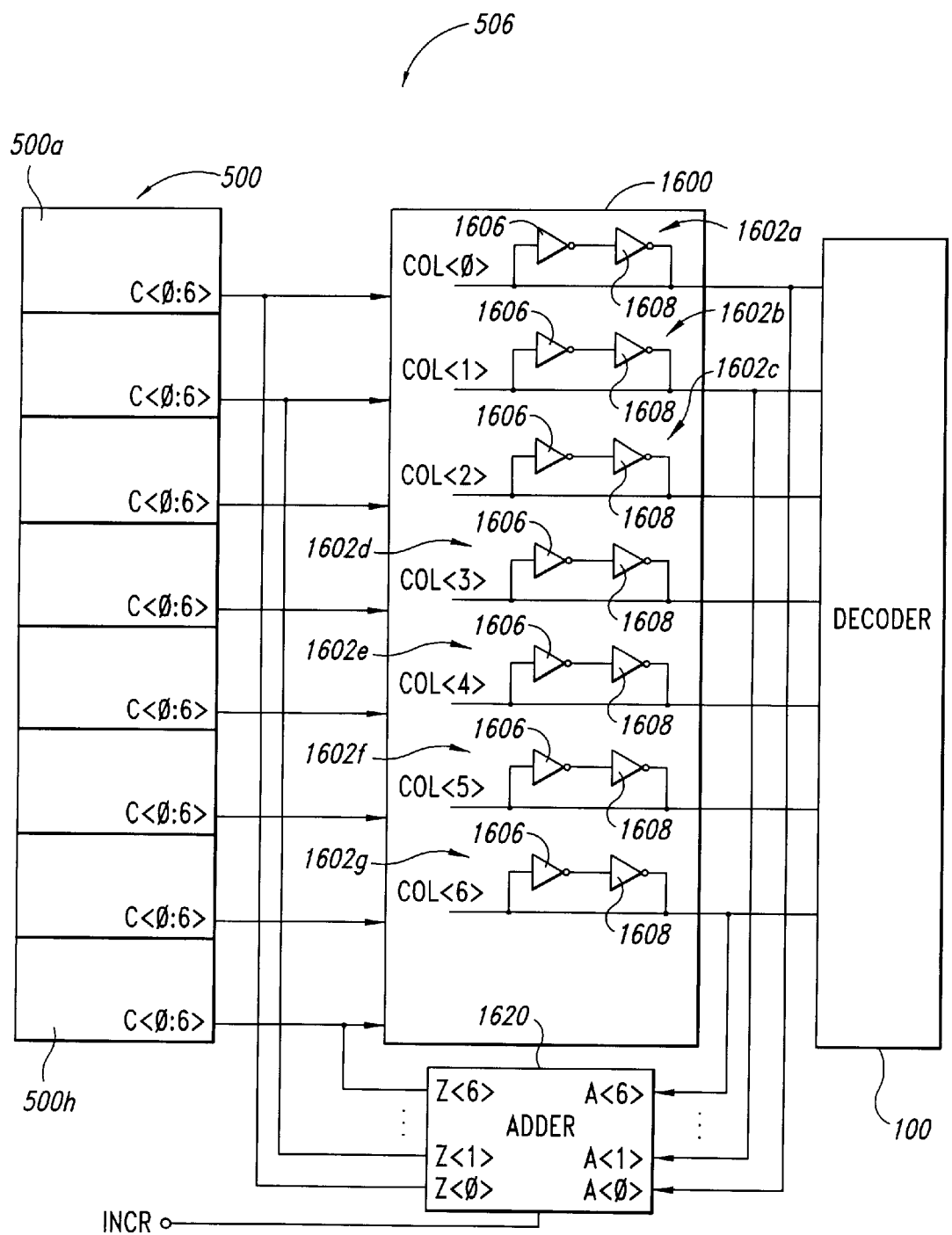
FIG. 25 is a logic diagram of the column address processing unit 506 used in the column command unit of FIG. 15.

With reference to FIG. 25, the column addresses COL<0:6> present at the output of the command units 500a–h are applied to a column address latch 1600 that is composed of one latch circuit 1602a–g for each bit of the column address COL<0:6>. Each latch circuit 1602 is composed of a pair of inverters 1606, 1608. The output impedance of the inverters 1608 is higher than the output impedance of the command units 500 so that the command units 500, rather than the inverters 1608, control the logic level at the inputs to the inverters 1606. Thus, when a logic level (i.e., an logic "1" or "0") is applied to the input of one of the inverters 1606, that same logic level is generated at the output of the inverter 1608, thereby holding the input to the inverter 1606 at that logic level after the previously enabled command unit 500 is no longer enabled.

As mentioned above, one latch 1602 is provided for each column address bit COL<0:6>. Thus, the COL<0> bit from each of the command units 500 is coupled to the latch 1602a, the COL<1> bit from each of the command units 500 is coupled to the latch 1602b, etc. However, as also mentioned above, only one of the command units 500 is enabled by at any one time. As a result, the latches 1602a–g receive a signal from only one command unit 500 at a time.

The column address COL<0:6> at the output of the column address latch 1600 is then processed, such as by applying it to a column decoder 100 (FIG. 3).

The column address latch 1600 is adapted to interface with an adder 1620 in the burst mode of operation. As explained above, in a burst memory access, the column address from one of the command units 500 designates a starting address for the memory access. Thereafter, a plurality of memory accesses from the memory cells occur incrementing from the column address without the need for one of the command units 500 to receive and apply additional column addresses to the column address latch 1600. In a burst mode access, a high INCR signal is applied to the adder 1620 by the micro-operation circuit 1070 (FIG. 21) that generates INC_COL. The adder 1620 then latches the column addresses applied to the A<0:6> inputs of the adder 1620 from respective COL<0:6> outputs of the column address latch 1600. The adder 1620 then increments the column address by one and applies the incremented column address to its Z<0:6> outputs. The Z<0:6> outputs of the adder 1620 are coupled to respective COL<0:6> inputs to the column address latch 1600. As a result, the column address latch 1600 receives an incremented column address.

A wide variety of conventional circuits may be used for the adder 1620. Thus, in the interests of brevity, the structure and operation of the adder 1620 will not be shown or described in detail. Briefly, the adder 1620 may operate on the known principle that that a multi-bit digital word may be incremented by 1 simply by inverting a bit and all bits of lesser significance if all bits lesser significance than that bit are logic "1". Thus, for example, if the column address is "100111" the column address can be incremented by 1 simply by inverting bits 3:0 to obtain "101000".

As mentioned above, the command buffer 200 shown in FIGS. 3–25 may be used in place of the command sequencer and decoder 60 in the packetized DRAM 16 that is shown in FIG. 2. The resulting memory device 16 may be used in the computer system shown in FIG. 1 to provide superior operating speed.

While the invention has been described herein by way of exemplary embodiments for purposes of illustration, various modifications may be made without departing from the spirit and scope of the invention. Accordingly, the invention is not limited except as by the appended claims.

It is thus seen that a column address is always placed on the column address bus 230 (FIG. 4) when the DRVCMD signal is generated by a command unit 500. At the same time, a column state machine 1040–1046 is started. Signals are then generated by the micro-operation circuits 1070–1076 at times that are selected so that the array is always stimulated at the proper point in time regardless of clock speed or type of memory access. Furthermore, the column address is placed on the column address bus and one of the column plate machines 1040–1046 is started such that the data pins of the memory device send and receive data according to the schedule set by the CRSE_VERN<5:0> signals applied to the counter 550.

The CRSE_VERN<5:0> signals are generated by other circuitry (not shown) as a function of the type of memory access and values programmed by the user.

What is claimed is:

1. A memory device command generator receiving command packets indicative of a memory command, a row address and a command address, the command generator comprising:

a plurality of command units, each of the command units, when enabled, storing a plurality of command bits of a command packet received by the command units and, when activated, outputting the command bits stored in the command unit, each of the command units comprising:

a counter counting in one direction from an initial count to a terminal count responsive to a clock signal, the counting being initiated responsive to a start signal derived from a timing signal associated with the command packet received by a command unit when the command unit is activated; and a start command generator generating a start command signal at one of a plurality of respective counts of the counter that are a function of the nature of the command indicated by the stored command bits;

a command unit selector coupled to each of the command units, the command unit selector determining which of the command units are storing command bits, and enabling one of the command units that is not storing command bits to store a plurality of command bits from a command packet received by the command units at a first time, the command unit selector further activating one of the command units to output the command bits stored in the command unit at a second time that may be different from the first time; and a command processor coupled to each of the command units, the command processor receiving the command bits output from an activated command unit and processing the command bits responsive to the start command signal to generate at least one command signal responsive thereto at a third time that may be different from the second time.

2. The command generator of claim 1 wherein the counts at which the start command generator generates the start command signal is further a function of a clock speed signal indicative of the frequency of the clock signal.

3. The command generator of claim 1 wherein the plurality of command units are coupled to the command processor through a common bus shared by all of the command units.

4. A memory device command generator receiving command packets indicative of a memory command, a row address and a command address, the command generator comprising:

a plurality of command units, each of the command units, when enabled, storing a plurality of command bits of a command packet received by the command units and, when activated, outputting the command bits stored in the command unit;

a command unit selector coupled to each of the command units, the command unit selector determining which of the command units are storing command bits, and enabling one of the command units that is not storing command bits to store a plurality of command bits from a command packet received by the command units at a first time, the command unit selector further activating one of the command units to output the command bits stored in the command unit at a second time that may be different from the first time; and a command processor coupled to each of the command units, the command processor receiving the command bits output from an activated command unit and processing the command bits to generate at least one command signal responsive thereto at a third time that may be different from the second time, the command processor comprising:

a sequencer coupled to the command units, the sequencer generating a sequence of timing signals responsive to a clock signal, the sequencer initiating the sequence responsive to the start command signal from one of the command units; and a command signal generator coupled to receive the command bits from the command units and the sequence of timing signals from the sequencer, the command signal generator generating a command signal corresponding to the command bits responsive to one of a plurality of the timing signals, the timing signal that is used to generate the command signal being a function of a clock speed signal indicative of the frequency of the clock signal.

5. The command generator of claim 4 wherein each of the command units generates a respective start command signal to cause the command processor to process the command bits received from the command unit to generate the command signal, and wherein the command signal generator comprises:

a command state machine coupled to receive the sequence of timing signals from the sequencer and the command bits and start command signals from the command units, the command state machine generating a plurality of function signals corresponding to at least one of the command bits responsive to one of a plurality of the timing signals, the timing signal that is used to generate each of the function signals being determined by a clock speed signal indicative of the frequency of the clock signal; and a micro-operation circuit coupled to receive the sequence of timing signals from the sequencer and the function signals from the command state machine, the micro-operation circuit generating the command signals responsive to one of a plurality of the timing signals, the timing signal that is used to generate the function signal being determined by the clock speed signal.

6. The command generator of claim 5 wherein the command state machine further comprises a close bank circuit, comprising:
   a close bank control circuit generating a close bank enable signal responsive to the start command signal;
   a bank decoder coupled to receive a bank address and the close bank enable signal, the bank decoder generating one of a plurality of close bank signals corresponding to the value of the bank address.

7. A memory device command generator receiving command packets indicative of a memory command, a row address and a command address, the command generator comprising:
   a plurality of command units, each of the command units, when enabled, storing a plurality of command bits of a command packet received by the command units and, when activated, outputting the command bits stored in the command unit, each of the command units generating a respective start command signal;
   a command unit selector coupled to each of the command units, the command unit selector determining which of the command units are storing command bits, and enabling one of the command units that is not storing command bits to store a plurality of command bits from a command packet received by the command units at a first time, the command unit selector further activating one of the command units to output the command bits stored in the command unit at a second time that may be different from the first time; and
   a command processor coupled to each of the command units, the command processor receiving the command bits output from an activated command unit and processing the command bits responsive to the start command signal to generate at least one of the command signals responsive thereto at a third time that may be different from the second time, the command processor comprising:
      a sequencer coupled to the command units, the sequencer generating a sequence of timing signals responsive to a clock signal, the sequencer initiating the sequence responsive to the start command signal from one of the command units; and
      a plurality of command state machines each coupled to receive the sequence of timing signals from the sequencer and the command bits and start command signals from the command units, the command state machines generating respective function signals corresponding to at least one of the command bits responsive to one of a plurality of the timing signals, the timing signal that is used to generate each of the function signals being determined by a clock speed signal indicative of the frequency of the clock signal; and
      a plurality of micro-operation circuits each associated with a respective memory operation corresponding to each of the function signals, each micro-operation circuit being coupled to receive the sequence of timing signals from the sequencer and corresponding function signals from each of the command state machines, each of the micro-operation circuits generating a respective command signal responsive to one of a plurality of the timing signals, the timing signal that is used to generate the function signal being determined by the clock speed signal and the nature of the memory operation corresponding to the micro-operation circuit.

8. A memory device command generator receiving command packets indicative of a memory command, a row address and a command address, the command generator comprising:
   a plurality of command units, each of the command units, when enabled, storing a plurality of command bits of a command packet received by the command units and, when activated, outputting the command bits stored in the command unit, each of the command units comprising:
      a counter counting in one direction from an initial count to a terminal count responsive to a clock signal, the counting being initiated responsive to a start signal derived from a timing signal associated with the command packet received by a command unit when the command unit is activated; and
      a start command generator generating a start command signal at one of a plurality of respective counts of the counter that are a function of a clock speed signal indicative of the frequency of the clock signal;
   a command unit selector coupled to each of the command units, the command unit selector determining which of the command units are storing command bits, and enabling one of the command units that is not storing command bits to store a plurality of command bits from a command packet received by the command units at a first time, the command unit selector further activating one of the command units to output the command bits stored in the command unit at a second time that may be different from the first time; and
   a command processor coupled to each of the command units, the command processor receiving the command bits output from an activated command unit and processing the command bits responsive to the start command signal to generate at least one command signal responsive thereto at a third time that may be different from the second time.

9. The command generator of claim 8 wherein the counter terminates counting responsive to a count halt signal, and wherein each of the command units further comprise a terminal count decoder receiving signals indicative of the count of the counter, the terminal counter decoder detecting the terminal count of the counter and generating the count halt signal in response thereto.

10. A memory device command generator receiving command packets indicative of a memory command, a row address and a command address, the command generator comprising:
   a plurality of command units, each of the command units, when enabled, storing a plurality of command bits of a command packet received by the command units and, when activated, outputting the command bits stored in the command unit, each of the command units being operable to generate a start command signal until receipt of an acknowledgment signal;
   a command unit selector coupled to each of the command units, the command unit selector determining which of the command units are storing command bits, and enabling one of the command units that is not storing command bits to store a plurality of command bits from a command packet received by the command units at a first time, the command unit selector further activating one of the command units to output the command bits stored in the command unit at a second time that may be different from the first time; and a command processor coupled to each of the command units, the command processor receiving the command bits output from an activated command unit and processing the command bits responsive to a respective start command signal to generate at least one command signal responsive thereto at a third time that may be different from the second time, the command processor generating the acknowledgment signal responsive to receipt of the start command signal and coupling the acknowledgment signal to the command unit from which it received the start command signal.

11. A memory device command generator receiving command packets indicative of a memory command, a row address and a command address, the command generator comprising:

a plurality of command units, each of the command units, when enabled, storing a plurality of command bits of a command packet received by the command units and, when activated, outputting the command bits stored in the command unit, each of the command units comprising:

a counter counting in one direction from an initial count to a terminal count responsive to a clock signal, the counting being initiated responsive to a start signal derived from a timing signal associated with the command packet received by a command unit when the command unit is activated; and a counter preloader coupled to load the counter with a value of the initial count that corresponds to the timing of the command packet as received at a predetermined location in the command generator;

a plurality of counter decoders coupled to receive the count of the counter, the counter decoders each generating a start command signal responsive to decoding respective values of the count, the value decoded by each decoder being a function of at least one of the clock speed and the nature of the command indicated by the command bits applied to the command unit; and a latch receiving the command bits applied to the command unit, the latch storing the command bits in the command unit responsive to the start command signal;

a command unit selector coupled to each of the command units, the command unit selector determining which of the command units are storing command bits and enabling one of the command units that is not storing command bits to store a plurality of command bits from a command packet received by the command units at a first time, the command unit selector further activating one of the command units to output the command bits stored in the command unit at a second time that may be different from the first time; and a command processor coupled to each of the command units, the command processor receiving the command bits output from an activated command unit and processing the command bits responsive to the start command signal to generate at least one command signal responsive thereto at a third time that may be different from the second time.

12. A memory device command generator receiving command packets indicative of a memory command, a row address and a column address, the command generator comprising:

a command buffer receiving and storing at least a portion of at least one packet word in each command packet, the command buffer applying the stored portion of each command packet to a command bus;

a plurality of command units coupled to the command bus of the command buffer, each of the command units, when enabled, storing a plurality of command bits of at least one packet word and outputting the command bits stored in the command unit to an output bus, each of the command units being enabled responsive to a respective select signal and generating a respective busy signal indicating that the command unit is storing command bits and has not output the stored command bits to the output bus, each of the command units comprising;

a counter counting in one direction from an initial count to a terminal count responsive to a clock signal, the counting being initiated responsive to a start signal derived from a timing signal associated with the command packet received by an enabled command unit; and a start command generator generating a start command signal at one of a plurality of respective counts of the counter that are a function of a clock speed signal indicative of the frequency of the clock signal;

a control circuit receiving the busy signals from the respective command units to determine which of the command units are storing a portion of a packet word, the control circuit applying a respective select signal to one of the command units from which a busy signal is not being received to cause the command unit receiving the select signal to store the portion of the packet word received from the command buffer;

a sequencer coupled to the output bus of the command units, the sequencer generating a sequence of timing signals responsive to a clock signal, the sequencer initiating the sequence responsive to the start command signal from one of the command units;

a plurality of command state machines each coupled to receive the sequence of timing signals from the sequencer and the command bits and start command signals from the command units, the command state machines generating respective function signals corresponding to at least one of the command bits responsive to one of a plurality of the timing signals, the timing signal that is used to generate each of the function signals being determined by a clock speed signal indicative of the frequency of the clock signal; and a plurality of micro-operation circuits each associated with a respective memory operation corresponding to each of the function signals, each micro-operation circuit being coupled to receive the sequence of timing signals from the sequencer and corresponding function signals from each of the command state machines, each of the micro-operation circuits generating a respective command signal responsive to one of a plurality of the timing signals, the timing signal that is used to generate the function signal being determined by the clock speed signal and the nature of the memory operation corresponding to the micro-operation circuit.

13. The command generator of claim 12 wherein the counter terminates counting responsive to a count halt signal, and wherein each of the command units further comprise a terminal count decoder receiving signals indicative of the count of the counter, the terminal counter decoder detecting the terminal count of the counter and generating the count halt signal in response thereto.

14. A packetized dynamic random access memory, comprising:

a clock generator circuit generating an internal clock signal having a phase relative to an external clock signal determined by a phase command signal;

at least one array of memory cells adapted to store data at a location determined by a row address and a column address;

a row address circuit adapted to receive and decode the row address, and select a row of memory cells corresponding to the row address responsive to a first set of command signals;

a column address circuit adapted to receive or apply data to one of the memory cells in the selected row corresponding to the column address responsive to a second set of command signals;

a data path circuit adapted to couple data between an external terminal and the column address circuit responsive to a third set of command signals; and a command generator receiving command packets indicative of a command, a row address and a column address, the command generator comprising:

a plurality of command units, each of the command units, when enabled, storing a plurality of command bits of a command packet received by the command units and, when activated, outputting the command bits stored in the command unit;

a command unit selector coupled to each of the command units, the command unit selector determining which of the command units are storing command bits, and enabling one of the command units that is not storing command bits to store a plurality of command bits from a command packet received by the command units at a first time, the command unit selector further activating one of the command units to output the command bits stored in the command unit at a second time that may be different from the first time; and a command processor coupled to each of the command units, the command processor receiving the command bits output from an activated command unit and processing the command bits to generate at least one command signal responsive thereto at a third time that may be different from the second time.

15. The packetized dynamic random access memory of claim 13 wherein each of the command units comprise:

a counter counting in one direction from an initial count to a terminal count responsive to a clock signal, the counting being initiated responsive to a start signal derived from a timing signal associated with the command packet received by a command unit when the command unit is activated by the command unit selector; and a start command generator generating a start command signal at one of a plurality of respective counts of the counter that are a function of the nature of the command indicated by the stored command bits, the start command signal causing the command processor coupled to each of the command units to process the command bits to generate the command signal.

16. The packetized dynamic random access memory of claim 15 wherein the counts at which the start command generator generates the start command signal is further a function of a clock speed signal indicative of the frequency of the clock signal.

17. The packetized dynamic random access memory of claim 14 wherein the command processor comprises:

a sequencer coupled to the command units, the sequencer generating a sequence of timing signals responsive to a clock signal, the sequencer initiating the sequence responsive to the start command signal from one of the command units; and a command signal generator coupled to receive the command bits from the command units and the sequence of timing signals from the sequencer, the command signal generator generating a command signal corresponding to the command bits responsive to one of a plurality of the timing signals, the timing signal that is used to generate the command signal being a function of a clock speed signal indicative of the frequency of the clock signal.

18. The packetized dynamic random access memory of claim 17 wherein each of the command units generates a respective start command signal to cause the command processor to process the command bits received from the command unit to generate the command signal, and wherein the command signal generator comprises:

a command state machine coupled to receive the sequence of timing signals from the sequencer and the command bits and start command signals from the command units, the command state machine generating a plurality of function signals corresponding to at least one of the command bits responsive to one of a plurality of the timing signals, the timing signal that is used to generate each of the function signals being determined by a clock speed signal indicative of the frequency of the clock signal; and a micro-operation circuit coupled to receive the sequence of timing signals from the sequencer and the function signals from the command state machine, the micro-operation circuit generating the command signals responsive to one of a plurality of the timing signals, the timing signal that is used to generate the function signal being determined by the clock speed signal.

19. The packetized dynamic random access memory of claim 14 wherein the command state machine further comprises a close bank circuit, comprising:

a close bank control circuit generating a close bank enable signal responsive to the start command signal;

a bank decoder coupled to receive a bank address and the close bank enable signal, the bank decoder generating one of a plurality of close bank signals corresponding to the value of the bank address.

20. The packetized dynamic random access memory of claim 14 wherein each of the command units generates a respective start command signal to cause the command processor to process the command bits received from the command unit to generate the command signal, and wherein the command processor comprises:

a sequencer coupled to the command units, the sequencer generating a sequence of timing signals responsive to a clock signal, the sequencer initiating the sequence responsive to the start command signal from one of the command units; and a plurality of command state machines each coupled to receive the sequence of timing signals from the sequencer and the command bits and start command signals from the command units, the command state machines generating respective function signals corresponding to at least one of the command bits responsive to one of a plurality of the timing signals, the timing signal that is used to generate each of the function signals being determined by a clock speed signal indicative of the frequency of the clock signal; and a plurality of micro-operation circuits each associated with a respective memory operation corresponding to each of the function signals, each micro-operation circuit being coupled to receive the sequence of timing signals from the sequencer and corresponding function signals from each of the command state machines, each of the micro-operation circuits generating a respective command signal responsive to one of a plurality of the timing signals, the timing signal that is used to generate the function signal being determined by the clock speed signal and the nature of the memory operation corresponding to the micro-operation circuit.

21. The packetized dynamic random access memory of claim 14 wherein each of the command units comprise:

a counter counting in one direction from an initial count to a terminal count responsive to a clock signal, the counting being initiated responsive to a start signal derived from a timing signal associated with the command packet received by a command unit when the command unit is activated by the command unit selector; and a start command generator generating a start command signal at one of a plurality of respective counts of the counter that are a function of a clock speed signal indicative of the frequency of the clock signal, the start command signal causing the command processor coupled to each of the command units to process the bits to generate the command signal.

22. The packetized dynamic random access memory of claim 21 wherein the counter terminates counting responsive to a count halt signal, and wherein each of the command units further comprise a terminal count decoder receiving signals indicative of the count of the counter, the terminal counter decoder detecting the terminal count of the counter and generating the count halt signal in response thereto.

23. The packetized dynamic random access memory of claim 14 wherein the plurality of command units are coupled to the command processor through a common bus shared by all of the command units.

24. The packetized dynamic random access memory of claim 14 wherein each of the command units generates a respective start command signal to cause the command processor to process the bits received from the command unit to generate the command signal, each of the command units generating the start command signal until receipt of an acknowledgment signal, and wherein the command processor generates the acknowledgment signal responsive to receipt of the start command signal and couples the acknowledgment signal to the command unit from which it received the start command signal.

25. The packetized dynamic random access memory of claim 14 wherein the command processor initiates processing of the command bits responsive to a start command signal, and wherein each of the command units comprise:

a counter counting in one direction from an initial count to a terminal count responsive to a clock signal, the counting being initiated responsive to a start signal derived from a timing signal associated with the command packet received by a command unit when the command unit is activated by the command unit selector; and a counter preloader coupled to load the counter being with a value of the initial count that corresponds to the timing of the command packet as received at a predetermined location in the command generator;

a plurality of counter decoders coupled to receive the count of the counter, the counter decoders each generating the start command signal responsive to decoding respective values of the count, the value decoded by each decoder being a function of at least one of the clock speed and the nature of the command indicated by the command bits applied to the command unit;

a latch receiving the command bits applied to the command unit, the latch storing the command bits in the command unit responsive to the start command signal.

26. A computer system, comprising:

a processor having a processor bus;

an input device coupled to the processor through the processor bus adapted to allow data to be entered into the computer system;

an output device coupled to the processor through the processor bus adapted to allow data to be output from the computer system; and a packetized dynamic random access memory coupled to the processor bus adapted to allow data to be stored, adapted to receive a plurality of input signals and generate a plurality of output signals on respective, externally accessible terminals, the packetized dynamic random access memory comprising:

a clock generator circuit generating an internal clock signal having a phase relative to an external clock signal determined by a phase command signal;

at least one array of memory cells adapted to store data at a location determined by a row address and a column address;

a row address circuit adapted to receive and decode the row address, and select a row of memory cells corresponding to the row address responsive to a first set of command signals;

a column address circuit adapted to receive or apply data to one of the memory cells in the selected row corresponding to the column address responsive to a second set of command signals;

a data path circuit adapted to couple data between an external terminal and the column address circuit responsive to a third set of command signals; and a command generator receiving command packets indicative of a command, a row address and a column address, the command generator comprising:

a plurality of command units, each of the command units, when enabled, storing a plurality of command bits of a command packet received by the command units and, when activated, outputting the command bits stored in the command unit;

a command unit selector coupled to each of the command units, the command unit selector determining which of the command units are storing command bits, and enabling one of the command units that is not storing command bits to store a plurality of command bits from a command packet received by the command units at a first time, the command unit selector further activating one of the command units to output the command bits stored in the command unit at a second time that may be different from the first time; and a command processor coupled to each of the command units, the command processor receiving the command bits output from an activated command unit and processing the command bits to generate at least one command signal responsive thereto at a third time that may be different from the second time.

27. The computer system of claim 26 wherein each of the command units comprise:

a counter counting in one direction from an initial count to a terminal count responsive to a clock signal, the counting being initiated responsive to a start signal derived from a timing signal associated with the command packet received by a command unit when the command unit is activated by the command unit selector; and a start command generator generating a start command signal at one of a plurality of respective counts of the counter that are a function of the nature of the command indicated by the stored command bits, the start command signal causing the command processor coupled to each of the command units to process the command bits to generate the command signal.

28. The computer system of claim 27 wherein the counts at which the start command generator generates the start command signal is further a function of a clock speed signal indicative of the frequency of the clock signal.

29. The computer system of claim 26 wherein the command processor comprises:

a sequencer coupled to the command units, the sequencer generating a sequence of timing signals responsive to a clock signal, the sequencer initiating the sequence responsive to the start command signal from one of the command units; and a command signal generator coupled to receive the command bits from the command units and the sequence of timing signals from the sequencer, the command signal generator generating a command signal corresponding to the command bits responsive to one of a plurality of the timing signals, the timing signal that is used to generate the command signal being a function of a clock speed signal indicative of the frequency of the clock signal.

30. The computer system of claim 29 wherein each of the command units generates a respective start command signal to cause the command processor to process the command bits received from the command unit to generate the command signal, and wherein the command signal generator comprises:

a command state machine coupled to receive the sequence of timing signals from the sequencer and the command bits and start command signals from the command units, the command state machine generating a plurality of function signals corresponding to at least one of the command bits responsive to one of a plurality of the timing signals, the timing signal that is used to generate each of the function signals being determined by a clock speed signal indicative of the frequency of the clock signal; and a micro-operation circuit coupled to receive the sequence of timing signals from the sequencer and the function signals from the command state machine, the micro-operation circuit generating the command signals responsive to one of a plurality of the timing signals, the timing signal that is used to generate the function signal being determined by the clock speed signal.

31. The computer system of claim 26 wherein the command state machine further comprises a close bank circuit, comprising:

a close bank control circuit generating a close bank enable signal responsive to the start command signal;

a bank decoder coupled to receive a bank address and the close bank enable signal, the bank decoder generating one of a plurality of close bank signals corresponding to the value of the bank address.

32. The computer system of claim 26 wherein each of the command units generates a respective start command signal to cause the command processor to process the command bits received from the command unit to generate the command signal, and wherein the command processor comprises:

a sequencer coupled to the command units, the sequencer generating a sequence of timing signals responsive to a clock signal, the sequencer initiating the sequence responsive to the start command signal from one of the command units; and a plurality of command state machines each coupled to receive the sequence of timing signals from the sequencer and the command bits and start command signals from the command units, the command state machines generating respective function signals corresponding to at least one of the command bits responsive to one of a plurality of the timing signals, the timing signal that is used to generate each of the function signals being determined by a clock speed signal indicative of the frequency of the clock signal; and a plurality of micro-operation circuits each associated with a respective memory operation corresponding to each of the function signals, each micro-operation circuit being coupled to receive the sequence of timing signals from the sequencer and corresponding function signals from each of the command state machines, each of the micro-operation circuits generating a respective command signal responsive to one of a plurality of the timing signals, the timing signal that is used to generate the function signal being determined by the clock speed signal and the nature of the memory operation corresponding to the micro-operation circuit.

33. The computer system of claim 26 wherein each of the command units comprise:

a counter counting in one direction from an initial count to a terminal count responsive to a clock signal, the counting being initiated responsive to a start signal derived from a timing signal associated with the command packet received by a command unit when the command unit is activated by the command unit selector; and a start command generator generating a start command signal at one of a plurality of respective counts of the counter that are a function of a clock speed signal indicative of the frequency of the clock signal, the start command signal causing the command processor coupled to each of the command units to process the bits to generate the command signal.

34. The computer system of claim 33 wherein the counter terminates counting responsive to a count halt signal, and wherein each of the command units further comprise a terminal count decoder receiving signals indicative of the count of the counter, the terminal counter decoder detecting the terminal count of the counter and generating the count halt signal in response thereto.

35. The computer system of claim 26 wherein the plurality of command units are coupled to the command processor through a common bus shared by all of the command units.

36. The computer system of claim 26 wherein each of the command units generates a respective start command signal to cause the command processor to process the bits received from the command unit to generate the command signal, each of the command units generating the start command signal until receipt of an acknowledgment signal, and wherein the command processor generates the acknowledgment signal responsive to receipt of the start command signal and couples the acknowledgment signal to the command unit from which it received the start command signal.

37. The computer system of claim 26 wherein the command processor initiates processing of the command bits responsive to a start command signal, and wherein each of the command units comprise:

a counter counting in one direction from an initial count to a terminal count responsive to a clock signal, the counting being initiated responsive to a start signal derived from a timing signal associated with the command packet received by a command unit when the command unit is activated by the command unit selector; and a counter preloader coupled to load the counter being with a value of the initial count that corresponds to the timing of the command packet as received at a predetermined location in the command generator;

a plurality of counter decoders coupled to receive the count of the counter, the counter decoders each generating the start command signal responsive to decoding respective values of the count, the value decoded by each decoder being a function of at least one of the clock speed and the nature of the command indicated by the command bits applied to the command unit;

a latch receiving the command bits applied to the command unit, the latch storing the command bits in the command unit responsive to the start command signal.

\* \* \* \* \*

UNITED STATES PATENT AND TRADEMARK OFFICE
CERTIFICATE OF CORRECTION

PATENT NO. : 6,202,119 B1
APPLICATION NO. : 08/994461
DATED : March 13, 2001
INVENTOR(S) : Troy A. Manning Page 1 of 2

It is certified that error appears in the above-identified patent and that said Letters Patent is hereby corrected as shown below:

Title Page, Column 1, under "(56) References Cited, U.S. Patent Documents", please replace "5,312,068   5/1994   Goss et al." with --4,312,068   1/1982   Goss et al.--.

Title Page, Column 1, under "(56) References Cited, U.S. Patent Documents", please replace "5,471,430   11/1995   Sawada et al." with --5,471,430   10/1995   Sawada et al.--.

Title Page, Column 2, under "Foreign Patent Documents", please replace 59116829   7/1984   (EP)" with --9116829   7/1984   (JP)--.

Title Page, under "(56) References Cited, U.S. Patent Documents", please add the following references:

| | | | |
|---|---|---|---|
| 4,768,190 | 08/1988 | Giancarlo | 370/86 |
| 4,845,664 | 07/1989 | Aichelmann, Jr. et al. | 364/900 |
| 5,297,029 | 03/1994 | Nakai et al. | 365/238.5 |
| 5,355,345 | 10/1994 | Dickinson et al. | 365/230.01 |
| 5,367,643 | 11/1994 | Chang et al. | 395/325 |
| 5,600,605 | 2/1997 | Schaefer | 365/233 |
| 5,615,355 | 3/1997 | Wagner | 395/494 |
| 5,636,174 | 06/1997 | Rao | 365/230.03 |
| 5,713,005 | 1/1998 | Proebsting | 395/496 |
| 5,793,688 | 8/1998 | McLaury | 365/203 |
| 5,831,929 | 11/1998 | Manning | 365/233 |
| 5,887,146 | 3/1999 | Baxter et al. | 395/284 |
| 5,920,510 | 7/1999 | Yukutake et al. | 365/189.05 |
| 5,920,710 | 7/1999 | Tan et al. | 395/392 |
| 5,946,260 | 8/1999 | Manning | 365/230.03 |

Title Page, Column 2, under "Foreign Patent Documents", please add the following references:

| | | |
|---|---|---|
| 0 486 480 A2 | 05/1992 | EP |
| 0 605 887 A2 | 07/1994 | EP |
| WO 96/24935 | 08/1996 | PCT |
| 197 34 719 A1 | 05/1998 | DE |

UNITED STATES PATENT AND TRADEMARK OFFICE
CERTIFICATE OF CORRECTION

PATENT NO. : 6,202,119 B1
APPLICATION NO. : 08/994461
DATED : March 13, 2001
INVENTOR(S) : Troy A. Manning It is certified that error appears in the above-identified patent and that said Letters Patent is hereby corrected as shown below:

Title Page, Column 2, under "Other Publications", please add the following reference:

Gillingham, P., "SLDRAM Architectural and Functional Overview," SLDRAM Consortium, August 29, 1997, pp. 1-14.

| Column , Line | Reads | Should Read |
| --- | --- | --- |
| Column 41, Line 44 | "13" | -- 14 -- |

Signed and Sealed this

Twenty-fifth Day of September, 2007

JON W. DUDAS
*Director of the United States Patent and Trademark Office*